US012150322B2

(12) United States Patent
Nishio et al.

(10) Patent No.: US 12,150,322 B2
(45) Date of Patent: Nov. 19, 2024

(54) IMAGING DEVICE AND ELECTRONIC DEVICE

(71) Applicant: SONY SEMICONDUCTOR SOLUTIONS CORPORATION, Kanagawa (JP)

(72) Inventors: Kenya Nishio, Kanagawa (JP); Suguru Saito, Kumamoto (JP); Nobutoshi Fujii, Tokyo (JP); Hirotaka Yoshioka, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 334 days.

(21) Appl. No.: 17/620,519

(22) PCT Filed: Jun. 17, 2020

(86) PCT No.: PCT/JP2020/023706
§ 371 (c)(1),
(2) Date: Dec. 17, 2021

(87) PCT Pub. No.: WO2020/262132
PCT Pub. Date: Dec. 30, 2020

(65) Prior Publication Data
US 2022/0359620 A1 Nov. 10, 2022

(30) Foreign Application Priority Data
Jun. 26, 2019 (JP) ................................. 2019-119126

(51) Int. Cl.
H01L 27/12 (2006.01)
H04N 25/79 (2023.01)
(Continued)

(52) U.S. Cl.
CPC ............. *H10K 39/32* (2023.02); *H04N 25/79* (2023.01); *H04N 25/75* (2023.01); *H04N 25/77* (2023.01)

(58) Field of Classification Search
CPC ........ H10K 39/32; H10K 19/20; H10K 30/00; H10K 85/6572; H10K 30/353;
(Continued)

(56) References Cited
U.S. PATENT DOCUMENTS

2006/0292719 A1   12/2006   Lochtefeld et al.
2007/0018075 A1   1/2007   Cazaux et al.
(Continued)

FOREIGN PATENT DOCUMENTS

CN   102124566 A   7/2011
CN   102449785 A   5/2012
(Continued)

OTHER PUBLICATIONS

International Search Report and Written Opinion of PCT Application No. PCT/JP2020/023706, issued on Sep. 8, 2020, 13 pages of ISRWO.

*Primary Examiner* — Niki H Nguyen
*Assistant Examiner* — Niki T Nguyen
(74) *Attorney, Agent, or Firm* — CHIP LAW GROUP

(57) ABSTRACT

An imaging device according to an embodiment of the present disclosure includes: a first semiconductor substrate (100) provided with pixels including a photoelectric conversion element (PD) and floating diffusion (FD) that temporarily holds a charge output from the photoelectric conversion element (PD); and a semiconductor layer (200Y) provided on the first semiconductor substrate (100) via an insulating film (123), the semiconductor layer (200Y) including a readout circuit unit (539) that reads out the charge held in the floating diffusion (FD) and outputs a pixel
(Continued)

signal, in which the semiconductor layer (200Y) is formed of an organic semiconductor material.

18 Claims, 54 Drawing Sheets

(51) Int. Cl.
*H10K 39/32* (2023.01)
*H04N 25/75* (2023.01)
*H04N 25/77* (2023.01)

(58) Field of Classification Search
CPC ...... H10K 39/00; H10K 85/40; H10K 85/654; H10K 19/201; H10K 39/15; H10K 30/65; H10K 30/20; H10K 85/211; H10K 30/10; H10K 19/10; H10K 85/10; H10K 59/65; H10K 85/00; H10K 71/60; H10K 71/30; H10K 50/11; H04N 25/79; H04N 25/75
See application file for complete search history.

(56) References Cited

U.S. PATENT DOCUMENTS

| | | | |
|---|---|---|---|
| 2010/0060764 | A1 | 3/2010 | McCarten et al. |
| 2010/0276572 | A1* | 11/2010 | Iwabuchi ............... H04N 25/76 257/443 |
| 2011/0156197 | A1 | 6/2011 | Tivarus et al. |
| 2012/0068207 | A1 | 3/2012 | Hata et al. |
| 2012/0280275 | A1 | 11/2012 | Hata et al. |
| 2014/0138752 | A1 | 5/2014 | Kao et al. |
| 2015/0035028 | A1 | 2/2015 | Fan et al. |
| 2016/0111473 | A1 | 4/2016 | Liu et al. |
| 2016/0284749 | A1 | 9/2016 | Kurokawa |
| 2018/0033809 | A1 | 2/2018 | Tayanaka et al. |
| 2019/0386052 | A1 | 12/2019 | Furuhashi |
| 2020/0035737 | A1 | 1/2020 | Ito et al. |

FOREIGN PATENT DOCUMENTS

| | | | | |
|---|---|---|---|---|
| CN | 102714144 | A | 10/2012 | |
| CN | 103579264 | A | 2/2014 | |
| CN | 105706240 | A | 6/2016 | |
| CN | 106796301 | A | 5/2017 | |
| CN | 107431075 | A | 12/2017 | |
| CN | 110073492 | A | 7/2019 | |
| CN | 110506337 | A | 11/2019 | |
| EP | 2324506 | A1 | 5/2011 | |
| EP | 2595175 | A2 * | 5/2013 | ....... H01L 21/02381 |
| EP | 3207569 | A1 | 8/2017 | |
| EP | 3610508 | A1 | 2/2020 | |
| FR | 2888989 | A1 | 1/2007 | |
| JP | 2007-001861 | A | 1/2007 | |
| JP | 2008-546181 | A | 12/2008 | |
| JP | 2010-245506 | A | 10/2010 | |
| JP | 2011-014896 | A | 1/2011 | |
| JP | 2011-166129 | A | 8/2011 | |
| JP | 2012-502469 | A | 1/2012 | |
| JP | 2015-032687 | A | 2/2015 | |
| JP | 2016-181698 | A | 10/2016 | |
| JP | 2016-534557 | A | 11/2016 | |
| JP | 2018-502440 | A | 1/2018 | |
| JP | 2018-101699 | A | 6/2018 | |
| JP | 2018-182038 | A | 11/2018 | |
| KR | 10-2011-0050670 | A | 5/2011 | |
| KR | 10-2012-0035144 | A | 4/2012 | |
| KR | 10-2012-0112635 | A | 10/2012 | |
| KR | 10-2014-0020713 | A | 2/2014 | |
| KR | 10-2016-0033231 | A | 3/2016 | |
| KR | 10-2017-0070212 | A | 6/2017 | |
| KR | 10-2019-0139215 | A | 12/2019 | |
| TW | 201015991 | A | 4/2010 | |
| TW | 201108406 | A | 3/2011 | |
| TW | 201135886 | A | 10/2011 | |
| TW | 201143062 | A | 12/2011 | |
| TW | 201515202 | A | 4/2015 | |
| TW | 201904043 | A | 1/2019 | |
| WO | 2010/030329 | A1 | 3/2010 | |
| WO | 2010/140370 | A1 | 12/2010 | |
| WO | 2011/082126 | A1 | 7/2011 | |
| WO | 2011/086929 | A1 | 7/2011 | |
| WO | 2015/020821 | A2 | 2/2015 | |
| WO | WO-2015016140 | A1 * | 2/2015 | ....... H01L 27/14609 |
| WO | 2016/061198 | A1 | 4/2016 | |
| WO | 2016/136486 | A1 | 9/2016 | |
| WO | 2018/116559 | A1 | 6/2018 | |
| WO | 2018/189994 | A1 | 10/2018 | |

\* cited by examiner

IMAGING DEVICE AND ELECTRONIC DEVICE

CROSS REFERENCE TO RELATED APPLICATIONS

This application is a U.S. National Phase of International Patent Application No. PCT/JP2020/023706 filed on Jun. 17, 2020, which claims priority benefit of Japanese Patent Application No. JP 2019-119126 filed in the Japan Patent Office on Jun. 26, 2019. Each of the above-referenced applications is hereby incorporated herein by reference in its entirety.

FIELD

The present disclosure relates to an imaging device and an electronic device.

BACKGROUND

In conventional technologies, miniaturization, with regard to an area per pixel, in an imaging device having a two-dimensional structure has been realized by introduction of a microfabrication process and improvement of mounting density. In recent years, an imaging device having a three-dimensional structure has been developed in order to realize further miniaturization of the imaging device and densification of pixels. An imaging device having a three-dimensional structure has a configuration, for example, in which a semiconductor substrate including a plurality of sensor pixels and a semiconductor substrate including a signal processing circuit that processes a signal obtained by each of sensor pixels are stacked on each other.

CITATION LIST

Patent Literature

Patent Literature 1: JP 2010-245506 A

SUMMARY

Technical Problem

By the way, when stacking three layers of semiconductor chips in an imaging device having a three-dimensional structure, it is not practical to bond all the semiconductor substrates with their front surfaces. In three semiconductor substrates stacked with insufficient consideration, there is a possibility of an increased chip size or hindrance on miniaturization of an area per pixel due to a structure of electrically connecting the semiconductor substrates to each other. In view of this, it is desirable to provide an imaging device that has a chip size equivalent to the current chip size and would not hinder miniaturization of an area per pixel. In view of this, the present disclosure proposes an imaging device that has a chip size equivalent to the current chip size and has a structure that would not hinder miniaturization of an area per pixel.

Solution to Problem

According to the present disclosure, an imaging device is provided. The imaging device includes: a first semiconductor substrate provided with pixels including a photoelectric conversion element and floating diffusion that temporarily holds a charge output from the photoelectric conversion element; and a semiconductor layer provided on the first semiconductor substrate via an insulating film, the semiconductor layer including a readout circuit unit that reads out the charge held in the floating diffusion and outputs a pixel signal. In the imaging device, the semiconductor layer is formed of an organic semiconductor material.

Also, according to the present disclosure, an electronic device is provided. The electronic device is equipped with an imaging device. The imaging device includes: a first semiconductor substrate provided with pixels including a photoelectric conversion element and floating diffusion that temporarily holds a charge output from the photoelectric conversion element; and a semiconductor layer provided on the first semiconductor substrate via an insulating film, the semiconductor layer including a readout circuit unit that reads out the charge held in the floating diffusion and outputs a pixel signal. In the imaging device, the semiconductor layer is formed of an organic semiconductor material.

BRIEF DESCRIPTION OF DRAWINGS

FIG. 37 is a schematic plan view illustrating another example of a pixel isolation portion illustrated in FIG. 7A and the like.

DESCRIPTION OF EMBODIMENTS

Figure 1:
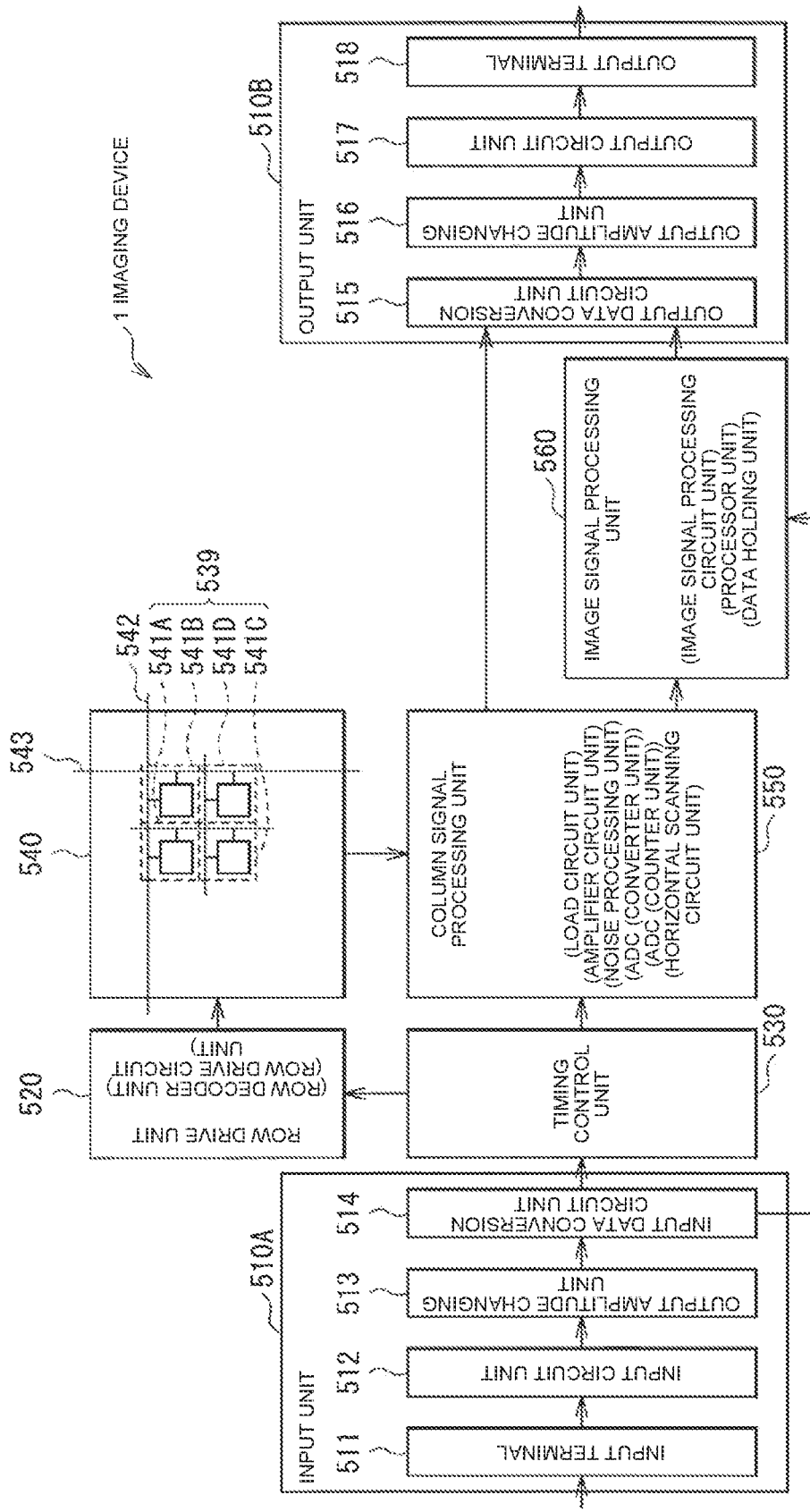
FIG. 1 is a block diagram illustrating an example of a functional configuration of an imaging device according to an embodiment of the present disclosure.

Embodiments of the present disclosure will be described below in detail with reference to the drawings. In each of the following embodiments, the same parts are denoted by the same reference symbols, and a repetitive description thereof will be omitted.

In addition, the drawings referred to in the following description are drawings for illustrating and facilitating further understanding of the embodiments of the present disclosure, and thus, shapes, dimensions, ratios, and the like illustrated in the drawings may be different from actual ones for the sake of clarity. Furthermore, the imaging device and the components and the like included in the imaging device illustrated in the drawings can be appropriately changed in design in consideration of the following description and known techniques. Furthermore, in the following description, the vertical direction of the stacked structure of the imaging device corresponds to a relative direction in a case where the imaging device is disposed such that light incident on the imaging device is directed from bottom to top unless otherwise specified.

The description of specific lengths (numerical values) and shapes in the following description does not exclusively mean the same values as mathematically defined numerical values or geometrically defined shapes. Specifically, description of specific lengths (numerical values) and shapes in the following description includes dimensions in a case where there is a permissible difference (error/distortion) in the imaging device, a manufacturing process thereof, and use/operation thereof, and includes a shape similar to the shape illustrated herein. For example, in the following description, the expression "circular shape" means that the shape is not limited to a perfect circle but includes a shape similar to a perfect circle, such as an elliptical shape.

Furthermore, in the following description of circuits (electrical connections), unless otherwise specified, "electrically connected" means that a connection is made to allow electrical (signal) conduction through a plurality of elements. In addition, "electrically connected" in the following description includes not only a case of directly and electrically connecting a plurality of elements but also a case of indirectly and electrically connecting a plurality of elements via other elements.

In addition, in the following description, "provided in common" means that a plurality of one elements shares another element, in other words, the other element is shared by a predetermined number of each of the one elements, unless otherwise specified.

Furthermore, the following description is an exemplary case where the embodiments of the present disclosure are applied to a back-illuminated imaging device. Accordingly, light is incident from the back surface side in the imaging device to be described below.

Hereinafter, embodiments for carrying out the present disclosure will be described in detail with reference to the drawings. Note that the description will be given in the following order.

1. First embodiment (imaging device having stacked structure of three substrates)
2. First modification (planar configuration example 1)
3. Second modification (planar configuration example 2)
4. Third modification (planar configuration example 3)
5. Fourth modification (example in which inter-substrate contact portion is provided at central portion of pixel array unit)
6. Fifth modification (example of including planar transfer transistor)
7. Sixth modification (example in which one pixel is connected to one pixel circuit)
8. Seventh modification (configuration example of pixel isolation portion)
9. Eighth modification
10. Second Embodiment
11. Third Embodiment
12. Application example (imaging system)
13. Examples of application to products
14. Summary
15. Supplementary notes 1. First Embodiment

[Functional Configuration of Imaging Device 1]

FIG. 1 is a block diagram illustrating an example of a functional configuration of an imaging device (imaging device 1) according to an embodiment of the present disclosure.

The imaging device 1 of FIG. 1 includes, for example, an input unit 510A, a row drive unit 520, a timing control unit 530, a pixel array unit 540, a column signal processing unit 550, an image signal processing unit 560, and an output unit 510B.

In the pixel array unit 540, pixels 541 are repeatedly arranged in an array. More specifically, a pixel sharing unit 539 including a plurality of pixels is a repeating unit, and is repeatedly arranged in an array including a row direction and a column direction. In the present specification, for convenience, the row direction may be referred to as an H direction, and the column direction orthogonal to the row direction may be referred to as a V direction. In the example of FIG. 1, one pixel sharing unit 539 includes four pixels (pixels 541A, 541B, 541C, and 541D). Each of the pixels 541A, 541B, 541C, and 541D includes a photodiode PD (illustrated in FIG. 6 and the like described below). The pixel sharing unit 539 is a unit of sharing one pixel circuit (a pixel circuit 210 in FIG. 3 described below). In other words, one pixel circuit (the pixel circuit 210 to be described below) is provided for every four pixels (pixels 541A, 541B, 541C, and 541D). By allowing the pixel circuit to operate in time division, a pixel signal of each of the pixels 541A, 541B, 541C, and 541D is sequentially read out. The pixels 541A, 541B, 541C, and 541D are each arranged in 2 rows×2 columns, for example. The pixel array unit 540 includes a plurality of row drive signal lines 542 and a plurality of vertical signal lines (column readout lines) 543 together with the pixels 541A, 541B, 541C, and 541D. The row drive signal line 542 drives the pixels 541 included in each of the plurality of pixel sharing units 539 arranged side by side in the row direction in the pixel array unit 540. In the pixel sharing unit 539, individual pixels arranged side by side in the row direction are driven. As will be described in detail below with reference to FIG. 4, the pixel sharing unit 539 is provided with a plurality of transistors. In order to drive each of the plurality of transistors, the plurality of row drive signal lines 542 is connected to one pixel sharing unit 539. The pixel sharing unit 539 is connected to the vertical signal line (column readout line) 543. A pixel signal is read out from each of the pixels 541A, 541B, 541C, and 541D included in the pixel sharing unit 539 via the vertical signal line (column readout line) 543.

The row drive unit 520 includes, for example, a row address control unit that determines a position of a row for pixel drive, in other words, a row decoder unit, and a row drive circuit unit that generates a signal for driving the pixels 541A, 541B, 541C, and 541D.

The column signal processing unit 550 includes, for example, a load circuit unit connected to the vertical signal line 543 and configured to form a source follower circuit with the pixels 541A, 541B, 541C, and 541D (pixel sharing unit 539). The column signal processing unit 550 may include an amplifier circuit unit that amplifies a signal read out from the pixel sharing unit 539 via the vertical signal line 543. The column signal processing unit 550 may include a noise processing unit. The noise processing unit removes system noise levels from the signal read out from the pixel sharing unit 539 as a result of photoelectric conversion, for example.

The column signal processing unit 550 includes an analog-to-digital converter (ADC), for example. The analog-to-digital converter converts the signal read out from the pixel sharing unit 539 or the noise-processed analog signal into a digital signal. The ADC includes, for example, a comparator unit and a counter unit. The comparator unit compares an analog signal to be converted with a reference signal for comparison. The counter unit is supposed to count the time until the comparison result in the comparator unit is inverted. The column signal processing unit 550 may include a horizontal scanning circuit unit that performs control to scan the readout column.

The timing control unit 530 supplies a signal controlling timing to the row drive unit 520 and the column signal processing unit 550 based on the reference clock signal and the timing control signal input to the device.

The image signal processing unit 560 is a circuit that applies various types of signal processing on data obtained as a result of photoelectric conversion, in other words, data obtained as a result of an imaging operation in the imaging device 1. The image signal processing unit 560 includes, for example, an image signal processing circuit unit and a data holding unit. The image signal processing unit 560 may include a processor unit.

An example of signal processing executed in the image signal processing unit 560 is a tone curve correction process of increasing levels of gradations in a case where the AD converted imaging data is data obtained by imaging a dark subject and reducing the levels of gradations in a case where the AD converted imaging data is data obtained by imaging a bright subject. In this case, it is desirable to preliminarily store, in the data holding unit of the image signal processing unit 560, the characteristic data of the tone curve, that is, which tone curve is to be used as a bases of the correction of gradation of the imaging data.

The input unit 510A is, for example, a unit provided for inputting the above-described reference clock signal, the timing control signal, the characteristic data, and the like from the outside of the device to the imaging device 1. The timing control signal is, for example, a vertical synchronization signal, a horizontal synchronization signal, or the like. The characteristic data is data to be stored in the data holding unit of the image signal processing unit 560, for example. The input unit 510A includes an input terminal 511, an input circuit unit 512, an input amplitude changing unit 513, an input data conversion circuit unit 514, and a power supply unit (not illustrated), for example.

The input terminal 511 is an external terminal for inputting data. The input circuit unit 512 is a unit provided for capturing a signal input to the input terminal 511 into the imaging device 1. The input amplitude changing unit 513 changes the amplitude of the signal captured by the input circuit unit 512 to an amplitude highly usable inside the imaging device 1. The input data conversion circuit unit 514 changes the arrangement of data strings of the input data. The input data conversion circuit unit 514 is constituted with a serial-to-parallel conversion circuit, for example. The serial-to-parallel conversion circuit converts a serial signal received as input data into a parallel signal. The input unit 510A can omit the input amplitude changing unit 513 and the input data conversion circuit unit 514. The power supply unit supplies power set to various voltages required inside the imaging device 1 based on power supplied from the outside to the imaging device 1.

When the imaging device 1 is connected to an external memory device, the input unit 510A may be provided with a memory interface circuit that receives data from the external memory device. Examples of the external memory device include a flash drive, SRAM, and DRAM.

The output unit 510B outputs image data to the outside of the device. Examples of the image data include image data captured by the imaging device 1, image data that has undergone signal processing performed by the image signal processing unit 560, and the like. The output unit 510B includes, for example, an output data conversion circuit unit 515, an output amplitude changing unit 516, an output circuit unit 517, and an output terminal 518.

The output data conversion circuit unit 515 is, for example, constituted with a parallel-to-serial conversion circuit, and thus, the output data conversion circuit unit 515 converts a parallel signal used inside the imaging device 1 into a serial signal. The output amplitude changing unit 516 changes the amplitude of a signal used inside the imaging device 1. The signal having amplitude changed will have high usability in an external device connected to the outside of the imaging device 1. The output circuit unit 517 is a circuit that outputs data from the inside of the imaging device 1 to the outside of the device. The output circuit unit 517 also drives wiring outside the imaging device 1 connected to the output terminal 518. Data is output from the imaging device 1 to the outside of the device via the output terminal 518. The output unit 510B can omit the output data conversion circuit unit 515 and the output amplitude changing unit 516.

When the imaging device 1 is connected to an external memory device, the output unit 510B may be provided with a memory interface circuit that outputs data to the external memory device. Examples of the external memory device include a flash drive, SRAM, and DRAM.

[Schematic Configuration of Imaging Device 1]

Figure 2:
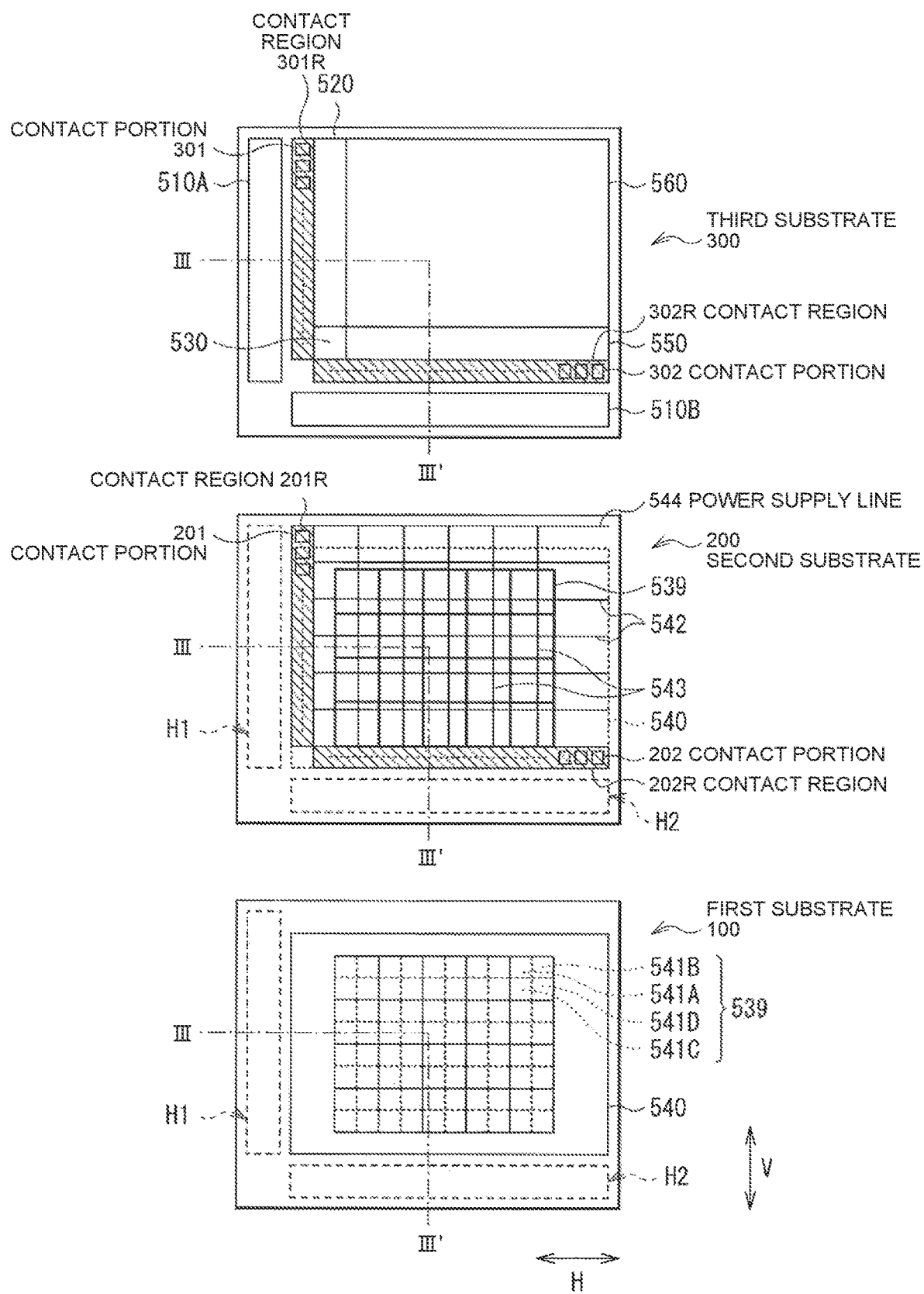
FIG. 2 is a schematic plan view illustrating a schematic configuration of the imaging device illustrated in FIG. 1.
Figure 3:
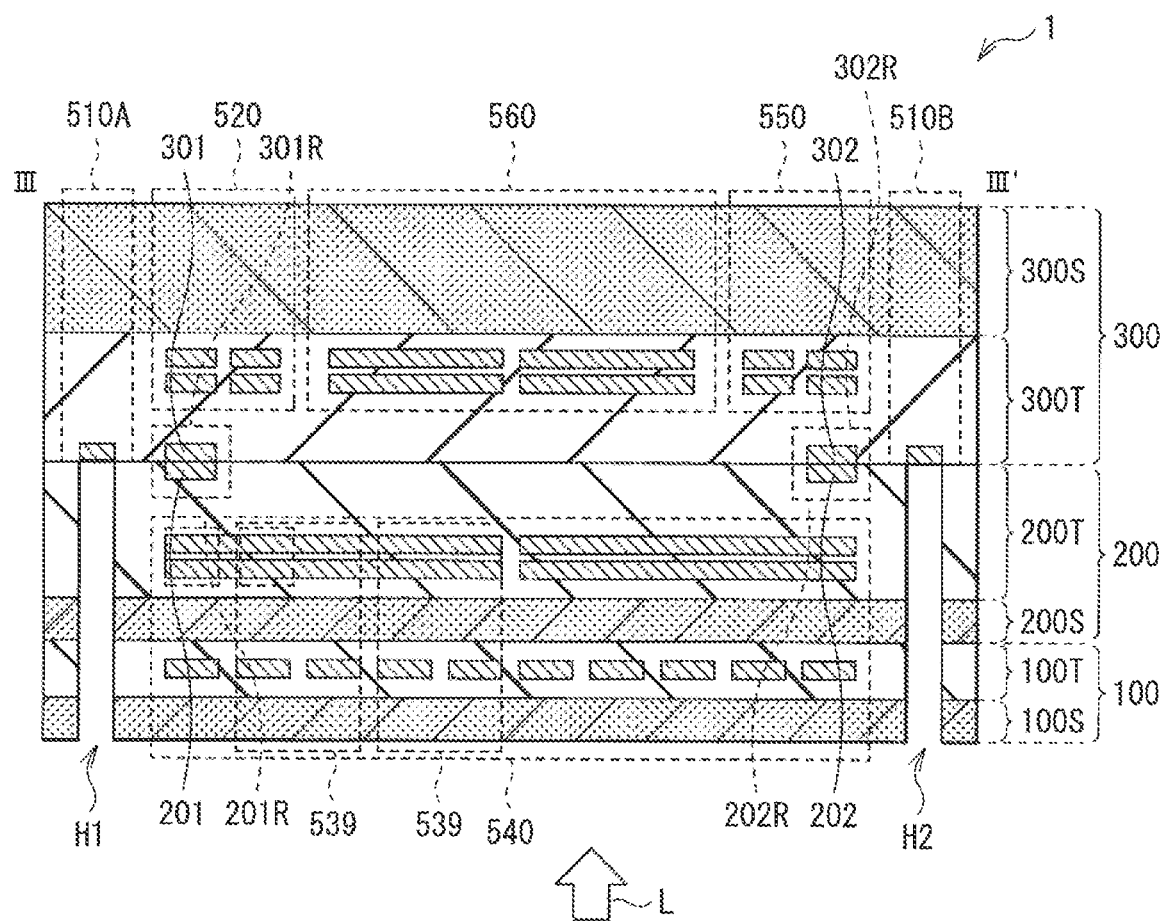
FIG. 3 is a schematic diagram illustrating a cross-sectional configuration taken along line III-III' in FIG. 2.

FIGS. 2 and 3 illustrate an example of a schematic configuration of the imaging device 1. The imaging device 1 includes three substrates (a first substrate 100, a second substrate 200, and a third substrate 300). FIG. 2 schematically illustrates a planar configuration of each of the first substrate 100, the second substrate 200, and the third substrate 300. FIG. 3 schematically illustrates a cross-sectional configuration of the first substrate 100, the second substrate 200, and the third substrate 300 stacked on each other. FIG. 3 corresponds to the cross-sectional configuration taken along line III-III' illustrated in FIG. 2. The imaging device 1 is an imaging device having a three-dimensional structure formed by bonding three substrates (the first substrate 100, the second substrate 200, and the third substrate 300). The first substrate 100 includes a semiconductor layer 100S and a wiring layer 100T. The second substrate 200 includes a semiconductor layer 200S and a wiring layer 200T. The third substrate 300 includes a semiconductor layer 300S and a wiring layer 300T. Here, a combination of the wiring included in each substrate of the first substrate 100, the second substrate 200, and the third substrate 300 together with an interlayer insulating film around the wiring is referred to as wiring layers (100T, 200T, and 300T) provided on each of the substrates (the first substrate 100, the second substrate 200, and the third substrate 300) for convenience. The first substrate 100, the second substrate 200, and the third substrate 300 are stacked in this order, and specifically, the layers are stacked in order of the semiconductor layer 100S, the wiring layer 100T, the semiconductor layer 200S, the wiring layer 200T, the wiring layer 300T, and the semiconductor layer 300S in a stacking direction. Specific configurations of the first substrate 100, the second substrate 200, and the third substrate 300 will be described below. The arrow illustrated in FIG. 3 indicates the incident direction of light L on the imaging device 1. In the following cross-sectional views in the present specification, the light incident side in the imaging device 1 may be referred to as "lower", "lower side", or "below", and the side opposite to the light incident side may be referred to as "upper", "upper side", or "above" for convenience. In addition, in the present specification, for convenience, in a substrate including a semiconductor layer and a wiring layer, a side of the wiring layer may be referred to as a front surface, and a side of the semiconductor layer may be referred to as a back surface. The description of the specification is not limited to the above terms. The imaging device 1 is, for example, a back-illuminated imaging device in which light enters from the back surface side of the first substrate 100 having a photodiode.

Both the pixel array unit 540 and the pixel sharing unit 539 included in the pixel array unit 540 are constituted by using both the first substrate 100 and the second substrate 200. The first substrate 100 is provided with the plurality of pixels 541A, 541B, 541C, and 541D included in the pixel sharing unit 539. Each of these pixels 541 includes a photodiode (photodiode PD (photoelectric conversion element) described below) and a transfer transistor (transfer transistor TR described below). The second substrate 200 is provided with a pixel circuit (a pixel circuit 210 to be described below) included in the pixel sharing unit 539. The pixel circuit reads out the pixel signal transferred from the photodiode of each of the pixels 541A, 541B, 541C, and 541D via the transfer transistor, or resets the photodiode. In addition to such a pixel circuit, the second substrate 200 includes a plurality of row drive signal lines 542 extending in the row direction and a plurality of vertical signal lines 543 extending in the column direction. The second substrate 200 further includes a power supply line 544 extending in the row direction. The third substrate 300 includes, for example, an input unit 510A, a row drive unit 520, a timing control unit 530, a column signal processing unit 550, an image signal processing unit 560, and an output unit 510B. The region in which the row drive unit 520 is located partially overlaps the pixel array unit 540 in the stacking direction of the first substrate 100, the second substrate 200, and the third substrate 300 (hereinafter, simply referred to as the stacking direction), for example. More specifically, the row drive unit 520 is provided in a region overlapping the vicinity of an end of the pixel array unit 540 in the H direction in the stacking direction (FIG. 2). The column signal processing unit 550 is provided, for example, in a region partially overlapping the pixel array unit 540 in the stacking direction. More specifically, the column signal processing unit 550 is provided in a region overlapping the vicinity of the end of the pixel array unit 540 in the V direction, in the stacking direction (FIG. 2). Although not illustrated, the input unit 510A and the output unit 510B may be disposed in a portion other than the third substrate 300, and may be disposed on the second substrate 200, for example. Alternatively, the input unit 510A and the output unit 510B may be provided on the back surface (light incident surface) side of the first substrate 100. The pixel circuit provided on the second substrate 200 may also be referred to as a pixel transistor circuit, a pixel transistor group, a pixel transistor, a pixel readout circuit, or a readout circuit as an alternative term. In the present specification, the term "pixel circuit" is used.

The first substrate 100 and the second substrate 200 are electrically connected by a through-substrate electrode (through-substrate electrodes 120E and 121E of FIG. 6 to be described below), for example. The second substrate 200 and the third substrate 300 are electrically connected via contact portions 201, 202, 301, and 302, for example. The contact portions 201 and 202 are provided on the second substrate 200, while the contact portions 301 and 302 are provided on the third substrate 300. The contact portion 201 of the second substrate 200 is in contact with the contact portion 301 of the third substrate 300, while the contact portion 202 of the second substrate 200 is in contact with the contact portion 302 of the third substrate 300. The second substrate 200 has a contact region 201R including a plurality of the contact portions 201 and a contact region 202R including a plurality of the contact portions 202. The third substrate 300 has a contact region 301R including a plurality of the contact portions 301 and a contact region 302R including a plurality of the contact portions 302. The contact regions 201R and 301R are provided between the pixel array unit 540 and the row drive unit 520 in the stacking direction (FIG. 3). In other words, the contact regions 201R and 301R are provided, for example, in a region where the row drive unit 520 (on the third substrate 300) and the pixel array unit 540 (on the second substrate 200) overlap each other in the stacking direction or in a region in their vicinity. The contact regions 201R and 301R are disposed at ends in the H direction in such regions, for example (FIG. 2). In the third substrate 300, for example, the contact region 301R is provided at a position overlapping a part of the row drive unit 520, specifically the end of the row drive unit 520 in the H direction (FIGS. 2 and 3). The contact portions 201 and 301 connect, for example, the row drive unit 520 provided on the third substrate 300 and the row drive signal line 542 provided on the second substrate 200 to each other. For example, the contact portions 201 and 301 may connect the input unit 510A provided on the third substrate 300, the power supply line 544, and a reference potential line (a reference potential line VSS described below) to each other. The contact regions 202R and 302R are provided between the pixel array unit 540 and the column signal processing unit 550 in the stacking direction (FIG. 3). In other words, the contact regions 202R and 302R are provided, for example, in a region where the column signal processing unit 550 (on the third substrate 300) and the pixel array unit 540 (on the second substrate 200) overlap each other in the stacking direction or in a region in their vicinity. The contact regions 202R and 302R are disposed at ends in the V direction in such regions, for example (FIG. 2). In the third substrate 300, for example, the contact region 301R is provided at a position overlapping a part of the column signal processing unit 550, specifically, the end of the column signal processing unit 550 in the V direction (FIGS. 2 and 3). The contact portions 202 and 302 are provided for connecting a pixel signal (a signal corresponding to the amount of charge generated as a result of photoelectric conversion in a photodiode) output from each of the plurality of pixel sharing units 539 included in the pixel array unit 540 to the column signal processing unit 550 provided on the third substrate 300. The pixel signal is to be transmitted from the second substrate 200 to the third substrate 300.

FIG. 3 is an example of a cross-sectional view of the imaging device 1 as described above. The first substrate 100, the second substrate 200, and the third substrate 300 are electrically connected to each other via the wiring layers 100T, 200T, and 300T. For example, the imaging device 1 includes an electrical connection portion that electrically connects the second substrate 200 and the third substrate 300 to each other. Specifically, the contact portions 201, 202, 301, and 302 are formed with electrodes formed of a conductive material. The conductive material is formed of, for example, a metal material such as copper (Cu), aluminum (Al), or gold (Au). By directly bonding wiring portions formed as electrodes, for example, the contact regions 201R, 202R, 301R, and 302R electrically connect the second substrate and the third substrate to each other, enabling signal input and/or output between the second substrate 200 and the third substrate 300.

An electrical connection portion that electrically connects the second substrate 200 and the third substrate 300 can be provided at a desired location. For example, as described as the contact regions 201R, 202R, 301R, and 302R in FIG. 3, the contact regions may be provided in a region overlapping the pixel array unit 540 in the stacking direction. The electrical connection portion may be provided in a region not overlapping the pixel array unit 540 in the stacking direction. Specifically, it may be provided in a region overlapping a peripheral portion disposed outside the pixel array unit 540 in the stacking direction.

The first substrate 100 and the second substrate 200 are provided with connection holes H1 and H2, for example. The connection holes H1 and H2 penetrate the first substrate 100 and the second substrate 200 (FIG. 3). The connection holes H1 and H2 are provided outside the pixel array unit 540 (or a portion overlapping the pixel array unit 540) (FIG. 2). For example, the connection hole H1 is arranged outside the pixel array unit 540 in the H direction, while the connection hole H2 is arranged outside the pixel array unit 540 in the V direction. For example, the connection hole H1 reaches the input unit 510A provided in the third substrate 300, while the connection hole H2 reaches the output unit 510B provided in the third substrate 300. The connection holes H1 and H2 may be hollow, and may at least a partially contain a conductive material. For example, there is a configuration in which a bonding wire is connected to an electrode formed as the input unit 510A and/or the output unit 510B.

Alternatively, there is a configuration in which the electrode formed as the input unit 510A and/or the output unit 510B is connected to the conductive material provided in the connection holes H1 and H2. The conductive material provided in the connection holes H1 and H2 may be embedded in a part or all of the connection holes H1 and H2, and the conductive material may be formed on side walls of the connection holes H1 and H2.

FIG. 3 is a case of a structure in which the input unit 510A and the output unit 510B are provided on the third substrate 300, but the present disclosure is not limited thereto. For example, by sending a signal of the third substrate 300 to the second substrate 200 via the wiring layers 200T and 300T, the input unit 510A and/or the output unit 510B can be provided on the second substrate 200. Similarly, by sending a signal of the second substrate 200 to the first substrate 1000 via the wiring layers 100T and 200T, the input unit 510A and/or the output unit 510B can be provided on the first substrate 100.

Figure 4:
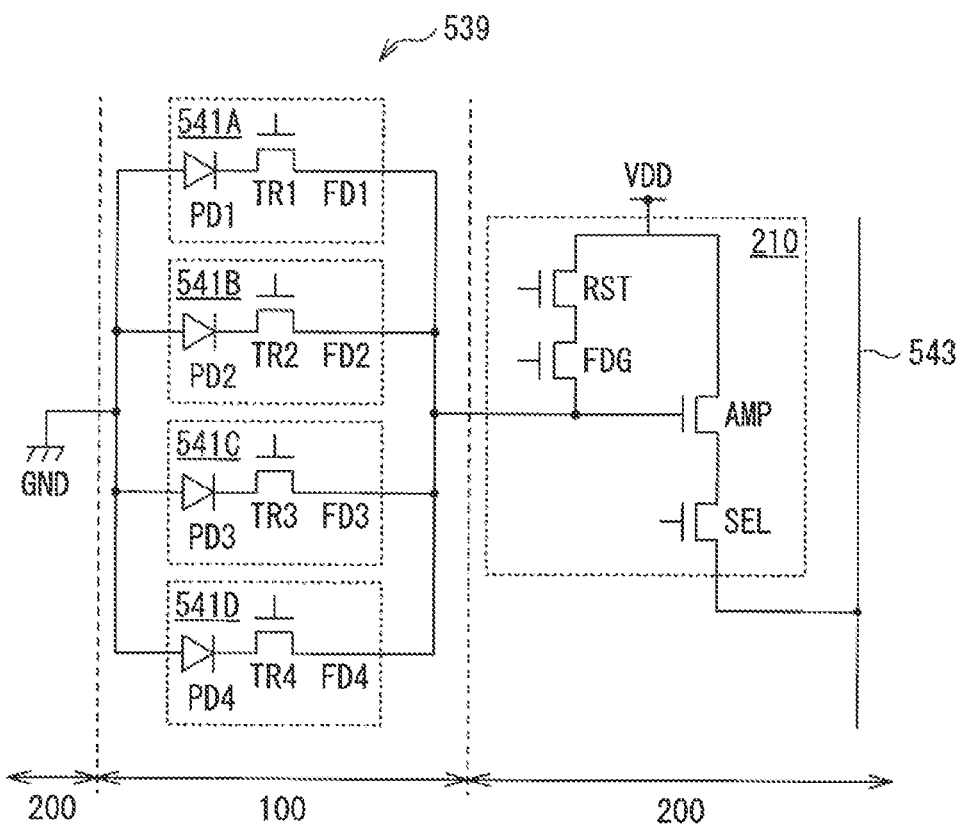
FIG. 4 is an equivalent circuit diagram of a pixel sharing unit illustrated in FIG. 1.

FIG. 4 is an equivalent circuit diagram illustrating an example of a configuration of the pixel sharing unit 539. The pixel sharing unit 539 includes the plurality of pixels 541 (FIG. 4 illustrates four pixels 541, namely, the pixels 541A, 541B, 541C, and 541D), one pixel circuit 210 connected to the plurality of pixels 541, and a vertical signal line 5433 connected to the pixel circuit 210. The pixel circuit 210 includes four transistors, specifically, an amplification transistor AMP, a selection transistor SEL, a reset transistor RST, and an FD conversion gain switching transistor FD, for example. As described above, by operating one pixel circuit 210 in time division, the pixel sharing unit 539 is configured to sequentially output the pixel signals of the four pixels 541 (pixels 541A, 541B, 541C, and 541D) included in the pixel sharing unit 539 to the vertical signal line 543. The mode in which one pixel circuit 210 is connected to the plurality of pixels 541 and pixel signals of the plurality of pixels 541 are output by the one pixel circuit 210 in time division is referred to as a mode in which "the plurality of pixels 541 shares one pixel circuit 210".

The pixels 541A, 541B, 541C, and 541D have components common to each other. Hereinafter, in order to distinguish the components of the pixels 541A, 541B, 541C, and 541D from each other, an identification number 1 is assigned to the end of the sign of the component of the pixel 541A, an identification number 2 is assigned to the end of the sign of the component of the pixel 541B, an identification number 3 is assigned to the end of the sign of the component of the pixel 541C, and an identification number 4 is assigned to the end of the sign of the component of the pixel 541D. When there is no need to distinguish the components of the pixels 541A, 541B, 541C, and 541D from each other, the identification numbers at the ends of the signs of the components of the pixels 541A, 541B, 541C, and 541D are omitted.

The pixels 541A, 541B, 541C, and 541D each include, for example, a photodiode PD, a transfer transistor TR electrically connected to the photodiode PD, and a node of floating diffusion FD electrically connected to the transfer transistor TR. The photodiode PD (PD1, PD2, PD3, and PD4) has a cathode electrically connected to the source of the transfer transistor TR and has an anode electrically connected to a reference potential line (for example, ground). The photodiode PD photoelectrically converts incident light and generates a charge corresponding to the amount of received light. The transfer transistor TR (transfer transistors TR1, TR2, TR3, or TR4) is, for example, an n type complementary metal oxide semiconductor (CMOS) transistor. The transfer transistor TR has its drain electrically connected to the floating diffusion FD, and has its gate electrically connected to the drive signal line. This drive signal line is a part of the plurality of row drive signal lines 542 (refer to FIG. 1) connected to one pixel sharing unit 539. The transfer transistor TR transfers the charge generated in the photodiode PD to the floating diffusion FD. The floating diffusion FD (specifically, the floating diffusion FD1, FD2, FD3, or FD4) is an n type diffusion layer region formed in the p type semiconductor layer. The floating diffusion FD is a charge holding means of temporarily holding the charge transferred from the photodiode PD, and is a charge-voltage conversion means of generating a voltage corresponding to the charge amount.

The four nodes of floating diffusion FD (specifically, floating diffusion FD1, FD2, FD3, and FD4) included in one pixel sharing unit 539 are electrically connected to each other, and are electrically connected to the gate of the amplification transistor AMP and the source of an FD conversion gain switching transistor FDG. The drain of the FD conversion gain switching transistor FDG is connected to the source of the reset transistor RST, and the gate of the FD conversion gain switching transistor FDG is connected to a drive signal line. This drive signal line is a part of the plurality of row drive signal lines 542 connected to one pixel sharing unit 539. The drain of the reset transistor RST is connected to a power supply line VDD, and the gate of the reset transistor RST is connected to the drive signal line. This drive signal line is a part of the plurality of row drive signal lines 542 connected to one pixel sharing unit 539. The gate of the amplification transistor AMP is connected to the floating diffusion FD, the drain of the amplification transistor AMP is connected to the power supply line VDD, and the source of the amplification transistor AMP is connected to the drain of the selection transistor SEL. The source of the selection transistor SEL is connected to the vertical signal line 543, while the gate of the selection transistor SEL is connected to the drive signal line. This drive signal line is a part of the plurality of row drive signal lines 542 connected to one pixel sharing unit 539.

Figure 6:
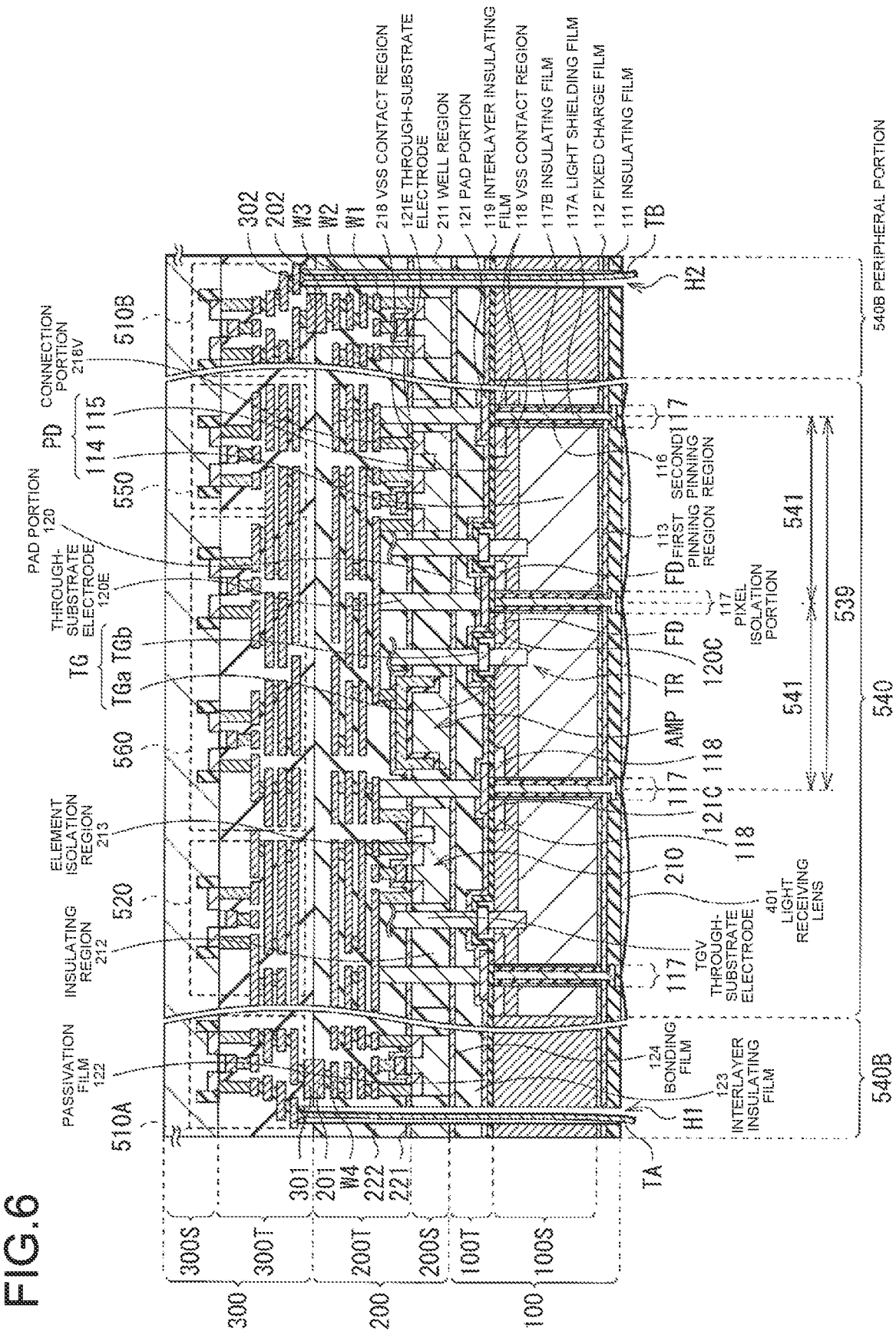
FIG. 6 is a schematic cross-sectional view illustrating an example of a specific configuration of the imaging device illustrated in FIG. 3.

When the transfer transistor TR is turned on, the transfer transistor TR transfers the charge of the photodiode PD to the floating diffusion FD. A gate (transfer gate TG) of the transfer transistor TR includes, for example, an electrode referred to as a vertical electrode, and is provided to extend from a front surface of a semiconductor layer (a semiconductor layer 100S in FIG. 6 to be described below) to a depth reaching the PD as illustrated in FIG. 6 to be described below. The reset transistor RST resets the potential of the floating diffusion FD to a predetermined potential. When the reset transistor RST is turned on, the potential of the floating diffusion FD is reset to the potential of the power supply line VDD. The selection transistor SEL controls an output timing of the pixel signal from the pixel circuit 210. The amplification transistor AMP generates a signal at a voltage corresponding to the level of the charge held in the floating diffusion FD as a pixel signal. The amplification transistor AMP is connected to the vertical signal line 543 via the selection transistor SEL. The amplification transistor AMP constitutes a source follower together with a load circuit unit (refer to FIG. 1) connected to the vertical signal line 543 in the column signal processing unit 550. When the selection transistor SEL is turned on, the amplification transistor AMP outputs the voltage of the floating diffusion FD to the column signal processing unit 550 via the vertical signal line 543. The reset transistor RST, the amplification transistor AMP, and the selection transistor SEL are N type CMOS transistors, for example.

The FD conversion gain switching transistor FDG is used to change the gain of charge-voltage conversion in the floating diffusion FD. In general, a pixel signal is weak at the time of shooting in a dark place. Based on Q=CV, when the capacitance (FD capacitance C) of the floating diffusion FD is large at the time of performing charge-voltage conversion, this results in a small V at the time of conversion into a voltage by the amplification transistor AMP. In contrast, the pixel signal has a great strength in a bright place, making it difficult to hold the charge of the photodiode PD at the floating diffusion FD unless the FD capacitance C is large enough. Furthermore, the FD capacitance C needs to be large so that V when converted into a voltage by the amplification transistor AMP does not become too high (in other words, so as to be low). In view of these, when the FD conversion gain switching transistor FDG is turned on, the gate capacitance of the FD conversion gain switching transistor FDG increases, leading to an increase in the entire FD capacitance C. In contrast, when the FD conversion gain switching transistor FDG is turned off, the entire FD capacitance C decreases. In this manner, switching on/off of the FD conversion gain switching transistor FDG can achieve variable FD capacitance C, making it possible to switch the conversion efficiency. The FD conversion gain switching transistor FDG is an N type CMOS transistor, for example.

Note that there may be a configuration without the FD conversion gain switching transistor FDG. At this time, for example, the pixel circuit 210 includes three transistors, for example, an amplification transistor AMP, a selection transistor SEL, and a reset transistor RST. The pixel circuit 210 includes, for example, at least one of pixel transistors such as an amplification transistor AMP, a selection transistor SEL, a reset transistor RST, and an FD conversion gain switching transistor FDG.

The selection transistor SEL may be provided between the power supply line VDD and the amplification transistor AMP. In this case, the drain of the reset transistor RST is electrically connected to the power supply line VDD and the drain of the selection transistor SEL. The source of the selection transistor SEL is electrically connected to the drain of the amplification transistor AMP, while the gate of the selection transistor SEL is electrically connected to the row drive signal line 542 (refer to FIG. 1). The source of the amplification transistor AMP (an output end of the pixel circuit 210) is electrically connected to the vertical signal line 543, while the gate of the amplification transistor AMP is electrically connected to the source of the reset transistor RST. Note that, although not illustrated, the number of pixels 541 sharing one pixel circuit 210 may be other than four. For example, two or eight pixels 541 may share one pixel circuit 210.

Figure 5:
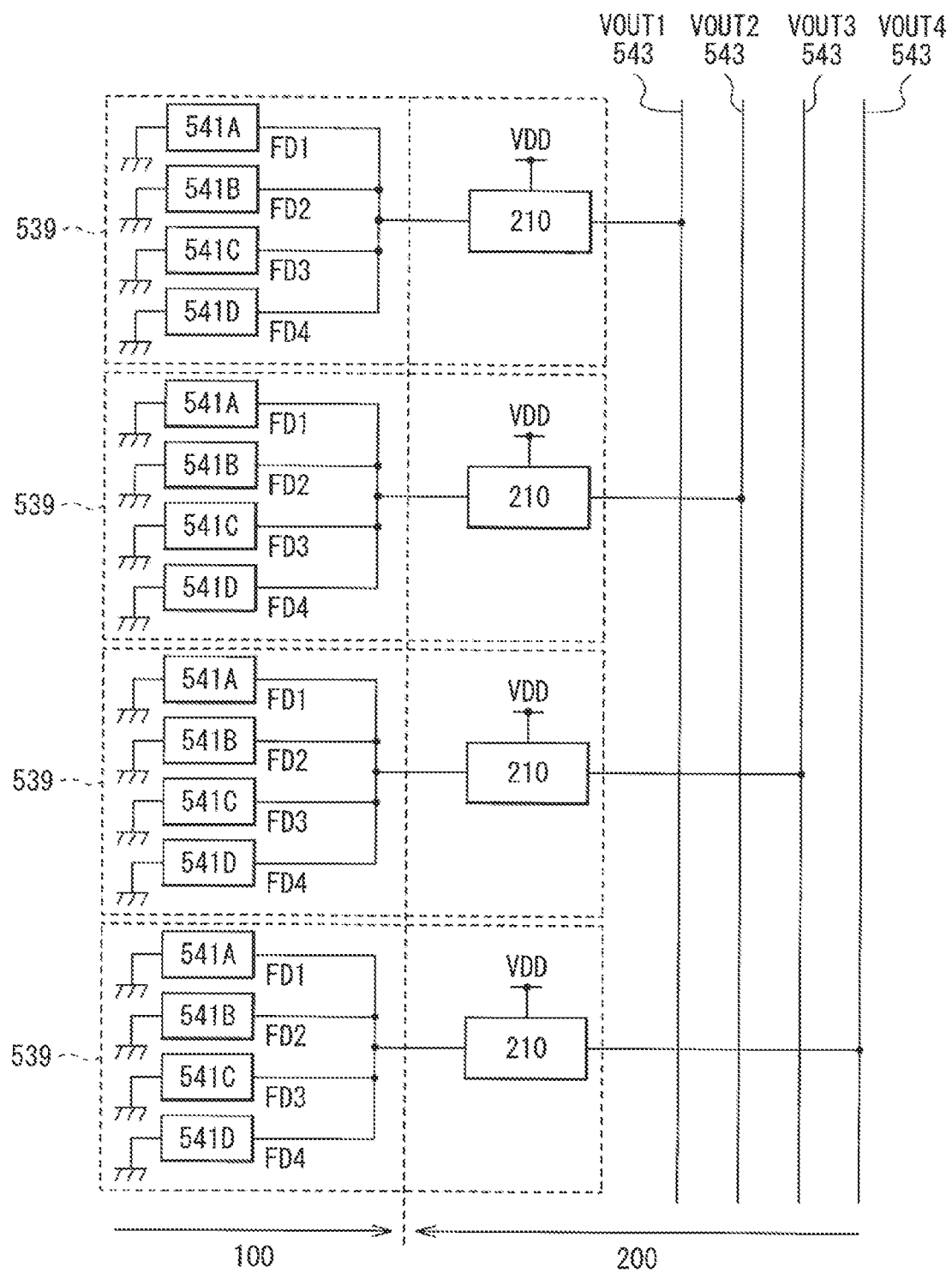
FIG. 5 is a diagram illustrating an example of a connection mode between a plurality of pixel sharing units and a plurality of vertical signal lines.

FIG. 5 illustrates an example of a connection mode between the plurality of pixel sharing units 539 and the vertical signal line 543. For example, the four pixel sharing units 539 aligned in the column direction are divided into four groups, and the vertical signal line 543 is connected to each of the four groups. For simplification, FIG. 5 illustrates an example in which each of the four groups has one pixel sharing unit 539, but the four groups may each include a plurality of pixel sharing units 539. In this manner, in the imaging device 1, the plurality of pixel sharing units 539 aligned in the column direction may be divided into groups including one or a plurality of pixel sharing units 539. For example, the vertical signal line 543 and the column signal processing unit 550 are connected to each of the groups, and pixel signals can be simultaneously read out from each of the groups. Alternatively, in the imaging device 1, one vertical signal line 543 may be connected to the plurality of pixel sharing units 539 aligned in the column direction. At this time, pixel signals are sequentially read out from the plurality of pixel sharing units 539 connected to the one vertical signal line 543 in time division.

[Specific Configuration of Imaging Device 1]

FIG. 6 illustrates an example of a cross-sectional configuration in a direction perpendicular to main surfaces of the first substrate 100, the second substrate 200, and the third substrate 300 of the imaging device 1. FIG. 6 schematically illustrates the positional relationship of the components to facilitate understanding, and may be different from the actual cross section. In the imaging device 1, a first substrate 100, a second substrate 200, and a third substrate 300 are stacked in this order. The imaging device 1 further includes a light receiving lens 401 on the back surface side (light incident surface side) of the first substrate 100. A color filter layer (not illustrated) may be provided between the light receiving lens 401 and the first substrate 100. The light receiving lens 401 is provided in each of the pixels 541A, 541B, 541C, and 541D, for example. The imaging device 1 is, for example, a back-illuminated imaging device. The imaging device 1 includes a pixel array unit 540 disposed in a central portion and a peripheral portion 540B disposed at an outer side of the pixel array unit 540.

The first substrate 100 includes an insulating film 111, a fixed charge film 112, a semiconductor layer 100S, and a wiring layer 100T in this order from the light receiving lens 401 side. The semiconductor layer 100S is formed of a silicon substrate, for example. The semiconductor layer 100S includes, for example, a p well layer 115 in a part of the front surface (surface on the wiring layer 100T side) and in the vicinity thereof, and an n type semiconductor region 114 in the other region (region deeper than the p well layer 115). For example, the n type semiconductor region 114 and the p well layer 115 constitute a pn junction type photodiode PD. The p well layer 115 is a p type semiconductor region.

Figure 7A:
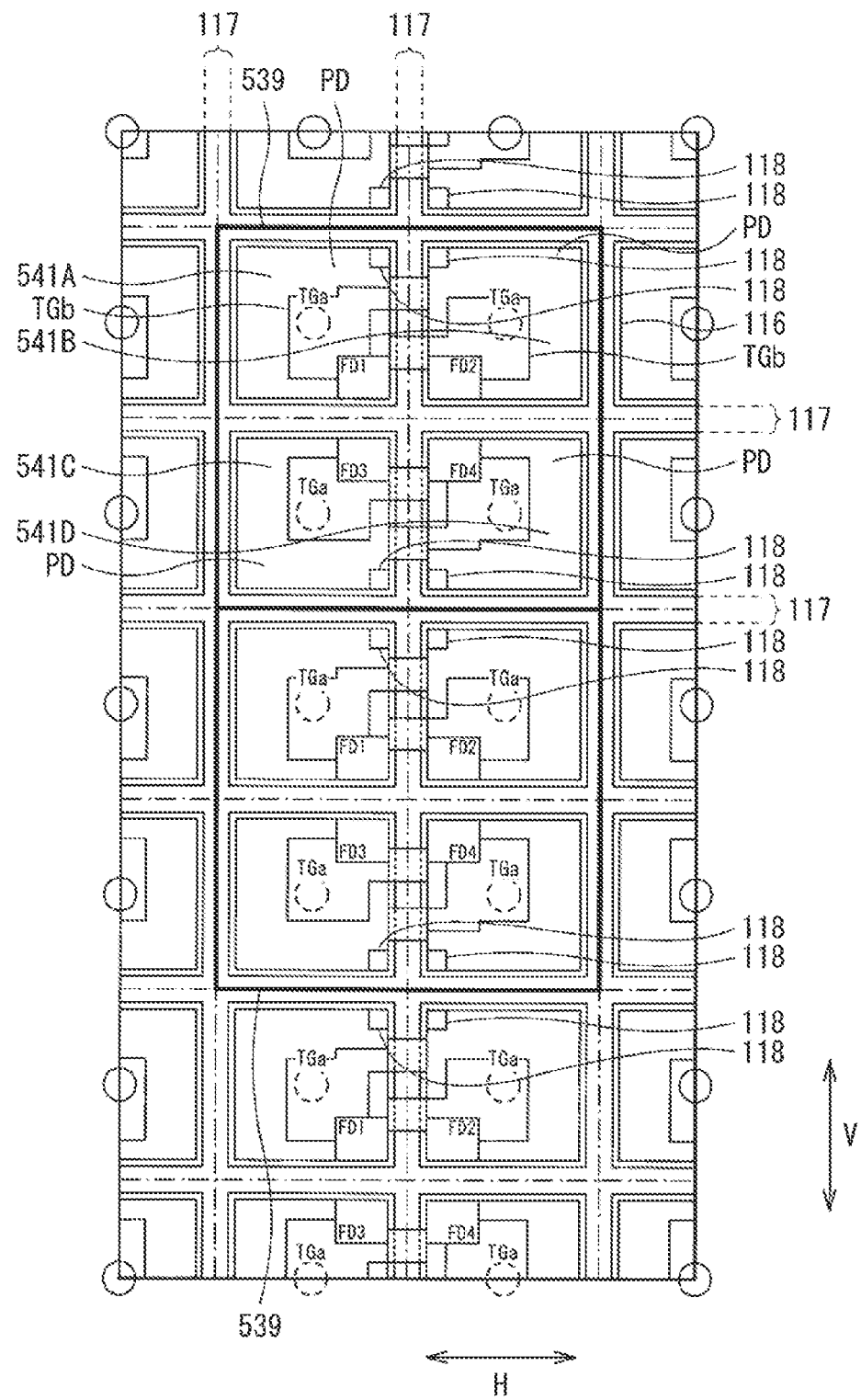
FIG. 7A is a schematic diagram illustrating an example of a planar configuration of a main part of a first substrate illustrated in FIG. 6.

FIG. 7A illustrates an example of a planar configuration of the first substrate 100. FIG. 7A mainly illustrates a planar configuration of a pixel isolation portion 117, a photodiode PD, floating diffusion FD, a VSS contact region 118, and a transfer transistor TR of the first substrate 100. The configuration of the first substrate 100 will be described with reference to FIG. 7A together with FIG. 6.

The floating diffusion FD and the VSS contact region 118 are provided in the vicinity of the front surface of the semiconductor layer 100S. The floating diffusion FD includes an n type semiconductor region provided in the p well layer 115. The nodes of floating diffusion FD (floating diffusion FD1, FD2, FD3, and FD4) of each of the pixels 541A, 541B, 541C, and 541D are provided close to each other in the central portion of the pixel sharing unit 539, for example (FIG. 7A). Although details will be described below, the four nodes of floating diffusion (floating diffusion FD1, FD2, FD3, and FD4) included in the pixel sharing unit 539 are electrically connected to each other via an electrical connection means (a pad portion 120 described below) in the first substrate 100 (more specifically, in the wiring layer 100T). Furthermore, the floating diffusion FD is connected from the first substrate 100 to the second substrate 200 (more specifically, from the wiring layer 100T to the wiring layer 200T) via an electrical means (a through-substrate electrode 120E described below). In the second substrate 200 (more specifically, inside the wiring layer 200T), the floating diffusion FD is electrically connected, via this electrical means, to the gate of the amplification transistor AMP and the source of the FD conversion gain switching transistor FDG.

The VSS contact region 118 is a region electrically connected to the reference potential line VSS, and is separated away from the floating diffusion FD. For example, in the pixels 541A, 541B, 541C, and 541D, the floating diffusion FD is disposed at one end and the VSS contact region 118 is disposed at the other end of each of pixels in the V direction (FIG. 7A). The VSS contact region 118 includes, for example, a p type semiconductor region. The VSS contact region 118 is connected to a ground potential or a fixed potential, for example. This allows the reference potential to be supplied to the semiconductor layer 100S.

Together with the photodiode PD, the floating diffusion FD, and the VSS contact region 118, the transfer transistor TR is provided on the first substrate 100. The photodiode PD, the floating diffusion FD, the VSS contact region 118, and the transfer transistor TR are provided in each of the pixels 541A, 541B, 541C, and 541D. The transfer transistor TR is provided on the front surface side (side opposite to the light incident surface side, being the second substrate 200 side) of the semiconductor layer 100S. The transfer transistor TR has a transfer gate TG. The transfer gate TG includes, for example, a horizontal portion TGb facing the front surface of the semiconductor layer 100S and a vertical portion TGa provided in the semiconductor layer 100S. The vertical portion TGa extends in a thickness direction of the semiconductor layer 100S. The vertical portion TGa has one end being in contact with the horizontal portion TGb and the other end being provided in the n type semiconductor region 114. With a configuration of the transfer transistor TR using a vertical transistor like this, it is possible to suppress an occurrence of a transfer failure of the pixel signal and improve readout efficiency of the pixel signal.

The horizontal portion TGb of the transfer gate TG extends from a position facing the vertical portion TGa toward the central portion of the pixel sharing unit 539 in the H direction, for example (FIG. 7A). With this configuration, the position, in the H direction, of the through-substrate electrode (through-substrate electrode TGV to be described below) reaching the transfer gate TG can be brought close to the position, in the H direction, of the through-substrate electrodes (through-substrate electrodes 120E and 121E to be described below) connected to the floating diffusion FD and the VSS contact region 118. For example, the plurality of pixel sharing units 539 provided on the first substrate 100 has the same configuration (FIG. 7A).

Figure 7B:
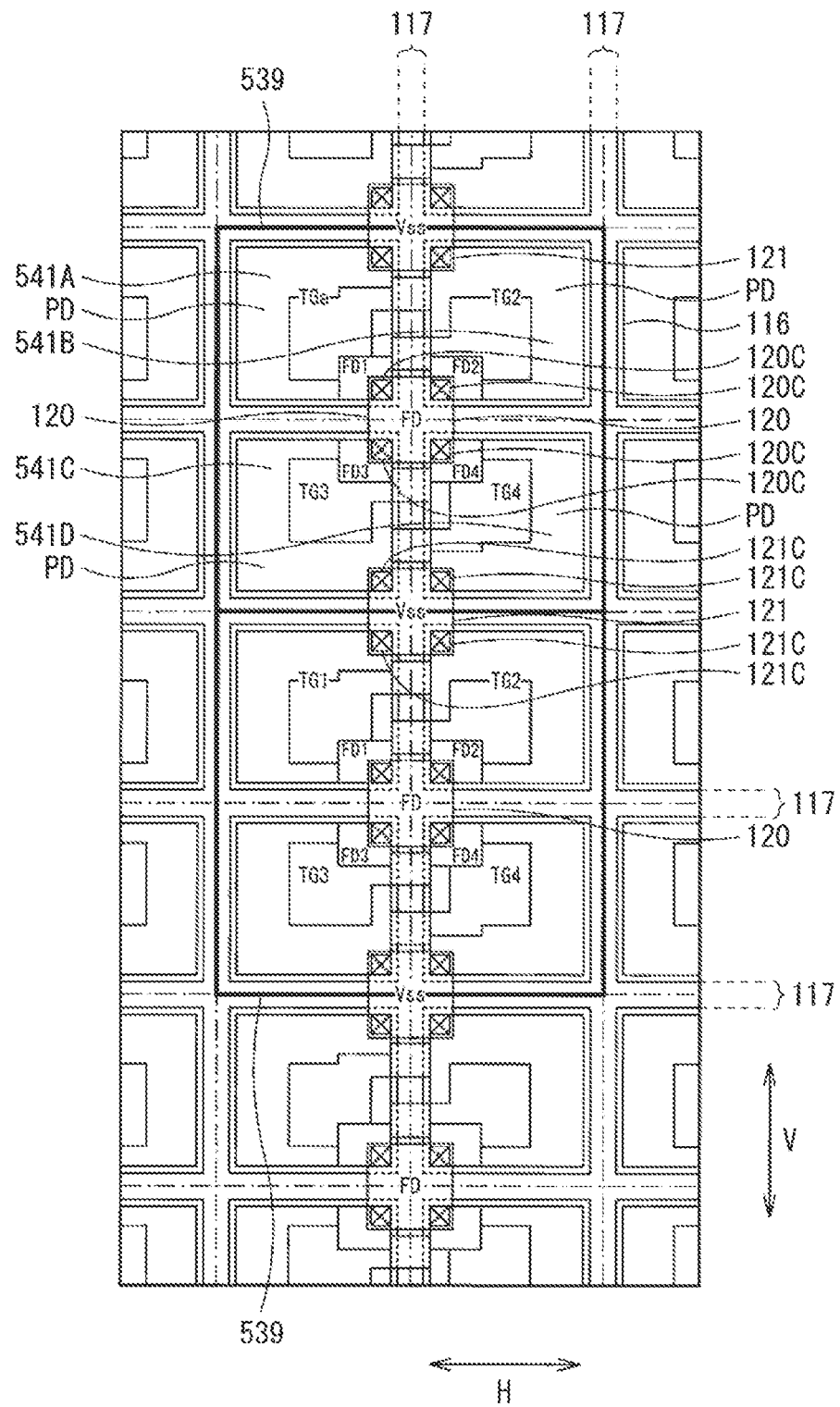
FIG. 7B is a schematic diagram illustrating a planar configuration of a pad portion together with the main part of the first substrate illustrated in FIG. 7A.

The semiconductor layer 100S is provided with the pixel isolation portion 117 that isolates the pixels 541A, 541B, 541C, and 541D from each other. The pixel isolation portion 117 is formed to extend in the normal direction of the semiconductor layer 100S (direction perpendicular to the front surface of the semiconductor layer 100S). The pixel isolation portion 117 is provided so as to partition the pixels 541A, 541B, 541C, and 541D from each other, and has a grid-like planar shape, for example (FIGS. 7A and 7B). For example, the pixel isolation portion 117 electrically and optically isolates the pixels 541A, 541B, 541C, and 541D from each other. The pixel isolation portion 117 includes a light shielding film 117A and an insulating film 117B, for example. For example, the light shielding film 117A is formed of tungsten (W) or the like. The insulating film 117B is provided between the light shielding film 117A and the p well layer 115 or the n type semiconductor region 114. The insulating film 117B is formed of silicon oxide (SiO), for example. The pixel isolation portion 117 has a full trench isolation (FTI) structure, for example, and penetrates the semiconductor layer 100S. Although not illustrated, the pixel isolation portion 117 is not limited to the FTI structure penetrating the semiconductor layer 100S. For example, it is allowable to use a deep trench isolation (DTI) structure not penetrating the semiconductor layer 100S. The pixel isolation portion 117 extends in the normal direction of the semiconductor layer 100S and is formed in a partial region of the semiconductor layer 100S.

The semiconductor layer 100S includes a first pinning region 113 and a second pinning region 116, for example. The first pinning region 113 is provided in the vicinity of the back surface of the semiconductor layer 100S so as to be arranged between the n type semiconductor region 114 and the fixed charge film 112. The second pinning region 116 is provided on a side surface of the pixel isolation portion 117, specifically, between the pixel isolation portion 117 and the p well layer 115 or the n type semiconductor region 114. The first pinning region 113 and the second pinning region 116 are formed with a p type semiconductor region, for example.

There is provided a fixed charge film 112 having a negative fixed charge between the semiconductor layer 100S and the insulating film 111. With the electric field induced by the fixed charge film 112, the first pinning region 113 of a hole accumulation layer is formed at an interface on the light-receiving surface (back surface) side of the semiconductor layer 100S. This can suppress the generation of dark current due to the interface state on the light-receiving surface side of the semiconductor layer 100S. The fixed charge film 112 is formed of an insulating film having a negative fixed charge, for example. Examples of the material of the insulating film having a negative fixed charge include hafnium oxide, zircon oxide, aluminum oxide, titanium oxide, and tantalum oxide.

The light shielding film 117A is provided between the fixed charge film 112 and the insulating film 111. The light shielding film 117A may be provided continuously with the light shielding film 117A constituting the pixel isolation portion 117. The light shielding film 117A between the fixed charge film 112 and the insulating film 111 is selectively provided at a position facing the pixel isolation portion 117 in the semiconductor layer 100S, for example. The insulating film 111 is provided so as to cover the light shielding film 117A. The insulating film 111 is formed of silicon oxide, for example.

The wiring layer 100T, provided between the semiconductor layer 100S and the second substrate 200, includes an interlayer insulating film 119, pad portions 120 and 121, a passivation film 122, an interlayer insulating film 123, and a bonding film 124 in this order from the semiconductor layer 100S side. The horizontal portion TGb of the transfer gate TG is provided in the wiring layer 100T, for example. The interlayer insulating film 119 is provided over the entire front surface of the semiconductor layer 100S and is in contact with the semiconductor layer 100S. The interlayer insulating film 119 is formed of a silicon oxide film, for example. Note that the configuration of the wiring layer 100T is not limited to the above, and any configuration including wiring and an insulating film may be used.

FIG. 7B illustrates the configuration of the pad portions 120 and 121 together with the planar configuration illustrated in FIG. 7A. The pad portions 120 and 121 are provided in a selected region on the interlayer insulating film 119. The pad portion 120 is provided for connecting the nodes of the floating diffusion FD (floating diffusion FD1, FD2, FD3, and FD4) of the pixels 541A, 541B, 541C, and 541D to each other. For example, the pad portion 120 is disposed at the central portion of the pixel sharing unit 539 in plan view for each of the pixel sharing units 539 (FIG. 7B). The pad portion 120 is provided across the pixel isolation portion 117, and is arranged so as to overlap at least a part of each of nodes of the floating diffusion FD1, FD2, FD3, and FD4 (FIGS. 6 and 7B). Specifically, the pad portion 120 is formed in a region overlapping at least a part of each of the plurality of nodes of floating diffusion FD (floating diffusion FD1, FD2, FD3, and FD4) sharing the pixel circuit 210 and at least a part of the pixel isolation portion 117 formed between the plurality of photodiodes PD (photodiodes PD1, PD2, PD3, and PD4) sharing the pixel circuit 210, in a direction perpendicular to the front surface of the semiconductor layer 100S. The interlayer insulating film 119 is provided with a connection via 120C for electrically connecting the pad portion 120 and nodes of the floating diffusion FD1, FD2, FD3, and FD4. The connection via 120C is provided in each of the pixels 541A, 541B, 541C, and 541D. For example, by embedding a part of the pad portion 120 in the connection via 120C, the pad portion 120 is electrically connected to each of nodes of the floating diffusion FD1, FD2, FD3, and FD4.

The pad portion 121 is provided for connecting the plurality of VSS contact regions 118 to each other. For example, the VSS contact region 118 provided in the pixels 541C and 541D of one pixel sharing unit 539 adjacent in the V direction is electrically connected with the VSS contact region 118 provided in the pixels 541A and 541B of the other pixel sharing unit 539 by the pad portion 121. The pad portion 121 is provided across the pixel isolation portion 117, for example, and is disposed to overlap at least a part of each of the four VSS contact regions 118. Specifically, the pad portion 121 is formed in a region overlapping at least a part of each of the plurality of VSS contact regions 118 and at least a part of the pixel isolation portion 117 formed between the plurality of VSS contact regions 118 in a direction perpendicular to the front surface of the semiconductor layer 100S. The interlayer insulating film 119 is provided with a connection via 121C for electrically connecting the pad portion 121 and the VSS contact region 118 to each other. The connection via 121C is provided in each of the pixels 541A, 541B, 541C, and 541D. For example, by embedding a part of the pad portion 121 in the connection via 121C, the pad portion 121 and the VSS contact region 118 are electrically connected to each other. For example, the pad portion 120 and the pad portion 121 of each of the plurality of pixel sharing units 539 aligned in the V direction are arranged at substantially the same position in the H direction (FIG. 7B).

By providing the pad portion 120, it is possible to reduce the number of wiring lines for connecting from each floating diffusion FD to the pixel circuit 210 (for example, a gate electrode of the amplification transistor AMP) in the entire chip. Similarly, by providing the pad portion 121, wiring for supplying a potential to each VSS contact region 118 can be reduced in the entire chip. This configuration makes it possible to reduce the area of the entire chip, suppress the electrical interference between the wiring lines in the miniaturized pixel, and/or reduce the cost by decreased number of components.

The pad portions 120 and 121 can be provided at desired positions on the first substrate 100 and the second substrate 200. Specifically, the pad portions 120 and 121 can be provided in either the wiring layer 100T or an insulating region 212 of the semiconductor layer 200S. When provided in the wiring layer 100T, the pad portions 120 and 121 may be brought into direct contact with the semiconductor layer 100S. Specifically, the pad portions 120 and 121 may be directly connected to at least a part of each of the floating diffusion FD and/or the VSS contact region 118. Alternatively, it is allowable to use a configuration in which the connection vias 120C and 121C are provided from the floating diffusion FD and/or the VSS contact region 118 connected to the pad portions 120 and 121, respectively, and the pad portions 120 and 121 may be provided at desired positions of the insulating region 2112 of the wiring layer 100T and the semiconductor layer 200S.

In particular, in a case where the pad portions 120 and 121 are provided in the wiring layer 100T, it is possible to reduce the number of wiring lines connected to the floating diffusion FD and/or the VSS contact region 118 in the insulating region 212 of the semiconductor layer 200S. With this configuration, in the second substrate 200 forming the pixel circuit 210, it is possible to reduce the area of the insulating region 212 for forming the through-substrate wiring for connecting the floating diffusion FD to the pixel circuit 210. This makes it possible to ensure a large area of the second substrate 200 forming the pixel circuit 210. By ensuring the area of the pixel circuit 210, it is possible to form pixel transistors in large areas and contribute to image quality improvement by noise reduction and the like.

In particular, in a case where the FTI structure is used for the pixel isolation portion 117, it is preferable to provide the floating diffusion FD and/or the VSS contact region 118 in each of the pixels 541. Therefore, by using the configurations of the pad portions 120 and 121, it is possible to greatly decrease the wiring lines connecting the first substrate 100 and the second substrate 200 to each other.

Furthermore, as illustrated in FIG. 7B, for example, the pad portion 120 connected to the plurality of floating diffusions FD and the pad portion 121 connected to the plurality of VSS contact regions 118 are alternately arranged linearly in the V direction. Furthermore, the pad portions 120 and 121 are formed at positions surrounded by the plurality of photodiodes PD, the plurality of transfer gates TG, and the plurality of nodes of floating diffusion FD. This makes it possible to achieve flexible arrangement of elements other than the floating diffusion FD and the VSS contact region 118 on the first substrate 100 forming a plurality of elements, leading to higher efficiency of the layout of the entire chip. Furthermore, it is possible to achieve symmetry in the layout of the elements formed in each pixel sharing unit 539 and to suppress variations in characteristics of each pixel 541.

The pad portions 120 and 121 are each formed of polysilicon (Poly Si), for example, and more specifically, doped polysilicon doped with impurities. The pad portions 120 and 121 are preferably formed of a conductive material having high heat resistance, such as polysilicon, tungsten (W), titanium (Ti), or titanium nitride (TiN). This makes it possible to form the pixel circuit 210 after bonding the semiconductor layer 200S of the second substrate 200 to the first substrate 100. Hereinafter, the reason will be described. Note that, in the following description, a method of forming the pixel circuit 210 after bonding the first substrate 100 and the semiconductor layer 200S of the second substrate 200 is referred to as a first manufacturing method.

Here, there is another conceivable method of forming the pixel circuit 210 on the second substrate 200 and thereafter bonding the second substrate 200 to the first substrate 100 (hereinafter referred to as a second manufacturing method). In the second manufacturing method, an electrode for electrical connection is formed in advance on the front surface of the first substrate 100 (front surface of the wiring layer 100T) and the front surface of the second substrate 200 (front surface of the wiring layer 200T) individually. Simultaneously to the bonding of the first substrate 100 and the second substrate 200 to each other, the electrodes for electrical connection formed on the front surface of the first substrate 100 and the front surface of the second substrate 200 come into contact with each other. This leads to formation of an electrical connection between the wiring included in the first substrate 100 and the wiring included in the second substrate 200. Therefore, by adopting the configuration of the imaging device 1 using the second manufacturing method, for example, manufacturing can be performed using an appropriate process for the configuration of each of the first substrate 100 and the second substrate 200, leading to achievement of manufacture of a high-quality and high-performance imaging device.

When the first substrate 100 and the second substrate 200 are bonded to each other with such a second manufacturing method, an alignment error can occur due to a manufacturing device for bonding. In addition, when the first substrate 100 and the second substrate 200 are bonded to each other, with the first substrate 100 and the second substrate 200 each having the size about several tens of centimeters in diameter, for example, there is a possibility that expansion and contraction of the substrates occur in microscopic regions of the first substrate 100 and the second substrate 200. This expansion and contraction of the substrates is caused by a slight shift in the timing of contact between the substrates. Due to such expansion and contraction of the first substrate 100 and the second substrate 200, an error might occur in the positions of the electrodes for electrical connection formed on the front surface of the first substrate 100 and the front surface of the second substrate 200. In the second manufacturing method, it is preferable to take measures so that the electrodes of the first substrate 100 and the second substrate 200 come into contact with each other even with occurrence of such an error. Specifically, at least one, preferably both, of the electrodes of the first substrate 100 and the second substrate 200 can be formed to have a large size in consideration of the above error. Therefore, with the use of the second manufacturing method, for example, the size of the electrode formed on the front surface of the first substrate 100 or the second substrate 200 (the size in the substrate planar direction) is larger than the size of an internal electrode extending from the inside of the first substrate 100 or the second substrate 200 to the front surface in the thickness direction.

On the other hand, by forming the pad portions 120 and 121 using a heat-resistant conductive material, the first manufacturing method can be applied. In the first manufacturing method, the first substrate 100 including the photodiode PD, the transfer transistor TR, and the like is formed, and thereafter the first substrate 100 and the second substrate 200 (semiconductor layer 200S) are bonded to each other. At this time, the second substrate 200 is in a state in which patterns such as active elements and wiring layers constituting the pixel circuit 210 are not yet formed. Since the second substrate 200 is in a state before pattern formation, even if an error occurs in the bonding position when the first substrate 100 and the second substrate 200 are bonded together, this bonding error would not cause an error in alignment between the pattern of the first substrate 100 and the pattern of the second substrate 200. This is because the pattern of the second substrate 200 is to be formed after bonding of the first substrate 100 and the second substrate 200 to each other. At pattern formation on the second substrate, the pattern is to be formed, for example, on an exposure device for pattern formation, by using pattern formed on the first substrate as an alignment basis. For the above reason, the error in the bonding position between the first substrate 100 and the second substrate 200 does not cause a problem in manufacturing the imaging device 1 using the first manufacturing method. For similar reasons, an error caused by expansion and contraction of the substrate caused by the second manufacturing method would not cause a problem in manufacturing the imaging device 1 by the first manufacturing method.

In the first manufacturing method, after the first substrate 100 and the second substrate 200 (semiconductor layer 200S) are bonded to each other in this manner, active elements are formed on the second substrate 200. Thereafter, the through-substrate electrodes 120E and 121E and the through-substrate electrode TGV (FIG. 6) are formed. In the formation of the through-substrate electrodes 120E, 121E, and TGV, for example, patterns of the through-substrate electrodes are formed from above the second substrate 200 by reduction projection exposure using an exposure device. Since the reduction exposure projection is used, even if an error occurs in the alignment between the second substrate 200 and the exposure device, the magnitude of the error would be as small as a fraction of the error of the second manufacturing method (inverse of the reduction exposure projection magnification) in the second substrate 200. Therefore, by adopting the configuration of the imaging device 1 using the first manufacturing method, it is possible to facilitate alignment of elements formed on the first substrate 100 and the second substrate 200 with each other, leading to achievement of manufacturing a high-quality and high-performance imaging device.

The imaging device 1 manufactured using such a first manufacturing method has features different from the case of the imaging device manufactured by the second manufacturing method. Specifically, in the imaging device 1 manufactured by the first manufacturing method, the through-substrate electrodes 120E, 121E, and TGV have substantially constant thicknesses (sizes in the substrate planar direction) from the second substrate 200 to the first substrate 100, for example. Alternatively, when the through-substrate electrodes 120E, 121E, and TGV have tapered shapes, they have tapered shapes with a constant inclination. The imaging device 1 including such through-substrate electrodes 120E, 121E, and TGV has high applicability in miniaturization of the pixel 541.

Here, when the imaging device 1 is manufactured by the first manufacturing method, since active elements are formed on the second substrate 200 after the first substrate 100 and the second substrate 200 (semiconductor layer 200S) are bonded together, the first substrate 100 would be also affected by the heating process necessary for forming the active elements. Therefore, as described above, it is preferable to use a conductive material having high heat resistance for the pad portions 120 and 121 provided on the first substrate 100. For example, the pad portions 120 and 121 are preferably formed of a material having a higher melting point (that is, higher heat resistance) than at least a part of the wiring material included in the wiring layer 200T of the second substrate 200. For example, the pad portions 120 and 121 are formed by using a conductive material having high heat resistance, such as doped polysilicon, tungsten, titanium, and titanium nitride. With this configuration, the imaging device 1 can be manufactured using the first manufacturing method described above.

The passivation film 122 is provided over the entire front surface of the semiconductor layer 100S so as to cover the pad portions 120 and 121, for example (FIG. 6). The passivation film 122 is formed of a silicon nitride (SiN) film, for example. The interlayer insulating film 123 covers the pad portions 120 and 121 with the passivation film 122 interposed therebetween. The interlayer insulating film 123 is provided over the entire front surface of the semiconductor layer 100S, for example. The interlayer insulating film 123 is formed of a silicon oxide (SiO) film, for example. The bonding film 124 is provided on a bonding surface between the first substrate 100 (specifically, the wiring layer 100T) and the second substrate 200. That is, the bonding film 124 is in contact with the second substrate 200. The bonding film 124 is provided over the entire main surface of the first substrate 100. The bonding film 124 is formed of a silicon nitride film, for example.

The light receiving lens 401 faces the semiconductor layer 100S with the fixed charge film 112 and the insulating film 111 interposed therebetween, for example (FIG. 6). The light receiving lens 401 is provided, for example, at a position facing the photodiode PD of each of the pixels 541A, 541B, 541C, and 541D.

The second substrate 200 includes a semiconductor layer 200S and a wiring layer 200T in this order from the first substrate 100 side. The semiconductor layer 200S is formed of a silicon substrate. In the semiconductor layer 200S, a well region 211 is provided over the thickness direction. The well region 211 is, for example, a p type semiconductor region. A second substrate portion 20 is provided with the pixel circuit 210 disposed for each of the pixel sharing units 539. The pixel circuit 210 is provided on the front surface side (wiring layer 200T side) of the semiconductor layer 200S, for example. In the imaging device 1, the second substrate 200 is bonded to the first substrate 100 such that the back surface side (semiconductor layer 200S side) of the second substrate 200 faces the front surface side (wiring layer 100T side) of the first substrate 100. That is, the second substrate 200 is bonded to the first substrate 100 in a face-to-back bonding.

Figure 8:
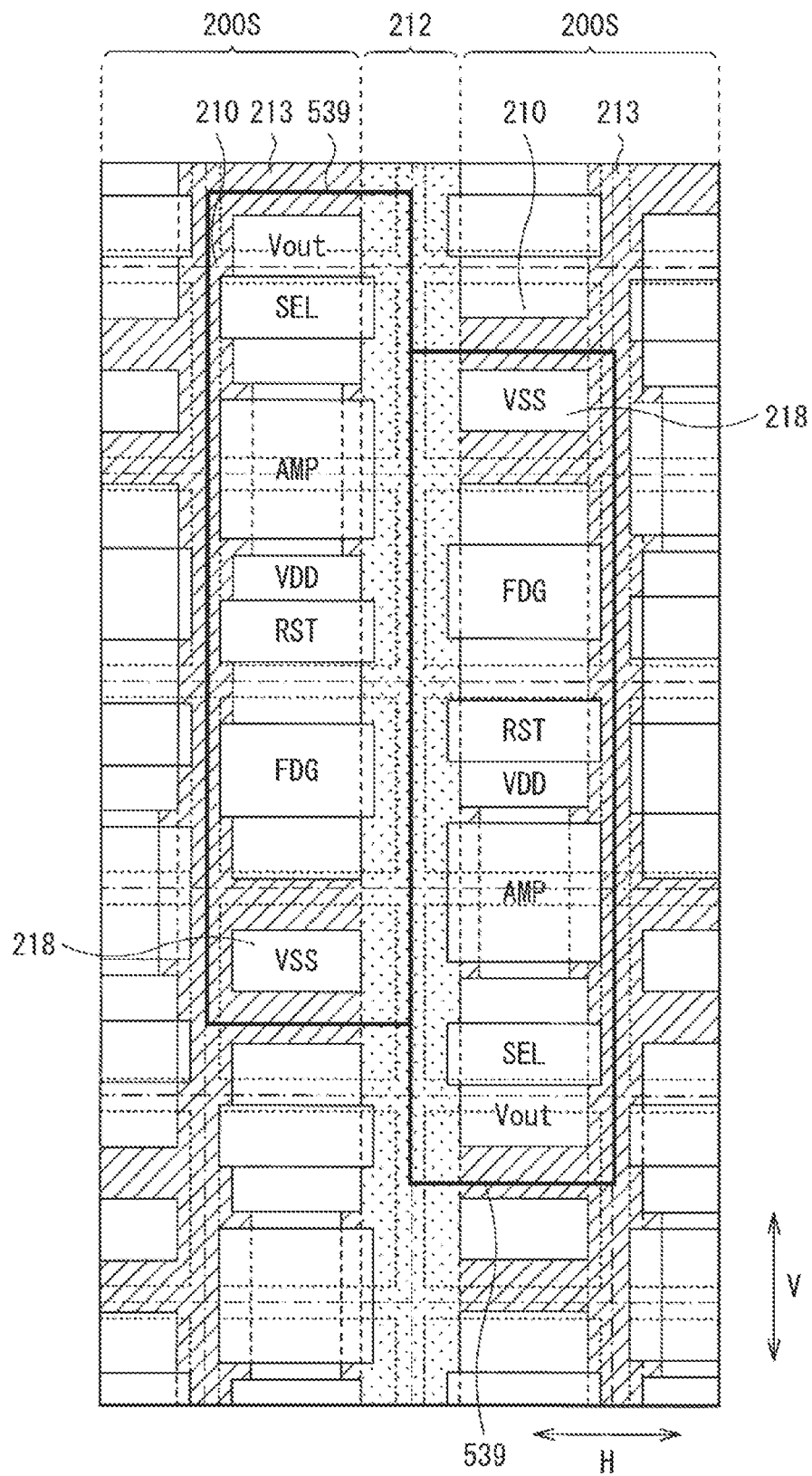
FIG. 8 is a schematic diagram illustrating an example of a planar configuration of a second substrate (semiconductor layer) illustrated in FIG. 6.
Figure 9:
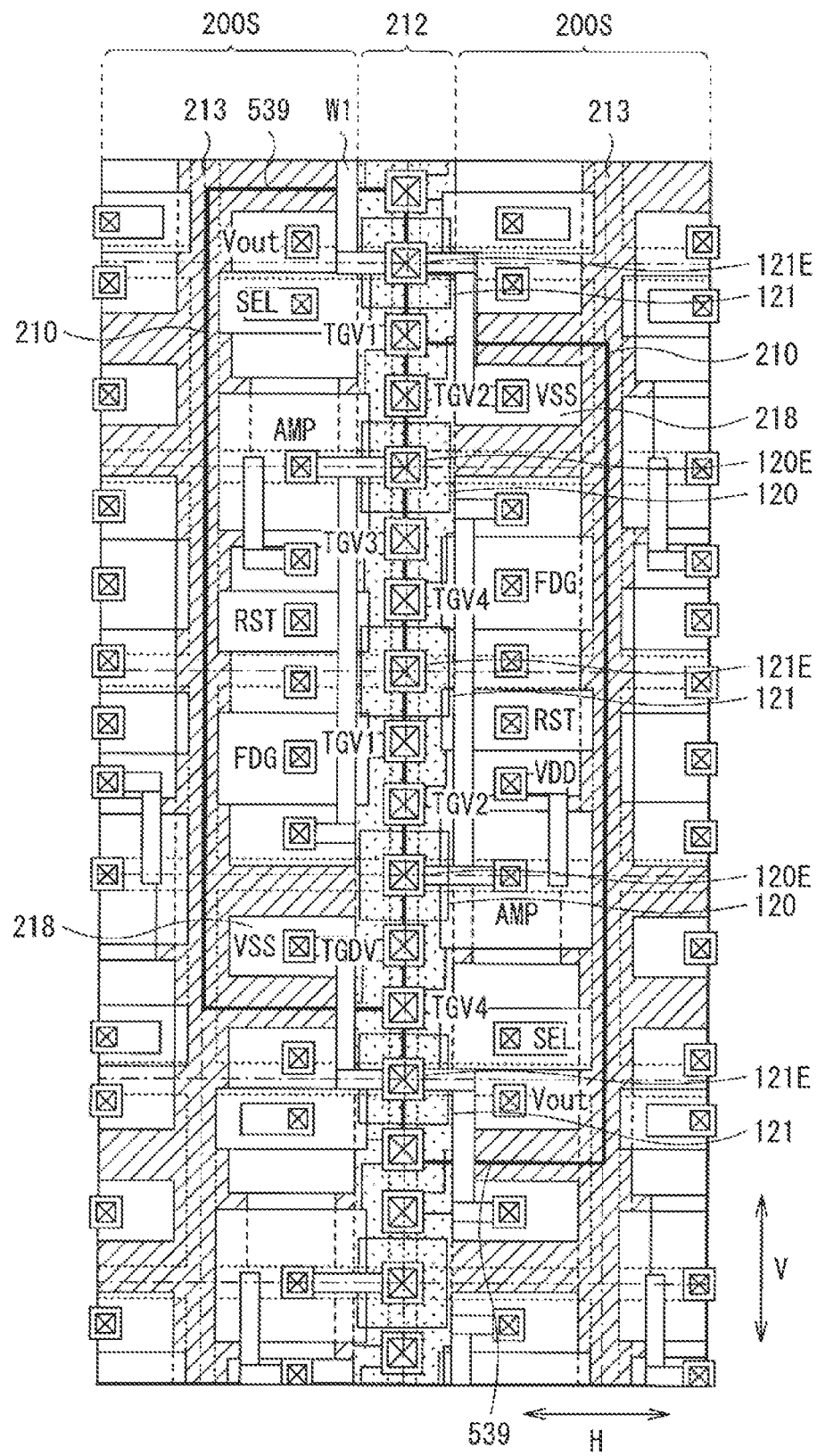
FIG. 9 is a schematic diagram illustrating an example of a planar configuration of a main part of a pixel circuit and the first substrate together with a first wiring layer illustrated in FIG. 6.
Figure 10:
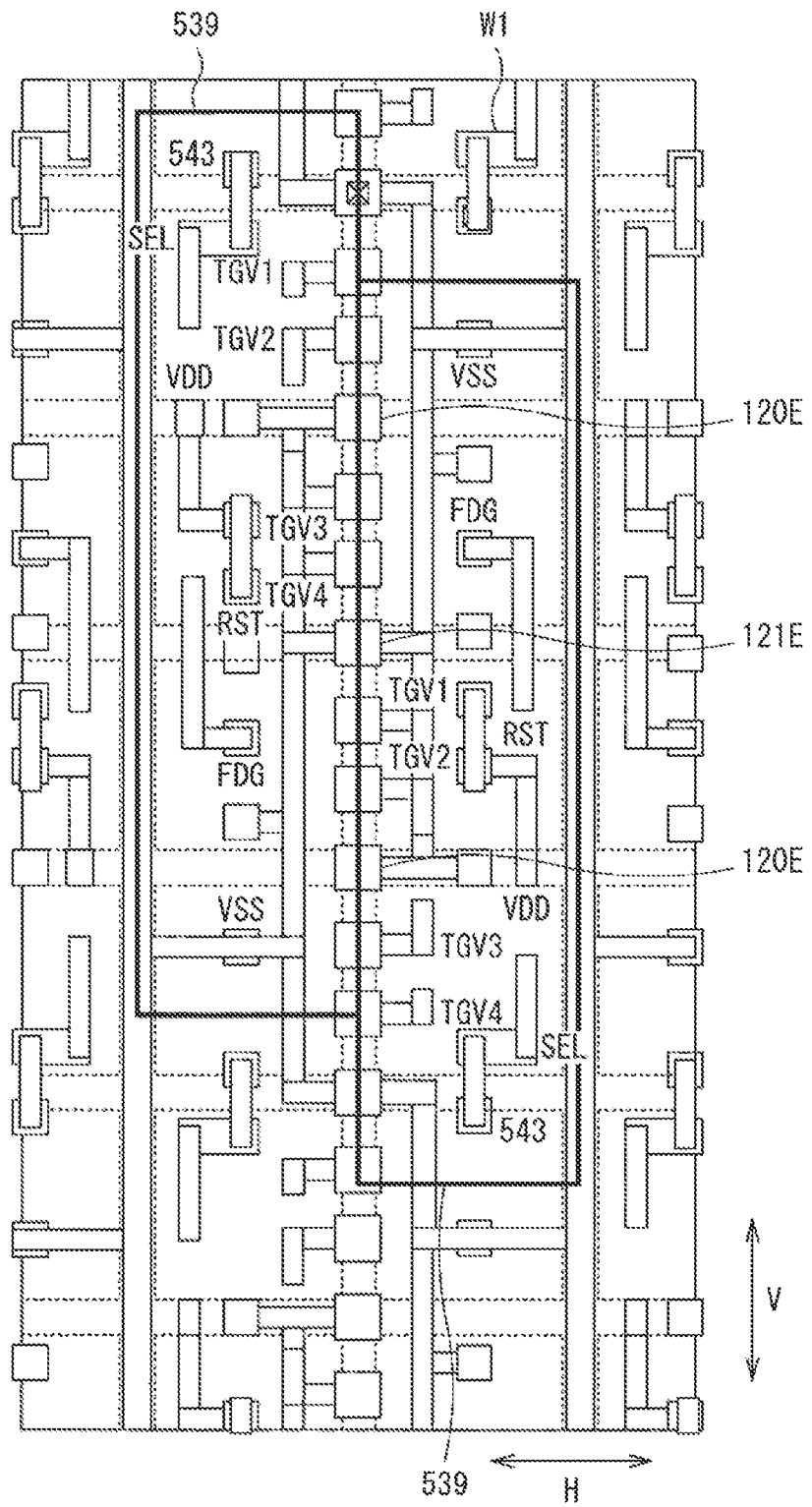
FIG. 10 is a schematic diagram illustrating an example of a planar configuration of the first wiring layer and a second wiring layer illustrated in FIG. 6.
Figure 11:
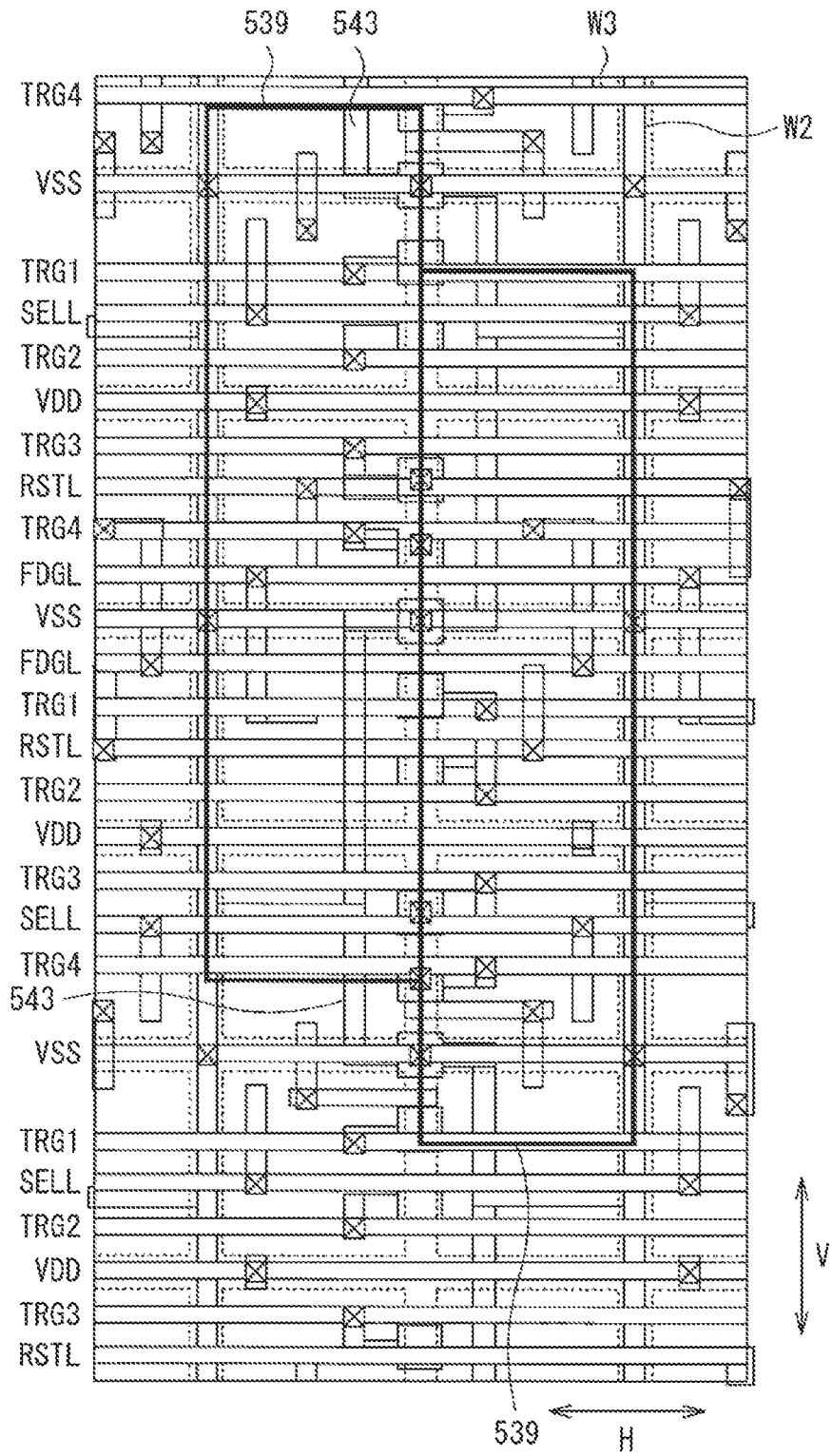
FIG. 11 is a schematic diagram illustrating an example of a planar configuration of the second wiring layer and a third wiring layer illustrated in FIG. 6.
Figure 12:
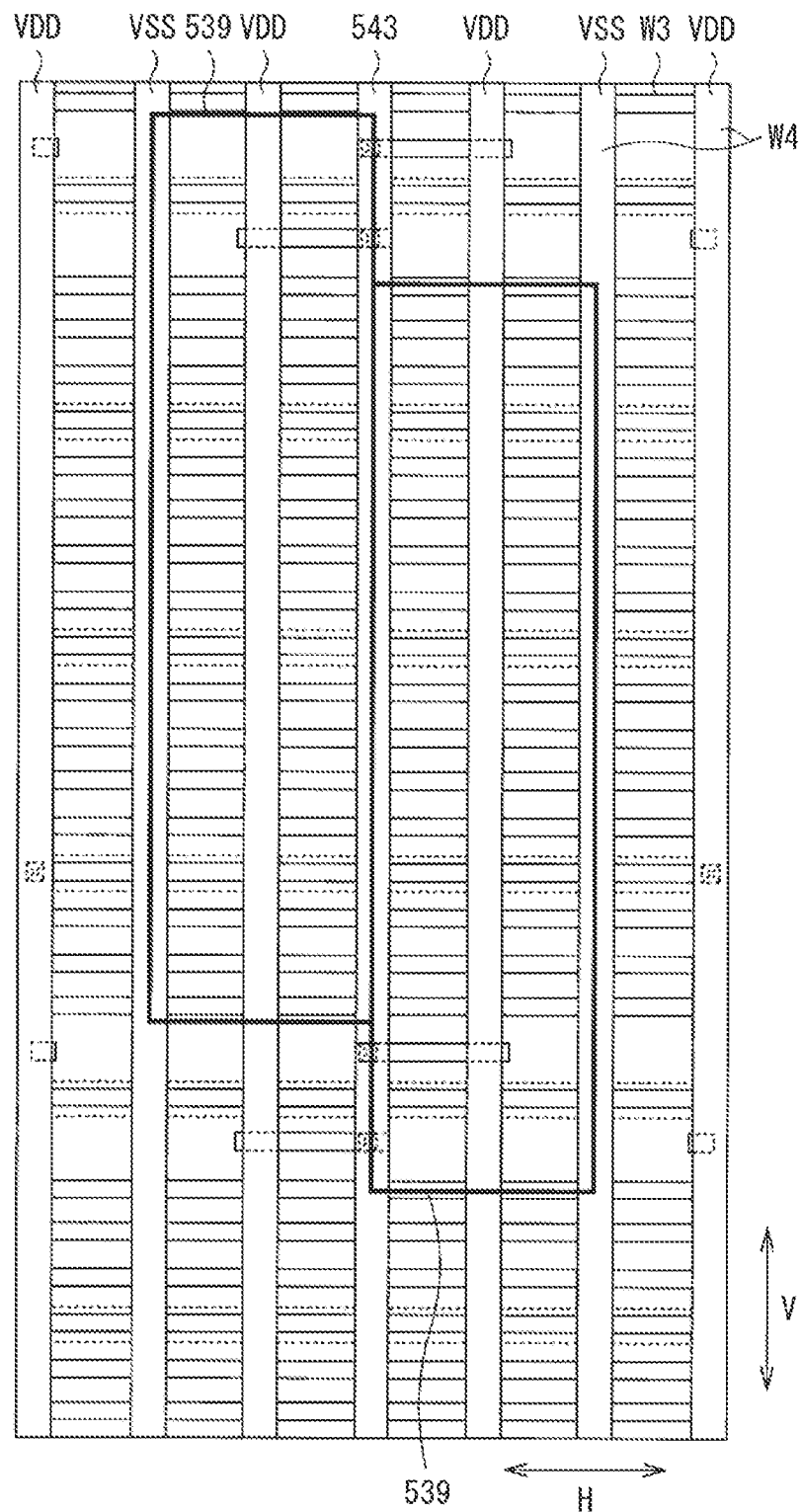
FIG. 12 is a schematic diagram illustrating an example of a planar configuration of the third wiring layer and a fourth wiring layer illustrated in FIG. 6.

FIGS. 8 to 12 schematically illustrate an example of a planar configuration of the second substrate 200. FIG. 8 illustrates a configuration of the pixel circuit 210 provided in the vicinity of the front surface of the semiconductor layer 200S. FIG. 9 schematically illustrates a configuration of individual parts of the wiring layer 200T (specifically, a first wiring layer W1 to be described below), the semiconductor layer 200S connected to the wiring layer 200T, and the first substrate 100. FIGS. 10 to 12 illustrate an example of a planar configuration of the wiring layer 200T. Hereinafter, the configuration of the second substrate 200 will be described with reference to FIGS. 8 to 12 together with FIG. 6. In FIGS. 8 and 9, the outer shape of the photodiode PD (boundary between the pixel isolation portion 117 and the photodiode PD) is indicated by a broken line, and a boundary between the semiconductor layer 200S and an element isolation region 213 or an insulating region 214 in a portion overlapping the gate electrode of each of transistors constituting the pixel circuit 210 is indicated by a dotted line. A portion overlapping the gate electrode of the amplification transistor AMP has a boundary between the semiconductor layer 200S and the element isolation region 213 and a boundary between the element isolation region 213 and the insulating region 212 on one side in a channel width direction.

The second substrate 200 includes: the insulating region 212 that divides the semiconductor layer 200S; and the element isolation region 213 provided in a part of the semiconductor layer 200S in the thickness direction (FIG. 6). For example, the through-substrate electrodes 120E and 121E and the through-substrate electrodes TGV (through-substrate electrodes TGV1, TGV2, TGV3, and TGV4) of the two pixel sharing units 539 connected to two pixel circuits 210 adjacent in the H direction are arranged in the insulating region 212 provided between the two pixel circuits 210 (FIG. 9).

The insulating region 212 has substantially the same thickness as the thickness of the semiconductor layer 200S (FIG. 6). The semiconductor layer 200S is divided by the insulating region 212. The through-substrate electrodes 120E and 121E and the through-substrate electrode TGV are disposed in the insulating region 212. The insulating region 212 is formed of silicon oxide, for example.

The through-substrate electrodes 120E and 121E are provided to penetrate the insulating region 212 in the thickness direction. The upper ends of the through-substrate electrodes 120E and 121E are connected to wiring (first wiring layer W1, second wiring layer W2, third wiring layer W3, and fourth wiring layer W4 to be described below) of the wiring layer 200T. The through-substrate electrodes 120E and 121E are provided to penetrate the insulating region 212, the bonding film 124, the interlayer insulating film 123, and the passivation film 122, and the lower ends of the electrodes are connected to the pad portions 120 and 121, respectively (FIG. 6). The through-substrate electrode 120E is provided to electrically connect the pad portion 120 and the pixel circuit 210 to each other. That is, the floating diffusion FD of the first substrate 100 is electrically connected to the pixel circuit 210 of the second substrate 200 by the through-substrate electrode 120E. The through-substrate electrode 121E is provided for electrically connecting the pad portion 121 and the reference potential line VSS of the wiring layer 200T to each other. That is, the VSS contact region 118 of the first substrate 100 is electrically connected to the reference potential line VSS of the second substrate 200 by the through-substrate electrode 121E.

The through-substrate electrode TGV is provided to penetrate the insulating region 212 in the thickness direction. The upper end of the through-substrate electrode TGV is connected to the wiring of the wiring layer 200T. The through-substrate electrode TGV is provided to penetrate the insulating region 212, the bonding film 124, the interlayer insulating film 123, the passivation film 122, and the interlayer insulating film 119, and the lower end thereof is connected to the transfer gate TG (FIG. 6). Such a through-substrate electrode TGV is provided for electrically connecting the transfer gate TG (transfer gates TG1, TG2, TG3, and TG4) of each of the corresponding pixels 541A, 541B, 541C, and 541D to the wiring of the wiring layer 200T (part of the row drive signal line 542, specifically, wiring lines TRG1, TRG2, TRG3, and TRG4 in FIG. 11 to be described below). That is, by the through-substrate electrode TGV, the transfer gate TG of the first substrate 100 is electrically connected to the wiring TRG of the second substrate 200 and a drive signal is sent to each of the transfer transistors TR (transfer transistors TR1, TR2, TR3, and TR4).

The insulating region 212 is a region for insulating, from the semiconductor layer 200S, the through-substrate electrodes 120E and 121E and the through-substrate electrode TGV for electrically connecting the first substrate 100 and the second substrate 200 to each other. For example, the through-substrate electrodes 120E and 121E and the through-substrate electrodes TGV (through-substrate electrodes TGV1, TGV2, TGV3, and TGV4) connected to two pixel circuits 210 (pixel sharing unit 539) adjacent in the H direction are disposed in the insulating region 212 provided between the two pixel circuits 210. The insulating region 212 is provided to extend in the V direction, for example (FIGS. 8 and 9). Here, by appropriately arranging the horizontal portion TGb of the transfer gate TG, the through-substrate electrode TGV is disposed such that the position of the through-substrate electrode TGV in the H direction approaches the positions of the through-substrate electrodes 120E and 121E in the H direction as compared with the position of the vertical portion TGa (FIGS. 7A and 9). For example, the through-substrate electrode TGV is disposed at substantially the same position as the through-substrate electrodes 120E and 120E in the H direction. With this configuration, the through-substrate electrodes 120E and 121E and the through-substrate electrode TGV can be collectively arranged in the insulating region 212 extending in the V direction. As another arrangement example, it is also conceivable to provide the horizontal portion TGb only in a region overlapping the vertical portion TGa. In this case, the through-substrate electrode TGV would be formed substantially immediately above the vertical portion TGa, and for example, the through-substrate electrode TGV is disposed substantially at the central portion in the H direction and the V direction of each of the pixels 541. At this time, the position of the through-substrate electrode TGV in the H direction greatly deviates from the positions of the through-substrate electrodes 120E and 121E in the H direction. For example, the insulating region 212 is provided around the through-substrate electrode TGV and the through-substrate electrodes 120E and 121E in order to electrically insulate these through-substrate electrodes from the semiconductor layer 200S close to the electrodes. When the position of the through-substrate electrode TGV in the H direction and the positions of the through-substrate electrodes 120E and 121E in the H direction are greatly separated from each other, it would be necessary to provide the insulating region 212 independently around each of the through-substrate electrodes 120E, 121E, and TGV. This configuration would divide the semiconductor layer 200S into a number of pieces. In comparison, the layout in which the through-substrate electrodes 120E and 121E and the through-substrate electrode TGV are collectively arranged in the insulating region 212 extending in the V direction can obtain a sufficiently large size of the semiconductor layer 200S in the H direction. This makes it possible to ensure a large area of the semiconductor element formation region in the semiconductor layer 200S. This configuration makes it possible to increase the size of the amplification transistor AMP and suppress noise, for example.

As described with reference to FIG. 4, the pixel sharing unit 539 has a structure in which the floating diffusion FD provided in each of the plurality of pixels 541 is electrically connected, and the plurality of pixels 541 shares one pixel circuit 210. The floating diffusion FD is electrically connected to each other by the pad portion 120 provided on the first substrate 100 (FIGS. 6 and 7B). The electrical connection portion (pad portion 120) provided on the first substrate 100 and the pixel circuit 210 provided on the second substrate 200 are electrically connected via one through-substrate electrode 120E. In another conceivable structure example, an electrical connection portion between the floating diffusions FD can be provided on the second substrate 200. In this case, the pixel sharing unit 539 is provided with four through-substrate electrodes connected to the floating diffusions FD1, FD2, FD3, and FD4, respectively. This would result in, in the second substrate 200, the increased number of through-substrate electrodes penetrating the semiconductor layer 200S and enlargement of the insulating region 212 that insulates the surroundings of these through-substrate electrodes. In comparison, in the structure in which the pad portion 120 is provided on the first substrate 100 (FIGS. 6 and 7B), it is possible to achieve reduction in the number of through-substrate electrodes and downsizing of the insulating region 212. This makes it possible to ensure a large area of the semiconductor element formation region in the semiconductor layer 200S. This configuration makes it possible to increase the size of the amplification transistor AMP and suppress noise, for example.

The element isolation region 213 is provided on the front surface side of the semiconductor layer 200S. The element isolation region 213 has a shallow trench isolation (STI) structure. In the element isolation region 213, the semiconductor layer 200S is dug in the thickness direction (direction perpendicular to the main surface of the second substrate 200), and an insulating film is buried in the dug portion. This insulating film is formed of silicon oxide, for example. The element isolation region 213 isolates the plurality of elements, namely, transistors constituting the pixel circuit 210 from each other in accordance with the layout of the pixel circuit 210. The semiconductor layer 200S (specifically, well region 211) extends below the element isolation region 213 (deep portion of the semiconductor layer 200S).

Here, with reference to FIGS. 7A, 7B, and 8, a difference between the outer shape (outer shape in the substrate planar direction) of the pixel sharing unit 539 on the first substrate 100 and the outer shape of the pixel sharing unit 539 on the second substrate 200 will be described.

In the imaging device 1, the pixel sharing unit 539 is provided over both the first substrate 100 and the second substrate 200. For example, the outer shape of the pixel sharing unit 539 provided on the first substrate 100 is different from the outer shape of the pixel sharing unit 539 provided on the second substrate 200.

In FIGS. 7A and 7B, the outline of the pixels 541A, 541B, 541C, and 541D is represented by a one-dot chain line, and the outer shape of the pixel sharing unit 539 is represented by a thick line. For example, the pixel sharing unit 539 of the first substrate 100 is formed with two pixels 541 (pixels 541A and 541B) disposed adjacent to each other in the H direction and two pixels 541 (pixels 541C and 541D) disposed adjacent to each other in the V direction. That is, the pixel sharing unit 539 of the first substrate 100 includes four pixels 541 in adjacent 2 rows×2 columns, giving the pixel sharing unit 539 of the first substrate 100 a substantially square outer shape. In the pixel array unit 540, such pixel sharing units 539 are arranged adjacent to each other at a pitch of two pixels (pitch corresponding to two pixels 541) in the H direction and a pitch of two pixels (pitch corresponding to two pixels 541) in the V direction.

In FIGS. 8 and 9, the outline of the pixels 541A, 541B, 541C, and 541D is represented by a one-dot chain line, and the outer shape of the pixel sharing unit 539 is represented by a thick line. For example, the outer shape of the pixel sharing unit 539 of the second substrate 200 is smaller than the pixel sharing unit 539 of the first substrate 100 in the H direction and larger than the pixel sharing unit 539 of the first substrate 100 in the V direction. For example, the pixel sharing unit 539 of the second substrate 200 is formed in a size (region) corresponding to one pixel in the H direction, and is formed in a size corresponding to four pixels in the V direction. That is, the pixel sharing unit 539 of the second substrate 200 is formed in a size corresponding to the pixels arranged in adjacent 1 row×4 columns, giving the pixel sharing unit 539 of the second substrate 200 a substantially rectangular outer shape.

For example, in each of the pixel circuits 210, the selection transistor SEL, the amplification transistor AMP, the reset transistor RST, and the FD conversion gain switching transistor FDG are arranged in this order in the V direction (FIG. 8). By providing the outer shape of each pixel circuit 210 in a substantially rectangular shape as described above, it is possible to arrange four transistors (selection transistor SEL, amplification transistor AMP, reset transistor RST, and FD conversion gain switching transistor FDG) side by side in one direction (V direction in FIG. 8). With this configuration, the drain of the amplification transistor AMP and the drain of the reset transistor RST can be shared by one diffusion region (diffusion region connected to the power supply line VDD). For example, the formation region of each of the pixel circuits 210 can be provided in a substantially square shape (refer to FIG. 21 described below). In this case, two transistors are arranged in one direction, making it difficult to share the drain of the amplification transistor AMP and the drain of the reset transistor RST in one diffusion region. Therefore, the formation region of the pixel circuit 210 provided in a substantially rectangular shape can facilitate arrangement of the four transistors so as to be close to each other, making it possible to downsize the formation region of the pixel circuit 210. This achieves miniaturization of the pixels. Furthermore, when there is no need to reduce the formation region of the pixel circuit 210, the formation region of the amplification transistor AMP can be increased to suppress noise.

For example, in the vicinity of the front surface of the semiconductor layer 200S, a VSS contact region 218 connected to the reference potential line VSS is provided in addition to the selection transistor SEL, the amplification transistor AMP, the reset transistor RST, and the FD conversion gain switching transistor FDG. The VSS contact region 218 is formed with a p type semiconductor region, for example. The VSS contact region 218 is electrically connected to the VSS contact region 118 of the first substrate 100 (semiconductor layer 100S) via the wiring of the wiring layer 200T and the through-substrate electrode 121E. The VSS contact region 218 is provided at a position adjacent to the source of the FD conversion gain switching transistor FDG with the element isolation region 213 interposed therebetween, for example (FIG. 8).

Next, a positional relationship between the pixel sharing unit 539 provided on the first substrate 100 and the pixel sharing unit 539 provided on the second substrate 200 will be described with reference to FIGS. 7B and 8. For example, one pixel sharing unit 539 (for example, one on the upper side of FIG. 7B) out of the two pixel sharing units 539 aligned in the V direction on the first substrate 100 is connected to one pixel sharing unit 539 (for example, one on the left side of FIG. 8) out of the two pixel sharing units 539 arranged in the H direction on the second substrate 200. For example, the other pixel sharing unit 539 (for example, one on the lower side of FIG. 7B) out of the two pixel sharing units 539 aligned in the V direction on the first substrate 100 is connected to the other pixel sharing unit 539 (for example, one on the right side of FIG. 8) out of the two pixel sharing units 539 aligned in the H direction on the second substrate 200.

For example, in the two pixel sharing units 539 aligned in the H direction of the second substrate 200, the internal layout (arrangement of transistors and the like) of one pixel sharing unit 539 is substantially equal to the layout obtained by inverting the internal layout of the other pixel sharing unit 539 in the V direction and the H direction. Hereinafter, effects obtained by this layout will be described.

In the two pixel sharing units 539 aligned in the V direction of the first substrate 100, each of the pad portions 120 is disposed at the central portion of the outer shape of the pixel sharing unit 539, that is, at the central portion in the V direction and the H direction of the pixel sharing unit 539 (FIG. 7B). On the other hand, the pixel sharing unit 539 of the second substrate 200 has a substantially rectangular outer shape long in the V direction as described above, and therefore, the amplification transistor AMP connected to the pad portion 120 is disposed at a position shifted upward in the drawing from the center of the pixel sharing unit 539 in the V direction, for example. For example, when the two pixel sharing units 539 aligned in the H direction of the second substrate 200 have the same internal layout, the distance between the amplification transistor AMP of one pixel sharing unit 539 and the pad portion 120 (for example, the pad portion 120 of the pixel sharing unit 539 on the upper side of FIGS. 7A and 7B) becomes relatively short. However, the distance between the amplification transistor AMP of the other pixel sharing unit 539 and the pad portion 120 (for example, the pad portion 120 of the pixel sharing unit

539 on the lower side of FIGS. 7A and 7B) becomes long. This increases the area of the wiring required for connecting the amplification transistor AMP and the pad portion 120, leading to a concern of a complicated wiring layout of the pixel sharing unit 539. This might affect miniaturization of the imaging device 1.

In contrast, by inverting the internal layout of the two pixel sharing units 539 aligned in the H direction of the second substrate 200 at least in the V direction, it is possible to shorten the distance between the amplification transistor AMP and the pad portion 120 of both of the two pixel sharing units 539. This facilitates miniaturization of the imaging device 1 as compared with the configuration in which the two pixel sharing units 539 aligned in the H direction of the second substrate 200 have the same internal layout. Although the planar layout of each of the plurality of pixel sharing units 539 of the second substrate 200 is bilaterally symmetrical in the range illustrated in FIG. 8, the layout is bilaterally asymmetrical when including the layout of the first wiring layer W1 illustrated in FIG. 9 described below.

Furthermore, it is preferable that the internal layouts of the two pixel sharing units 539 aligned in the H direction of the second substrate 200 are also inverted in the H direction. Hereinafter, the reason will be described. As illustrated in FIG. 9, each of the two pixel sharing units 539 aligned in the H direction on the second substrate 200 is connected to each of the pad portions 120 and 121 of the first substrate 100. For example, the pad portions 120 and 121 are disposed at the central portion in the H direction (between the two pixel sharing units 539 aligned in the H direction) of the two pixel sharing units 539 aligned in the H direction on the second substrate 200. Therefore, by inverting the internal layouts of the two pixel sharing units 539 aligned in the H direction of the second substrate 200 also in the H direction, it is possible to reduce the distance between each of the plurality of pixel sharing units 539 of the second substrate 200 and each of the pad portions 120 and 121. This makes it further easier to miniaturize the imaging device 1.

Furthermore, the position of the outline of the pixel sharing unit 539 of the second substrate 200 does not have to be aligned with the position of any of the outlines of the pixel sharing units 539 of the first substrate 100. For example, in one pixel sharing unit 539 (for example, the one on the left side of FIG. 9) out of the two pixel sharing units 539 aligned in the H direction on the second substrate 200, one outline (for example, one on the upper side of FIG. 9) in the V direction is arranged outside of one outline in the V direction of the pixel sharing unit 539 (for example, one on the upper side of FIG. 7B) of the corresponding first substrate 100. Furthermore, in the other pixel sharing unit 539 (for example, the one on the right side of FIG. 9) out of the two pixel sharing units 539 aligned in the H direction on the second substrate 200, the other outline (for example, one on the lower side of FIG. 9) in the V direction is arranged outside of the other outline in the V direction of the pixel sharing unit 539 (for example, one on the lower side of FIG. 7B) of the corresponding first substrate 100. In this manner, by arranging the pixel sharing unit 539 of the second substrate 200 and the pixel sharing unit 539 of the first substrate 100 to correspond to each other, it is possible to shorten the distance between the amplification transistor AMP and the pad portion 120. This facilitates miniaturization of the imaging device 1.

Furthermore, the positions of the outlines of the plurality of pixel sharing units 539 of the second substrate 200 do not need to be aligned. For example, the two pixel sharing units 539 aligned in the H direction of the second substrate 200 are arranged such that their outline positions in the V direction are shifted from each other. This configuration makes it possible to shorten the distance between the amplification transistor AMP and the pad portion 120. This facilitates miniaturization of the imaging device 1.

The repeated arrangement of the pixel sharing units 539 in the pixel array unit 540 will be described with reference to FIGS. 7B and 9. The pixel sharing unit 539 of the first substrate 100 has the size of two pixels 541 in the H direction and the size of two pixels 541 in the V direction (FIG. 7B). For example, in the pixel array unit 540 of the first substrate 100, the pixel sharing unit 539 having the size corresponding to the four pixels 541 is repeatedly arranged adjacent to each other at a pitch of two pixels in the H direction (a pitch corresponding to two pixels 541) and at a pitch of two pixels in the V direction (a pitch corresponding to two pixels 541). Alternatively, the pixel array unit 540 of the first substrate 100 may include a pair of pixel sharing units 539 in which two pixel sharing units 539 are arranged adjacent to each other in the V direction. In the pixel array unit 540 of the first substrate 100, for example, the pair of pixel sharing units 539 adjacent to each other is repeatedly arranged at a pitch of two pixels in the H direction (a pitch corresponding to two pixels 541) and at a pitch of four pixels in the V direction (a pitch corresponding to four pixels 541). The pixel sharing unit 539 of the second substrate 200 has the size of one pixel 541 in the H direction and the size of four pixels 541 in the V direction (FIG. 9). For example, the pixel array unit 540 of the second substrate 200 includes a pair of pixel sharing units 539 including two pixel sharing units 539 having a size corresponding to the four pixels 541. The pixel sharing units 539 are arranged adjacent to each other in the H direction and are arranged to be shifted from each other in the V direction. In the pixel array unit 540 of the second substrate 200, for example, the pair of pixel sharing units 539 adjacent to each other is repeatedly arranged without a gap at a pitch of two pixels in the H direction (a pitch corresponding to two pixels 541) and at a pitch of four pixels in the V direction (a pitch corresponding to four pixels 541). Such repetitive arrangement of the pixel sharing units 539 enables the pixel sharing units 539 to be arranged without any gap. This facilitates miniaturization of the imaging device 1.

The amplification transistor AMP preferably has a three-dimensional structure such as a Fin-shaped transistor, for example (FIG. 6). This can increase the effective gate width, making it possible to suppress noise. The selection transistor SEL, the reset transistor RST, and the FD conversion gain switching transistor FDG have, for example, a planar structure. The amplification transistor AMP may have a planar structure. Alternatively, the selection transistor SEL, the reset transistor RST, or the FD conversion gain switching transistor FDG may have a three-dimensional structure.

The wiring layer 200T includes, for example, a passivation film 221, an interlayer insulating film 222, and a plurality of wiring layers (a first wiring layer W1, a second wiring layer W2, a third wiring layer W3, and a fourth wiring layer W4). The passivation film 221 is in contact with the front surface of the semiconductor layer 200S and covers the entire front surface of the semiconductor layer 200S, for example. The passivation film 221 covers the gate electrodes of the selection transistor SEL, the amplification transistor AMP, the reset transistor RST, and the FD conversion gain switching transistor FDG. The interlayer insulating film 222 is provided between the passivation film 221 and the third substrate 300. The interlayer insulating film 222 isolates the plurality of wiring layers (first wiring layer W1, second wiring layer W2, third wiring layer W3, and fourth wiring layer W4) from each other. The interlayer insulating film 222 is formed of silicon oxide, for example.

The wiring layer 200T includes, for example, from the semiconductor layer 200S side, a first wiring layer W1, a second wiring layer W2, a third wiring layer W3, a fourth wiring layer W4, and the contact portions 201 and 202 in this order, and these portions are insulated from each other by the interlayer insulating film 222. The interlayer insulating film 222 includes a plurality of connection portions that connect the first wiring layer W1, the second wiring layer W2, the third wiring layer W3 or the fourth wiring layer W4 with their lower layers. The connection portion is a portion formed by embedding a conductive material in a connection hole provided in the interlayer insulating film 222. For example, the interlayer insulating film 222 includes a connection portion 218V that connects the first wiring layer W1 and the VSS contact region 218 of the semiconductor layer 200S. For example, the hole diameter of the connection portion connecting the elements of the second substrate 200 is different from the hole diameters of the through-substrate electrodes 120E and 121E and the through-substrate electrode TGV. Specifically, the hole diameter of the connection hole connecting the elements of the second substrate 200 is preferably smaller than the hole diameters of the through-substrate electrodes 120E and 121E and the through-substrate electrode TGV. Hereinafter, the reason will be described. The depth of the connection portion provided in the wiring layer 200T (the connection portion 218V or the like) is smaller than the depths of the through-substrate electrodes 120E and 121E and the through-substrate electrode TGV. Therefore, the connection portion can easily fill the conductive material in the connection hole as compared with the through-substrate electrodes 120E and 121E and the through-substrate electrode TGV. By forming the hole diameter of the connection portion smaller than the hole diameters of the through-substrate electrodes 120E and 121E and the through-substrate electrode TGV, it is possible to facilitate miniaturization of the imaging device 1.

For example, the through-substrate electrode 120E is connected to the gate of the amplification transistor AMP and the source of the FD conversion gain switching transistor FDG (specifically, a connection hole reaching the source of the FD conversion gain switching transistor FDG) by the first wiring layer W1. The first wiring layer W1 connects the through-substrate electrode 121E and the connection portion 218V to each other, for example, enabling electrical connection between the VSS contact region 218 of the semiconductor layer 200S and the VSS contact region 118 of the semiconductor layer 100S.

Next, a planar configuration of the wiring layer 200T will be described with reference to FIGS. 10 to 12. FIG. 10 illustrates an example of a planar configuration of the first wiring layer W1 and the second wiring layer W2. FIG. 11 illustrates an example of a planar configuration of the second wiring layer W2 and the third wiring layer W3. FIG. 12 illustrates an example of a planar configuration of the third wiring layer W3 and the fourth wiring layer W4.

For example, the third wiring layer W3 includes wiring lines TRG1, TRG2, TRG3, TRG4, SELL, RSTL, and FDGL extending in the H direction (row direction) (FIG. 11). These wiring lines correspond to the plurality of row drive signal lines 542 described with reference to FIG. 4. The wiring lines TRG1, TRG2, TRG3, and TRG4 are provided for sending drive signals to the transfer gates TG1, TG2, TG3, and TG4, respectively. The wiring lines TRG1, TRG2, TRG3, and TRG4 are respectively connected to the transfer gates TG1, TG2, TG3, and TG4 via the second wiring layer W2, the first wiring layer W1, and the through-substrate electrode 120E. The wiring line SELL is provided for sending a drive signal to the gate of the selection transistor SEL, the wiring line RSTL is provided for sending a drive signal to the gate of the reset transistor RST, and the wiring line FDGL is provided for sending a drive signal to the gate of the FD conversion gain switching transistor FDG. The wiring lines SELL, RSTL, and FDGL are connected to the gates of the selection transistor SEL, the reset transistor RST, and the FD conversion gain switching transistor FDG via the second wiring layer W2, the first wiring layer W1, and the connection portion, respectively.

For example, the fourth wiring layer W4 includes a power supply line VDD, a reference potential line VSS, and a vertical signal line 543 extending in the V direction (column direction) (FIG. 12). The power supply line VDD is connected to the drain of the amplification transistor AMP and the drain of the reset transistor RST via the third wiring layer W3, the second wiring layer W2, the first wiring layer W1, and the connection portion. The reference potential line VSS is connected to the VSS contact region 218 via the third wiring layer W3, the second wiring layer W2, the first wiring layer W1, and the connection portion 218V. In addition, the reference potential line VSS is connected to the VSS contact region 118 of the first substrate 100 via the third wiring layer W3, the second wiring layer W2, the first wiring layer W1, the through-substrate electrode 121E, and the pad portion 121. The vertical signal line 543 is connected to the source (Vout) of the selection transistor SEL via the third wiring layer W3, the second wiring layer W2, the first wiring layer W1, and the connection portion.

The contact portions 201 and 202 may be provided at a position overlapping the pixel array unit 540 in plan view (for example, FIG. 3), or may be provided in the peripheral portion 540B outside the pixel array unit 540 (for example, FIG. 6). The contact portions 201 and 202 are provided on the front surface (surface on the wiring layer 200T side) of the second substrate 200. The contact portions 201 and 202 are formed of metal such as copper (Cu) and aluminum (Al), for example. The contact portions 201 and 202 are exposed on the front surface (surface on the third substrate 300 side) of the wiring layer 200T. The contact portions 201 and 202 are used for electrical connection between the second substrate 200 and the third substrate 300 and bonding between the second substrate 200 and the third substrate 300.

FIG. 6 illustrates an example in which a peripheral circuit is provided in the peripheral portion 540B of the second substrate 200. This peripheral circuit may include a part of the row drive unit 520, a part of the column signal processing unit 550, and the like. Furthermore, as illustrated in FIG. 3, the connection holes H1 and H2 may be arranged in the vicinity of the pixel array unit 540, instead of disposing the peripheral circuit in the peripheral portion 540B of the second substrate 200.

The third substrate 300 includes the wiring layer 300T and the semiconductor layer 300S in this order from the second substrate 200 side, for example. For example, the front surface of the semiconductor layer 300S is provided on the second substrate 200 side. The semiconductor layer 300S is formed with a silicon substrate. The semiconductor layer 300S includes a circuit provided at its portion on the front surface side. Specifically, for example, the portion on the front surface side of the semiconductor layer 300S includes at least a part of the input unit 510A, the row drive unit 520, the timing control unit 530, the column signal processing unit 550, the image signal processing unit 560, and the output unit 510B. The wiring layer 300T provided between the semiconductor layer 300S and the second substrate 200 includes, for example, an interlayer insulating film, a plurality of wiring layers isolated by the interlayer insulating film, and the contact portions 301 and 302. The contact portions 301 and 302 are exposed on the front surface (the surface on the second substrate 200 side) of the wiring layer 300T. In addition, the contact portion 301 is in contact with the contact portion 201 of the second substrate 200 and the contact portion 302 is in contact with the contact portion 202 of the second substrate 200, individually. The contact portions 301 and 302 are electrically connected to a circuit (for example, at least one of the input unit 510A, the row drive unit 520, the timing control unit 530, the column signal processing unit 550, the image signal processing unit 560, or the output unit 510B) formed in the semiconductor layer 300S. The contact portions 301 and 302 are formed of metal such as copper (Cu) and aluminum (Al), for example. For example, an external terminal TA is connected to the input unit 510A via the connection hole H1 while an external terminal TB is connected to the output unit 510B via the connection hole H2.

Here, features of the imaging device 1 will be described.

Typically, an imaging device includes a photodiode and a pixel circuit, as main components. Here, increasing the area of the photodiode will increase the charge generated as a result of photoelectric conversion. As a result, the signal/noise ratio (S/N ratio) of the pixel signal is improved, and the imaging device can output better image data (image information). In contrast, increasing the size of the transistor (particularly, the size of the amplification transistor) included in the pixel circuit will decrease the noise generated in the pixel circuit. As a result, the S/N ratio of the imaging signal is improved, enabling the imaging device to output better image data (image information).

However, in an imaging device in which a photodiode and a pixel circuit are provided on the same semiconductor substrate, increasing the area of the photodiode in a limited area of the semiconductor substrate might decrease the size of a transistor included in the pixel circuit. Furthermore, increasing the size of the transistor included in the pixel circuit might decrease the area of the photodiode.

In order to solve these problems, for example, the imaging device 1 of the present embodiment uses a structure in which a plurality of pixels 541 shares one pixel circuit 210 and the shared pixel circuit 210 is arranged to overlap the photodiode PD. This configuration makes it possible to achieve maximization of the area of the photodiode PD and maximization of the size of the transistor included in the pixel circuit 210 within the limited area of the semiconductor substrate. This makes it possible to improve the S/N ratio of the pixel signal, enabling the imaging device 1 to output better image data (image information).

In implementation of a structure in which the plurality of pixels 541 shares one pixel circuit 210 and the shared pixel circuit 210 is arranged to overlap the photodiode PD, a plurality of wiring lines connected to one pixel circuit 210 extends from the floating diffusion FD of each of the plurality of pixels 541. In order to ensure a large area of the semiconductor substrate 200 forming the pixel circuit 210, a plurality of extending wiring lines can be mutually connected to form integrated connected wiring, for example. Similarly, for the plurality of wiring lines extending from the VSS contact region 118, it is possible to mutually connect the plurality of extending wiring lines to form the integrated connected wiring.

For example, forming a connected wiring that mutually connects a plurality of wiring lines extending from the floating diffusion FD of each of the plurality of pixels 541 in the semiconductor substrate 200 on which the pixel circuit 210 is to be formed, however, would lead to a conceivable concern of decreasing an area for forming transistors included in the pixel circuit 210. Similarly, forming an integrated connected wiring of mutually connecting a plurality of wiring lines extending from the VSS contact region 118 of each of the plurality of pixels 541 in the semiconductor substrate 200 on which the pixel circuit 210 is to be formed would lead to a conceivable concern of decreasing the area for forming the transistors included in the pixel circuit 210.

In order to solve these problems, for example, the imaging device 1 of the present embodiment can use a structure in which a plurality of pixels 541 shares one pixel circuit 210, and the shared pixel circuit 210 is arranged to overlap the photodiode PD, the structure being a structure in which an integrated connected wiring of mutually connecting the floating diffusion FD of each of the plurality of pixels 541, and an integrated connected wiring of mutually connecting the VSS contact regions 118 included in each of the plurality of pixels 541, are provided on the first substrate 100.

Here, by using the second manufacturing method described above as the manufacturing method for providing, on the first substrate 100, the integrated connected wiring of mutually connecting the floating diffusion FD of each of the plurality of pixels 541 and the integrated connected wiring of mutually connecting the VSS contact regions 118 of each of the plurality of pixels 541, for example, it is possible to achieve manufacturing using an appropriate process according to the configuration of each of the first substrate 100 and the second substrate 200, leading to the manufacture of a high-quality and high-performance imaging device. In addition, the connected wiring of the first substrate 100 and the second substrate 200 can be formed by a facilitated process. Specifically, in the case of using the second manufacturing method, an electrode connected to the floating diffusion FD and an electrode connected to the VSS contact region 118 are each provided on the front surface of the first substrate 100 and the front surface of the second substrate 200, which are the bonding boundary surfaces between the first substrate 100 and the second substrate 200. Furthermore, it is preferable to enlarge the electrodes formed on the front surfaces of the two substrates, namely, the first substrate 100 and the second substrate 200 so that the electrodes formed on the front surfaces of the two substrates come into contact with each other even when misalignment occurs between the electrodes provided on the front surfaces of the two substrates when the two substrates are bonded together. In this case, however, there is a conceivable concern of difficulty in disposing the electrodes in a limited area of individual pixels included in the imaging device 1.

In order to solve the problem of requirement for a large electrode at the bonding boundary surface between the first substrate 100 and the second substrate 200, the imaging device 1 of the present embodiment can use, for example, the first manufacturing method described above as the manufacturing method in which the plurality of pixels 541 shares one pixel circuit 210, and the shared pixel circuit 210 is arranged to overlap the photodiode PD. This makes it possible to facilitate alignment of elements formed on the first substrate 100 and the second substrate 200 with each other, leading to achievement of manufacturing a high-quality and high-performance imaging device. Furthermore, it is possible to provide a unique structure generated by using this manufacturing method. That is, the imaging device includes a structure in which the semiconductor layer 100S and the wiring layer 100T of the first substrate 100, and the semiconductor layer 200S and the wiring layer 200T of the second substrate 200, are stacked in this order, in other words, a structure in which the first substrate 100 and the second substrate 200 are stacked in a face-to-back bonding, and the device is provided with the through-substrate electrodes 120E and 121E penetrating from the front surface of the semiconductor layer 200S of the second substrate 200 through the semiconductor layer 200S and the wiring layer 100T of the first substrate 100 to reach the front surface of the semiconductor layer 100S of the first substrate 100.

Regarding this structure, however, having the integrated connected wiring of mutually connecting the floating diffusion FD of each of the plurality of pixels 541, and the integrated connected wiring of mutually connecting the VSS contact region 118 of each of the plurality of pixels 541, being provided on the first substrate 100, stacking this structure and the second substrate 200 using the first manufacturing method and then forming the pixel circuit 210 on the second substrate 200 would lead to a possibility that the heating process necessary at formation of the active elements included in the pixel circuit 210 might affect the connected wiring that has been formed on the first substrate 100.

Therefore, in order to solve the problem that the connected wiring is affected by the heating process at formation of active elements, it is desirable that the imaging device 1 of the present embodiment use a conductive material having high heat resistance for the integrated connected wiring of mutually connecting the floating diffusion FD of each of the plurality of pixels 541 and the integrated connected wiring of mutually connecting the VSS contact regions 118 of each of the plurality of pixels 541. Specifically, as the conductive material having high heat resistance, it is possible to use a material having a melting point higher than that of at least a part of the wiring material included in the wiring layer 200T of the second substrate 200.

In this manner, for example, the imaging device 1 of the present embodiment includes: (1) the structure in which the first substrate 100 and the second substrate 200 are stacked in a face-to-back bonding (specifically, a structure in which the semiconductor layer 100S and the wiring layer 100T of the first substrate 100, and the semiconductor layer 200S and the wiring layer 200T of the second substrate 200 are stacked in this order); (2) the structure in which the through-substrate electrodes 120E and 121E are provided from the front surface of the semiconductor layer 200S of the second substrate 200, penetrating through the semiconductor layer 200S and the wiring layer 100T of the first substrate 100 to reach the front surface of the semiconductor layer 100S of the first substrate 100; and (3) the structure in which the integrated connected wiring of mutually connecting the floating diffusion FD included in each of the plurality of pixels 541, and the integrated connected wiring of mutually connecting the VSS contact regions 118 included in each of the plurality of pixels 541, are formed of a conductive material having high heat resistance. With this configuration, it is possible to provide the integrated connected wiring of mutually connecting the floating diffusion FD included in each of the plurality of pixels 541 and the integrated connected wiring of mutually connecting the VSS contact regions 118 included in each of the plurality of pixels 541, on the first substrate 100, with no large electrodes at the boundary surface between the first substrate 100 and the second substrate 200.

[Operation of Imaging Device 1]

Figure 13:
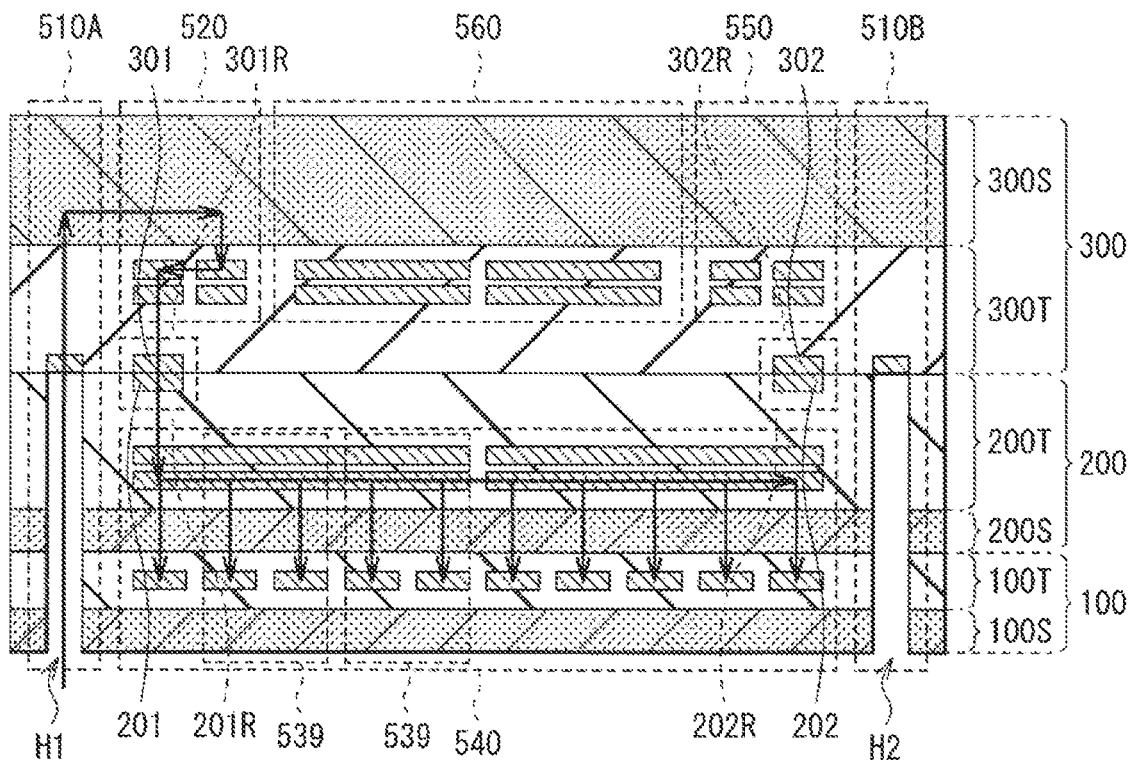
FIG. 13 is a schematic diagram illustrating a route of an input signal to the imaging device illustrated in FIG. 3.
Figure 14:
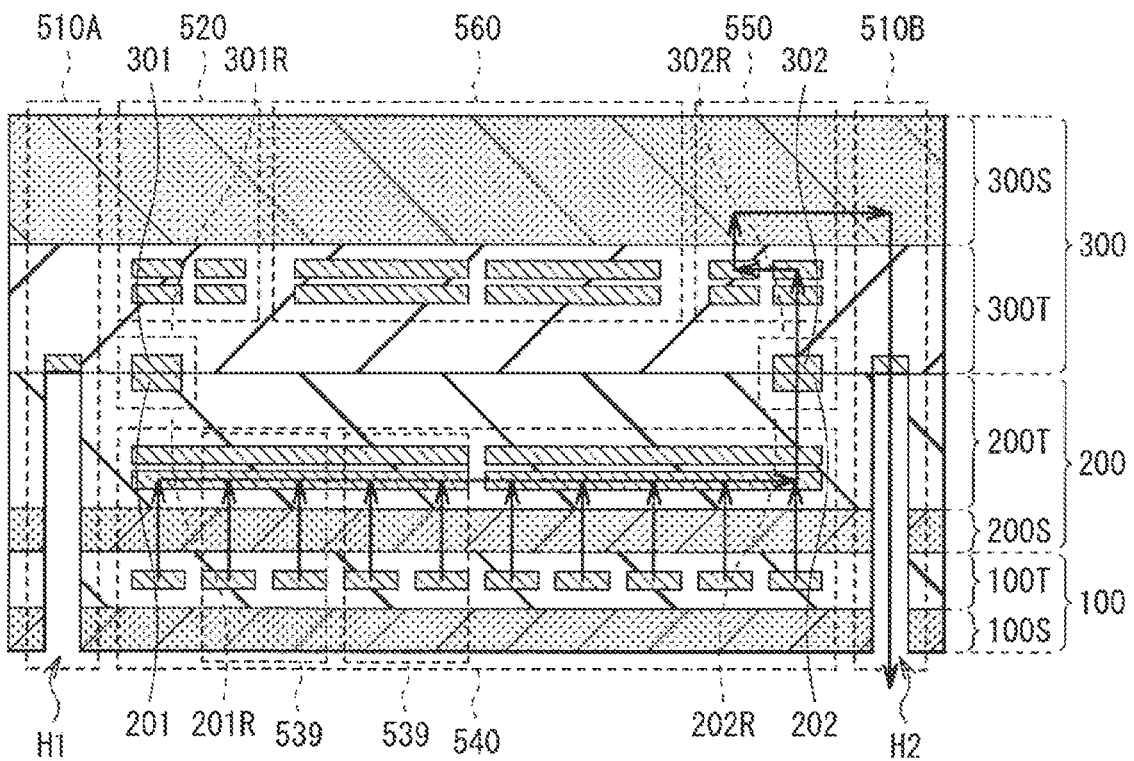
FIG. 14 is a schematic diagram illustrating a signal route of a pixel signal of the imaging device illustrated in FIG. 3.

Next, operation of the imaging device 1 will be described with reference to FIGS. 13 and 14. FIGS. 13 and 14 are diagrams having arrows representing routes of individual signals added to FIG. 3. In FIG. 13, routes of an input signal input to the imaging device 1 from the outside and routes of a power supply potential and a reference potential are indicated by arrows. In FIG. 14, a signal route regarding a pixel signal output from the imaging device 1 to the outside is indicated by arrows. For example, an input signal (for example, a pixel clock and a synchronization signal) input to the imaging device 1 via the input unit 510A is transmitted to the row drive unit 520 of the third substrate 300 to allow the row drive unit 520 to generate a row drive signal. The row drive signal is sent to the second substrate 200 via the contact portions 301 and 201. Furthermore, the row drive signal reaches each of the pixel sharing units 539 of the pixel array unit 540 via the row drive signal line 542 in the wiring layer 200T. Among the row drive signals reaching the pixel sharing unit 539 of the second substrate 200, drive signals other than those for the transfer gate TG are input to the pixel circuit 210 so as to drive each of transistors included in the pixel circuit 210. The drive signal for the transfer gate TG is input to the transfer gates TG1, TG2, TG3, and TG4 of the first substrate 100 via the through-substrate electrode TGV so as to drive the pixels 541A, 541B, 541C, and 541D (FIG. 13). Furthermore, the power supply potential and the reference potential supplied from the outside of the imaging device 1 to the input unit 510A (input terminal 511) of the third substrate 300 are sent to the second substrate 200 via the contact portions 301 and 201, and supplied to the pixel circuit 210 of each of the pixel sharing units 539 via the wiring in the wiring layer 200T. The reference potential is further supplied to the pixels 541A, 541B, 541C, and 541D of the first substrate 100 via the through-substrate electrode 121E. On the other hand, the pixel signal photoelectrically converted by the pixels 541A, 541B, 541C, and 541D of the first substrate 100 is sent to the pixel circuit 210 of the second substrate 200 for each of the pixel sharing units 539 via the through-substrate electrode 120E. The pixel signal based on this pixel signal is sent from the pixel circuit 210 to the third substrate 300 via the vertical signal line 543 and the contact portions 202 and 302. This pixel signal is processed by the column signal processing unit 550 and the image signal processing unit 560 of the third substrate 300, and then output to the outside via the output unit 510B.

[Effects]

In the present embodiment, the pixels 541A, 541B, 541C, and 541D (pixel sharing unit 539) and the pixel circuit 210 are provided on different substrates (first substrate 100 and second substrate 200). With this configuration, the areas of the pixels 541A, 541B, 541C, and 541D and the pixel circuit 210 can be enlarged as compared with a case where the pixels 541A, 541B, 541C, and 541D and the pixel circuit 210 are formed on the same substrate. As a result, it is possible to increase the amount of pixel signals obtained by photoelectric conversion, and possible to decrease the transistor noise of the pixel circuit 210. This makes it possible to improve the signal/noise ratio of the pixel signal, enabling the imaging device 1 to output better pixel data (image information). In addition, it is possible to achieve miniaturization of the imaging device 1 (in other words, reduction of the pixel size and downsizing of the imaging device 1). With the reduced pixel size, the imaging device 1 can increase the number of pixels per unit area and can output a high-quality image.

Furthermore, in the imaging device 1, the first substrate 100 and the second substrate 200 are electrically connected to each other by the through-substrate electrodes 120E and 121E provided in the insulating region 212. For example, there is a conceivable method of connecting the first substrate 100 and the second substrate 200 to each other by bonding pad electrodes to each other, or a method of connecting these to each other by through-substrate wiring (for example, Through Si Via (TSV)) penetrating the semiconductor layer. As compared with such a method, by providing the through-substrate electrodes 120E and 121E in the insulating region 212, it is possible to decrease the area required for connecting the first substrate 100 and the second substrate 200 to each other. This makes it possible to reduce the pixel size and further downsize the imaging device 1. Furthermore, further miniaturization of the area per pixel leads to achievement of higher resolution. When there is no need to reduce the chip size, the formation region of the pixels 541A, 541B, 541C, and 541D and the pixel circuit 210 can be enlarged. As a result, it is possible to increase the amount of pixel signals obtained by photoelectric conversion and reduce the noise of the transistor included in the pixel circuit 210. This makes it possible to improve the signal/noise ratio of the pixel signal, enabling the imaging device 1 to output better pixel data (image information).

Furthermore, in the imaging device 1, the pixel circuit 210 is provided on a substrate (the second substrate 200) different from the substrate (the third substrate 300) on which the column signal processing unit 550 and the image signal processing unit 560 are provided. This configuration can enlarge the area of the pixel circuit 210 and the areas of the column signal processing unit 550 and the image signal processing unit 560 as compared with the case where the pixel circuit 210, the column signal processing unit 550, and the image signal processing unit 560 are formed on the same substrate. This makes it possible to reduce the noise generated in the column signal processing unit 550, enabling a further advanced image processing circuit to be mounted by using the image signal processing unit 560. This leads to improvement of the signal/noise ratio of the pixel signal, enabling the imaging device 1 to output better pixel data (image information).

Furthermore, in the imaging device 1, the pixel array unit 540 is provided on the first substrate 100 and the second substrate 200, and the column signal processing unit 550 and the image signal processing unit 560 are provided on the third substrate 300. In addition, the contact portions 201, 202, 301, and 302 connecting the second substrate 200 and the third substrate 300 are formed above the pixel array unit 540. This enables flexible layout of the contact portions 201, 202, 301, and 302 without receiving layout interference from various wiring lines provided in the pixel array. For this reason, the contact portions 201, 202, 301, and 302 can be applied to electrical connection between the second substrate 200 and the third substrate 300. With the use of the contact portions 201, 202, 301, and 302, for example, the column signal processing unit 550 and the image signal processing unit 560 have a higher degree of freedom in layout. This makes it possible to reduce the noise generated in the column signal processing unit 550, enabling a further advanced image processing circuit to be mounted by using the image signal processing unit 560. This leads to improvement of the signal/noise ratio of the pixel signal, enabling the imaging device 1 to output better pixel data (image information).

Furthermore, in the imaging device 1, the pixel isolation portion 117 penetrates the semiconductor layer 100S. With this configuration, even when the distance between adjacent pixels (pixels 541A, 541B, 541C, and 541D) is shortened due to miniaturization of the area per pixel, it is possible to suppress color mixing among the pixels 541A, 541B, 541C, and 541D. This makes it possible to improve the signal/noise ratio of the pixel signal, enabling the imaging device 1 to output better pixel data (image information).

Furthermore, in the imaging device 1, a pixel circuit 210 is provided for each pixel sharing unit 539. With this configuration, as compared with a case where the pixel circuit 210 is provided in each of the pixels 541A, 541B, 541C, and 541D, it is possible to increase the formation region of the transistors (amplification transistor AMP, reset transistor RST, selection transistor SEL, and FD conversion gain switching transistor FDG) constituting the pixel circuit 210. For example, noise can be suppressed by increasing the formation region of the amplification transistor AMP. This makes it possible to improve the signal/noise ratio of the pixel signal, enabling the imaging device 1 to output better pixel data (image information).

Furthermore, in the imaging device 1, the pad portion 120 that electrically connects the floating diffusion FD (floating diffusion FD1, FD2, FD3, and FD4) of the four pixels (pixels 541A, 541B, 541C, and 541D) is provided on the first substrate 100. With this configuration, it is possible to decrease the number of through-substrate electrodes (through-substrate electrodes 120E) connecting the first substrate 100 and the second substrate 200 to each other as compared with the case where the pad portion 120 is provided on the second substrate 200. This makes it possible to reduce the size of the insulating region 212 and ensure a sufficient size of the transistor formation region (semiconductor layer 200S) constituting the pixel circuit 210. This makes it possible to reduce the noise of the transistor included in the pixel circuit 210, leading to improvement in the signal/noise ratio of the pixel signal, enabling the imaging device 1 to output better pixel data (image information).

Hereinafter, modifications of the imaging device 1 according to the above embodiment will be described. In the following modifications, the same reference symbols are assigned to the same configurations as those of the above embodiment.

2. First Modification

Figure 15:
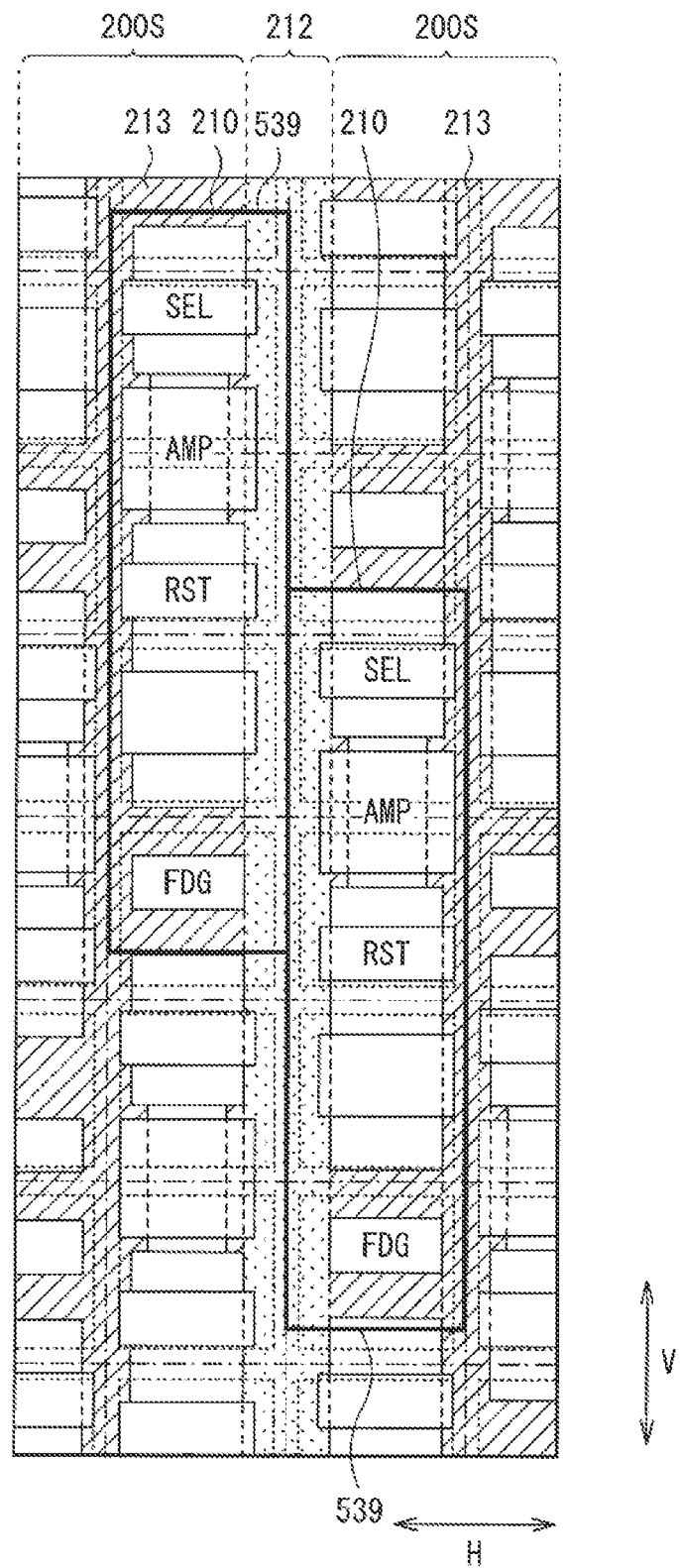
FIG. 15 is a schematic diagram illustrating a modification of the planar configuration of the second substrate (semiconductor layer) illustrated in FIG. 8.
Figure 16:
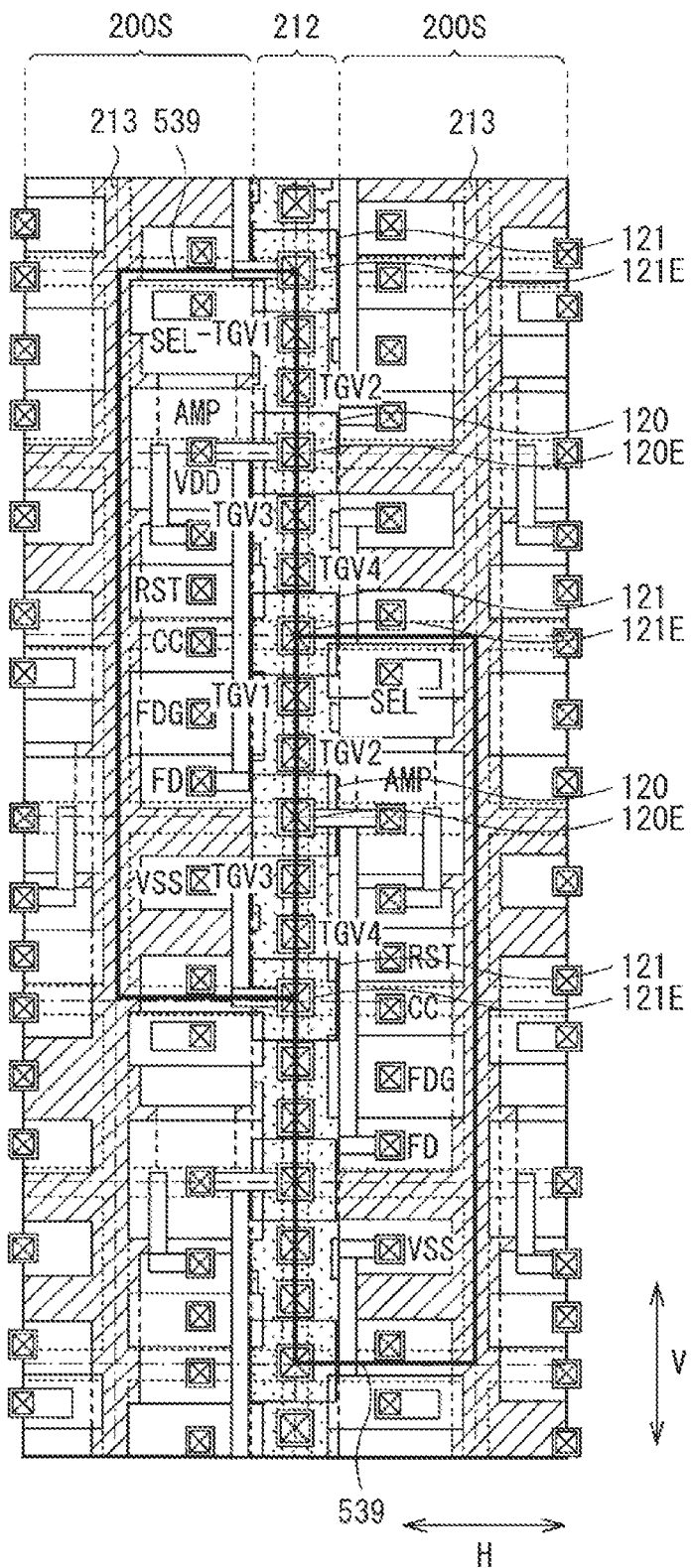
FIG. 16 is a schematic diagram illustrating a planar configuration of a main part of the first wiring layer and the first substrate together with a pixel circuit illustrated in FIG. 15.
Figure 17:
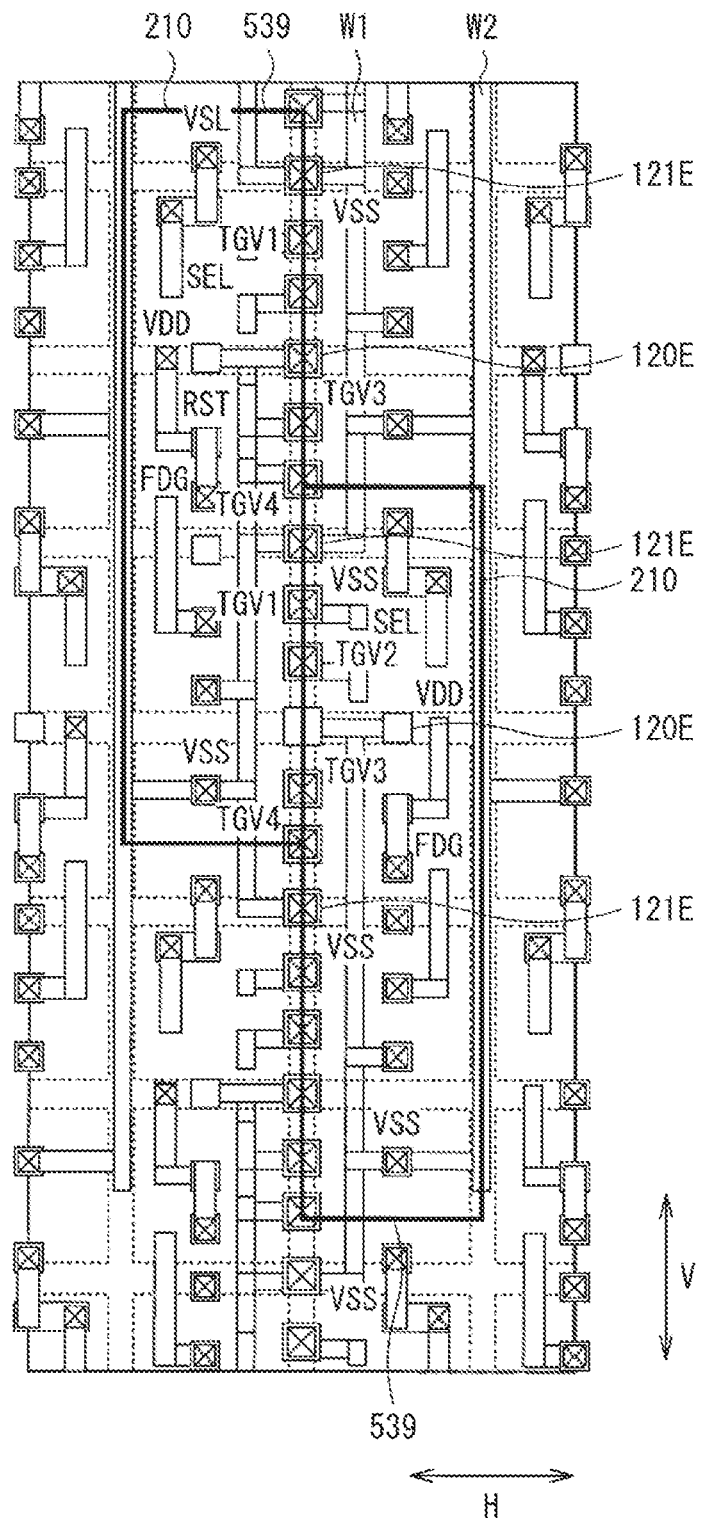
FIG. 17 is a schematic diagram illustrating an example of a planar configuration of the second wiring layer together with the first wiring layer illustrated in FIG. 16.
Figure 18:
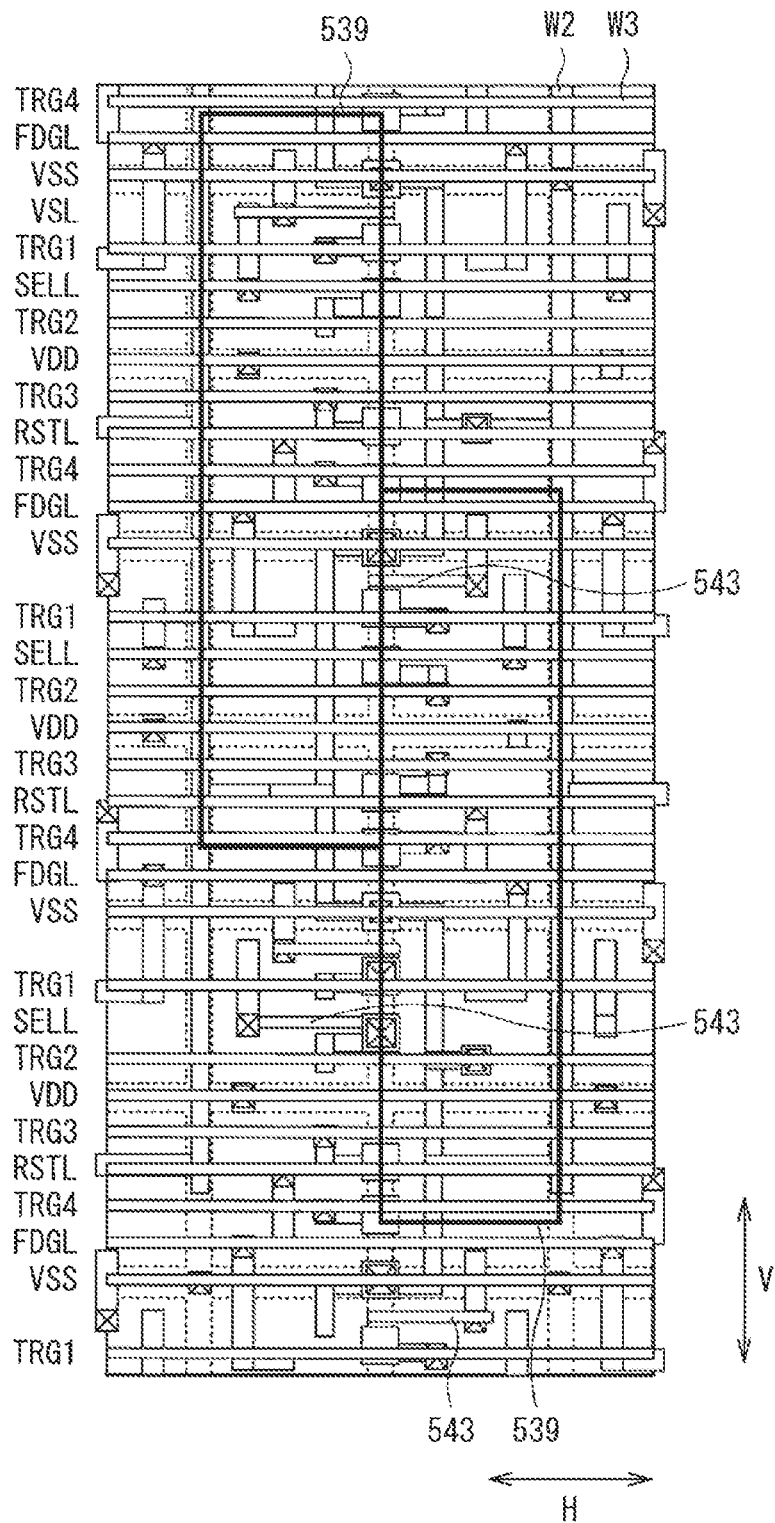
FIG. 18 is a schematic diagram illustrating an example of a planar configuration of the third wiring layer together with the second wiring layer illustrated in FIG. 17.
Figure 19:
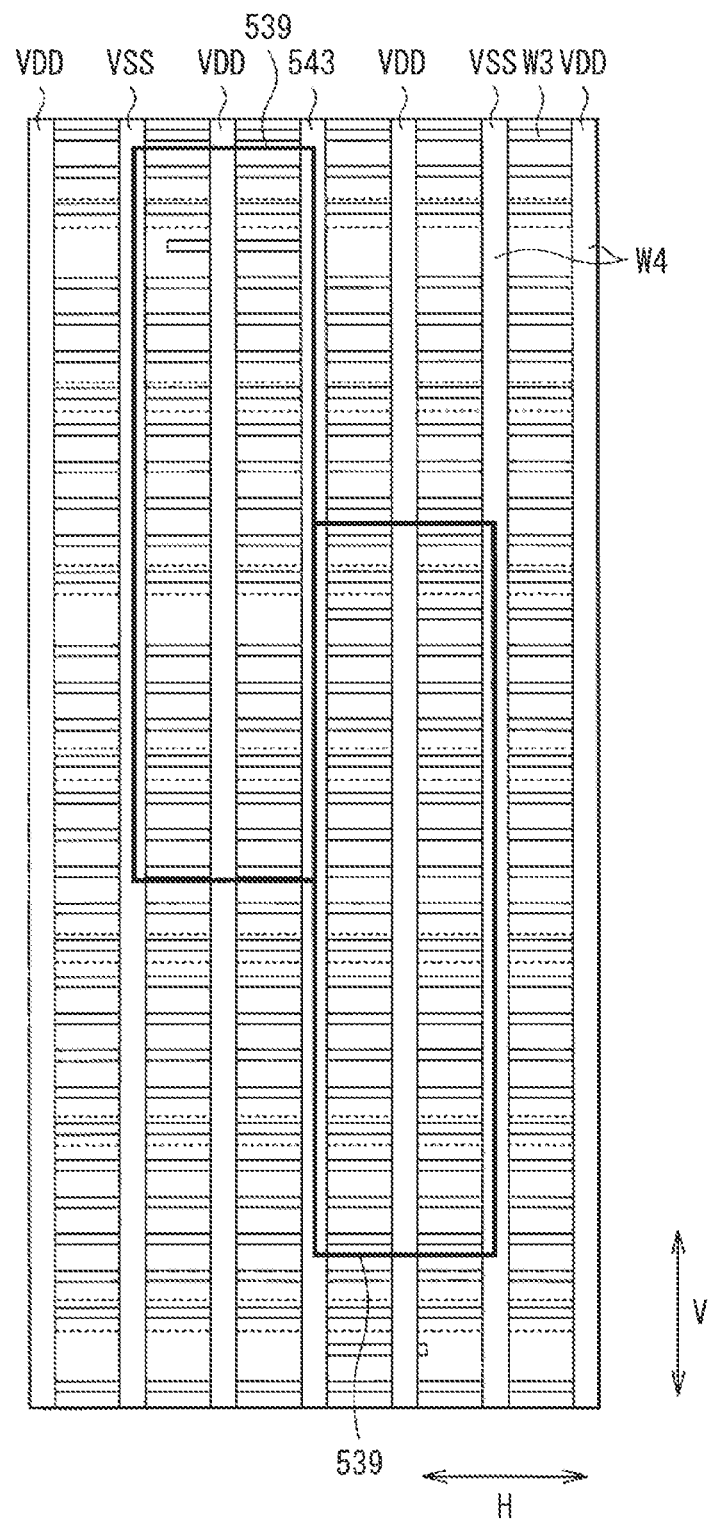
FIG. 19 is a schematic diagram illustrating an example of a planar configuration of the fourth wiring layer together with the third wiring layer illustrated in FIG. 18.

FIGS. 15 to 19 illustrate a modification of the planar configuration of the imaging device 1 according to the above embodiment. FIG. 15 schematically illustrates a planar configuration in the vicinity of the front surface of the semiconductor layer 200S of the second substrate 200, and corresponds to FIG. 8 described in the above embodiment. FIG. 16 schematically illustrates a configuration of each of portions of the first wiring layer W1, the semiconductor layer 200S connected to the first wiring layer W1, and the first substrate 100, and corresponds to FIG. 9 described in the above embodiment. FIG. 17 illustrates an example of a planar configuration of the first wiring layer W1 and the second wiring layer W2, and corresponds to FIG. 10 described in the above embodiment. FIG. 18 illustrates an example of a planar configuration of the second wiring layer W2 and the third wiring layer W3, and corresponds to FIG. 11 described in the above embodiment. FIG. 19 illustrates an example of a planar configuration of the third wiring layer W3 and the fourth wiring layer W4, and corresponds to FIG. 12 described in the above embodiment.

As illustrated in FIG. 16, the present modification has a configuration in which the internal layout of one pixel sharing unit 539 (for example, one on the right side in the drawing) among the two pixel sharing units 539 arranged in the H direction on the second substrate 200 is obtained by inverting the internal layout of the other pixel sharing unit 539 (for example, one on the left side in the drawing) only in the H direction. In addition, the shift in the V direction between the outline of one pixel sharing unit 539 and the outline of the other pixel sharing unit 539 is larger than the shift described in the above embodiment (FIG. 9). In this manner, providing a larger shift in the V direction will make it possible to shorten the distance between the amplification transistor AMP of the other pixel sharing unit 539 and the connected pad portion 120 (the pad portion 120 of the other pixel sharing unit 539 (one on lower side of the drawing) of the two pixel sharing units 539 aligned in the V direction illustrated in FIGS. 7A and 7B). With such a layout, the first modification of the imaging device 1 illustrated in FIGS. 15 to 19 can make an achievement of the area of the planar layout of the two pixel sharing units 539 aligned in the H direction the same as the area of the pixel sharing unit 539 of the second substrate 200 described in the above embodiment without mutually inverting the planar layout of the two pixel sharing units 539 in the V direction. Note that the planar layout of the pixel sharing unit 539 of the first substrate 100 is the same as the planar layout described in the above embodiment (FIGS. 7A and 7B). Therefore, the imaging device 1 of the present modification can obtain the effects similar to those of the imaging device 1 described in the above embodiment. The arrangement of the pixel sharing unit 539 of the second substrate 200 is not limited to the arrangement described in the above embodiment and the present modification.

3. Second Modification

Figure 20:
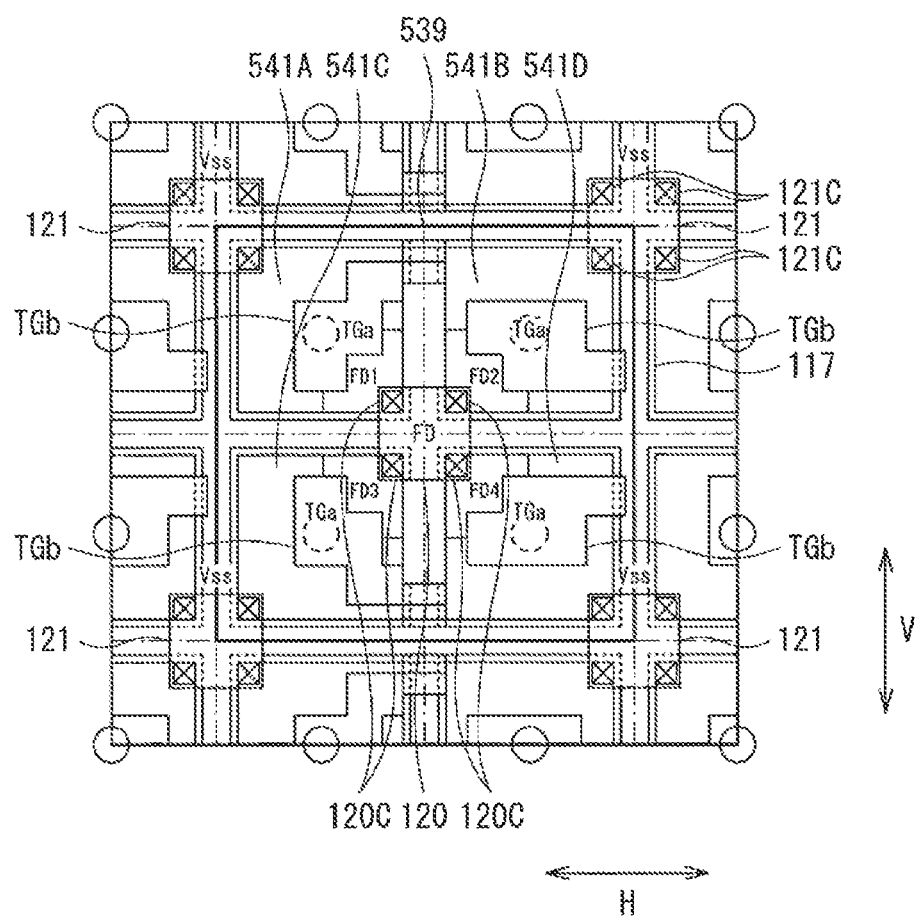
FIG. 20 is a schematic diagram illustrating a modification of the planar configuration of the first substrate illustrated in FIG. 7A.
Figure 21:
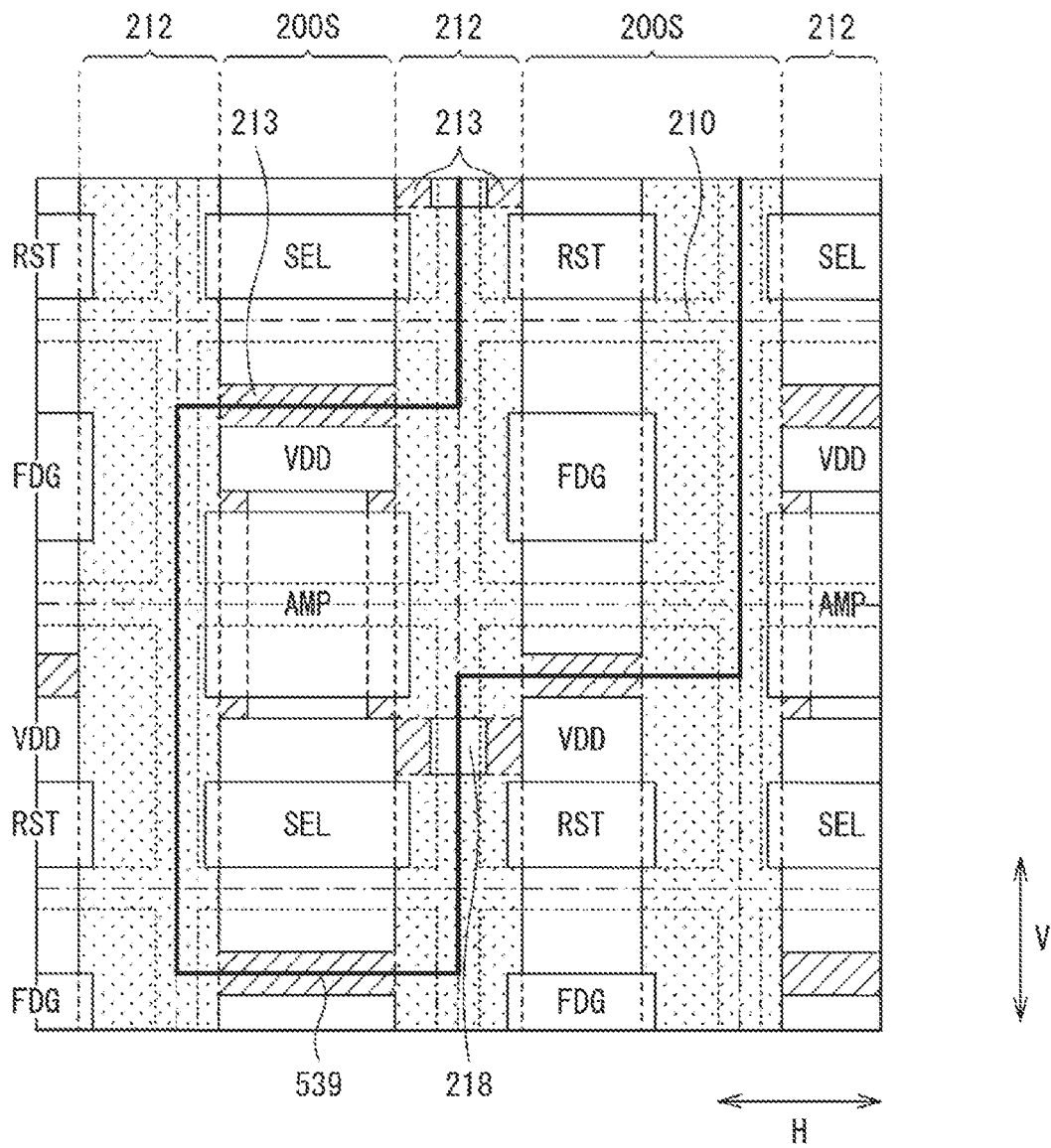
FIG. 21 is a schematic diagram illustrating an example of a planar configuration of the second substrate (semiconductor layer) stacked on the first substrate illustrated in FIG. 20.
Figure 22:
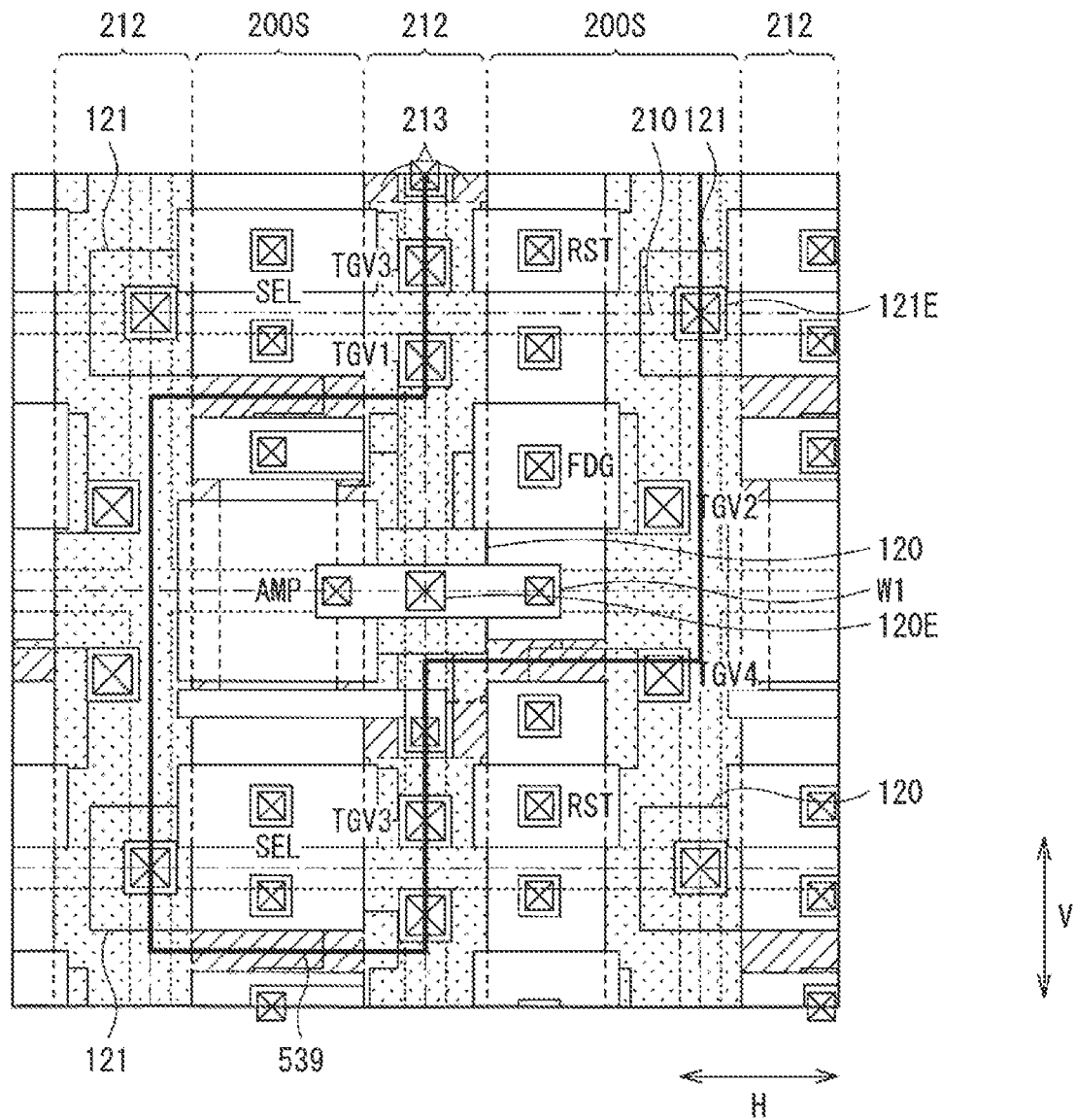
FIG. 22 is a schematic diagram illustrating an example of a planar configuration of the first wiring layer together with the pixel circuit illustrated in FIG. 21.
Figure 23:
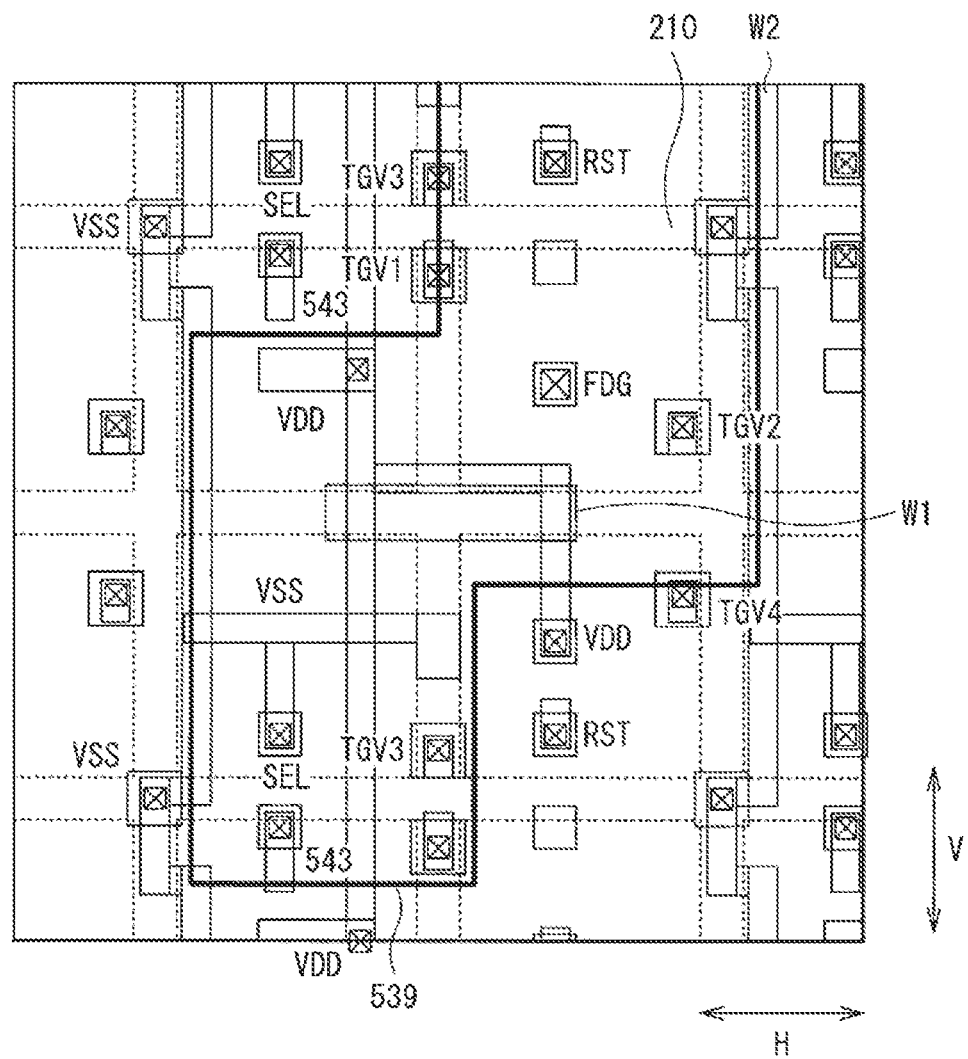
FIG. 23 is a schematic diagram illustrating an example of a planar configuration of the second wiring layer together with the first wiring layer illustrated in FIG. 22.
Figure 24:
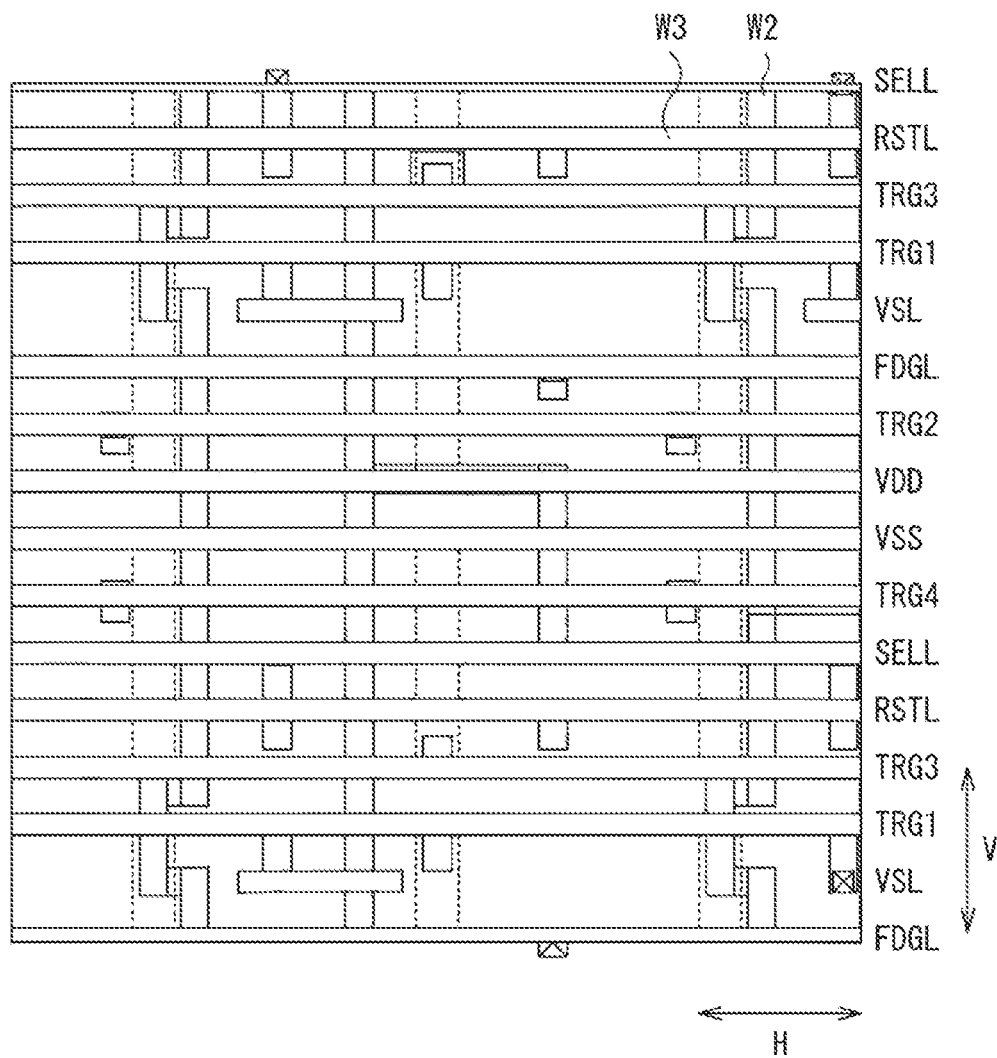
FIG. 24 is a schematic diagram illustrating an example of a planar configuration of the third wiring layer together with the second wiring layer illustrated in FIG. 23.
Figure 25:
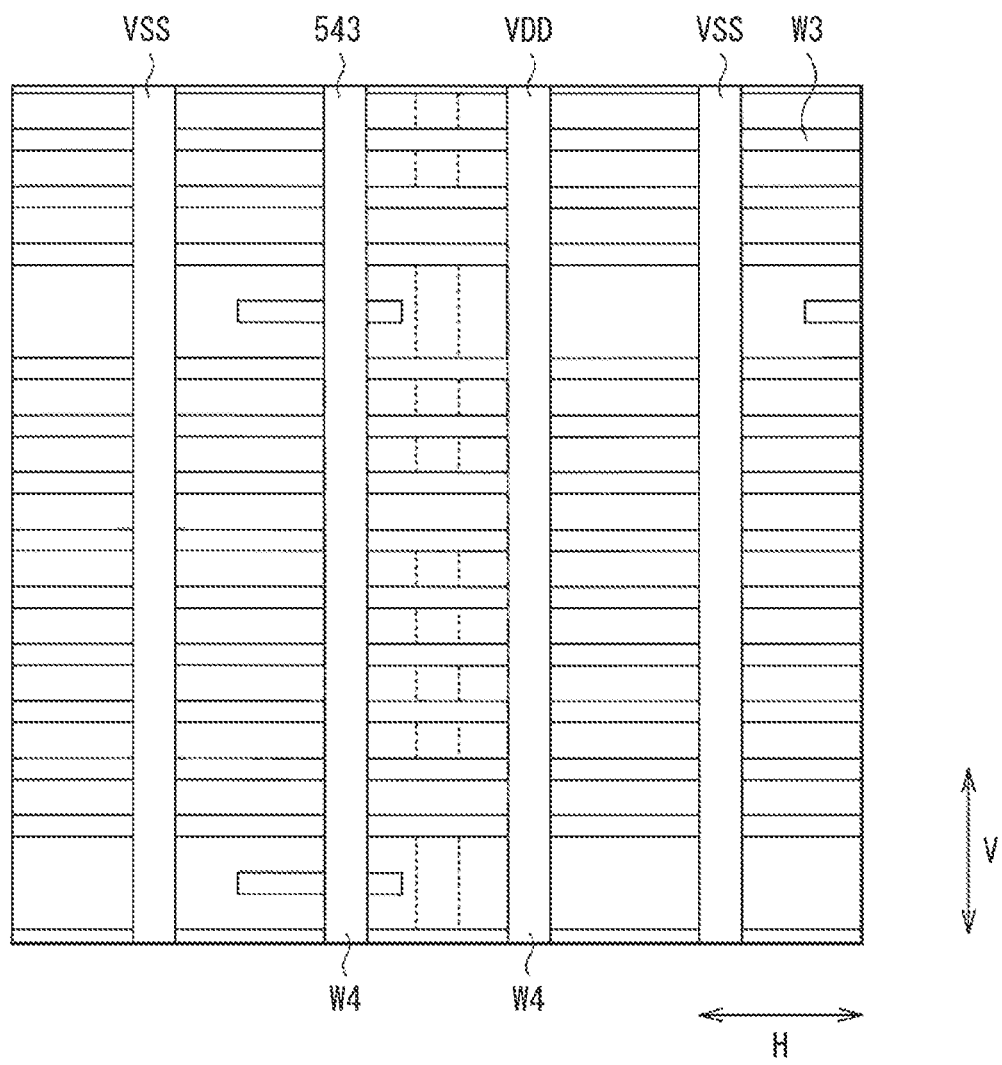
FIG. 25 is a schematic diagram illustrating an example of a planar configuration of the fourth wiring layer together with the third wiring layer illustrated in FIG. 24.

FIGS. 20 to 25 illustrate a modification of the planar configuration of the imaging device 1 according to the above embodiment. FIG. 20 schematically illustrates a planar configuration of the first substrate 100, and corresponds to FIG. 7A described in the above embodiment. FIG. 21 schematically illustrates a planar configuration in the vicinity of the front surface of the semiconductor layer 200S of the second substrate 200, and corresponds to FIG. 8 described in the above embodiment. FIG. 22 schematically illustrates a configuration of each of portions of the first wiring layer W1, the semiconductor layer 200S connected to the first wiring layer W1, and the first substrate 100, and corresponds to FIG. 9 described in the above embodiment. FIG. 23 illustrates an example of a planar configuration of the first wiring layer W1 and the second wiring layer W2, and corresponds to FIG. 10 described in the above embodiment. FIG. 24 illustrates an example of a planar configuration of the second wiring layer W2 and the third wiring layer W3, and corresponds to FIG. 11 described in the above embodiment. FIG. 25 illustrates an example of a planar configuration of the third wiring layer W3 and the fourth wiring layer W4, and corresponds to FIG. 12 described in the above embodiment.

In the present modification, the outer shape of each of the pixel circuits 210 has a substantially square planar shape (FIG. 21 and the like). In this respect, the planar configuration of the imaging device 1 of the present modification is different from the planar configuration of the imaging device 1 described in the above embodiment.

For example, the pixel sharing unit 539 of the first substrate 100 is formed over a pixel region of 2 rows×2 columns, and has a substantially square planar shape (FIG. 20), similarly to the description in the embodiment described above. For example, in each of the pixel sharing units 539, the horizontal portions TGb of the transfer gates TG1 and TG3 of the respective pixel 541A and the pixel 541C of one pixel column extend in the direction from a position overlapping the vertical portion TGa toward the central portion of the pixel sharing unit 539 in the H direction (more specifically, a direction toward the outer edges of the pixels 541A and 541C and a direction toward the central portion of the pixel sharing unit 539), while the horizontal portions TGb of the transfer gates TG2 and TG4 of the respective pixel 541B and the pixel 541D of the other pixel column extend in the direction from a position overlapping the vertical portion TGa toward the outer side of the pixel sharing unit 539 in the H direction (more specifically, a direction toward the outer edges of the pixels 541B and 541D and a direction toward the outer side of the pixel sharing unit 539). The pad portion 120 connected to the floating diffusion FD is provided at a central portion of the pixel sharing unit 539 (central portion of the pixel sharing unit 539 in the H direction and the V direction), while the pad portion 121 connected to the VSS contact region 118 is provided at an end of the pixel sharing unit 539 at least in the H direction (in the H direction and the V direction in FIG. 20).

As another arrangement example, it is also conceivable to provide the horizontal portions TGb of the transfer gates TG1, TG2, TG3, and TG4 only in a region facing the vertical portion TGa. At this time, the semiconductor layer 200S is likely to be divided into a number of pieces similarly to the description in the above embodiment. This makes it difficult to enlarge the transistors of the pixel circuit 210. On the other hand, when the horizontal portions TGb of the transfer gates TG1, TG2, TG3, and TG4 are extended in the H direction from the position overlapping the vertical portion TGa as in the above modification, the width of the semiconductor layer 200S can be increased as described similarly to the description in the above embodiment. Specifically, the positions in the H direction of the through-substrate electrodes TGV1 and TGV3 respectively connected to the transfer gates TG1 and TG3 can be arranged close to the position in the H direction of the through-substrate electrode 120E, while the positions in the H direction of the through-substrate electrodes TGV2 and TGV4 respectively connected to the transfer gates TG2 and TG4 can be arranged close to the position in the H direction of the through-substrate electrode 121E (FIG. 22). This configuration can increase the width (size in the H direction) of the semiconductor layer 200S extending in the V direction similarly to the description in the above embodiment. This makes it possible to increase the size of the transistors of the pixel circuit 210, particularly, the size of the amplification transistor AMP. As a result, it is possible to improve the signal/noise ratio of the pixel signal, enabling the imaging device 1 to output better pixel data (image information).

The pixel sharing unit 539 of the second substrate 200 has substantially the same size as that of the pixel sharing unit 539 of the first substrate 100 in the H direction and the V direction, for example, and is provided over a region corresponding to a pixel region of approximately 2 rows×2 columns, for example. For example, in each of the pixel circuits 210, the selection transistor SEL and the amplification transistor AMP are arranged side by side in the V direction in one semiconductor layer 200S extending in the V direction, while the FD conversion gain switching transistor FDG and the reset transistor RST are arranged side by side in the V direction in one semiconductor layer 200S extending in the V direction. The one semiconductor layer 200S including the selection transistor SEL and the amplification transistor AMP and the one semiconductor layer 200S including the FD conversion gain switching transistor FDG and the reset transistor RST are arranged in the H direction via the insulating region 212. The insulating region 212 extends in the V direction (FIG. 21).

Here, the outer shape of the pixel sharing unit 539 of the second substrate 200 will be described with reference to FIGS. 21 and 22. For example, the pixel sharing unit 539 of the first substrate 100 illustrated in FIG. 20 is connected to the amplification transistor AMP and the selection transistor SEL provided on one side of the pad portion 120 in the H direction (the left side of FIG. 22), and connected to the FD conversion gain switching transistor FDG and the reset transistor RST provided on the other side of the pad portion 120 in the H direction (the right side of FIG. 22). The outer shape of the pixel sharing unit 539 of the second substrate 200, including the amplification transistor AMP, the selection transistor SEL, the FD conversion gain switching transistor FDG, and the reset transistor RST, is determined by the following four outer edges.

The first outer edge is an outer edge of one end in the V direction of the semiconductor layer 200S including the selection transistor SEL and the amplification transistor AMP (end on the upper side of FIG. 22). The first outer edge is provided between the amplification transistor AMP included in the pixel sharing unit 539 and the selection transistor SEL included in the pixel sharing unit 539 adjacent to one side in the V direction of the pixel sharing unit 539 (upper side of FIG. 22). More specifically, the first outer edge is provided at the central portion in the V direction of the element isolation region 213 between the amplification transistor AMP and the selection transistor SEL. The second outer edge is an outer edge of the other end in the V direction of the semiconductor layer 200S including the selection transistor SEL and the amplification transistor AMP (lower end of FIG. 22). The second outer edge is provided between the selection transistor SEL included in the pixel sharing unit 539 and the amplification transistor AMP included in the pixel sharing unit 539 adjacent to the other side in the V direction of the pixel sharing unit 539 (the lower side of FIG. 22). More specifically, the second outer edge is provided at the central portion in the V direction of the element isolation region 213 between the selection transistor SEL and the amplification transistor AMP. The third outer edge is an outer edge of the other end in the V direction (lower end of FIG. 22) of the semiconductor layer 200S including the reset transistor RST and the FD conversion gain switching transistor FDG. The third outer edge is provided between the FD conversion gain switching transistor FDG included in the pixel sharing unit 539 and the reset transistor RST included in the pixel sharing unit 539 adjacent to the other side in the V direction of the pixel sharing unit 539 (the lower side of FIG. 22). More specifically, the third outer edge is provided at the central portion in the V direction of the element isolation region 213 between the FD conversion gain switching transistor FDG and the reset transistor RST. The fourth outer edge is an outer edge of one end in the V direction of the semiconductor layer 200S including the reset transistor RST and the FD conversion gain switching transistor FDG (end on upper side of FIG. 22). The fourth outer edge is provided between the reset transistor RST included in the pixel sharing unit 539 and the FD conversion gain switching transistor FDG (not illustrated) included in the pixel sharing unit 539 adjacent to one side in the V direction of the pixel sharing unit 539 (on upper side of FIG. 22). More specifically, the fourth outer edge is provided at the central portion in the V direction of the element isolation region 213 (not illustrated) between the reset transistor RST and the FD conversion gain switching transistor FDG.

In the outer shape of the pixel sharing unit 539 of the second substrate 200 including such first, second, third, and fourth outer edges, the third and fourth outer edges are arranged to be shifted to one side in the V direction (in other words, offset to one side in the V direction) with respect to the first and second outer edges. By using such a layout, both the gate of the amplification transistor AMP and the source of the FD conversion gain switching transistor FDG can be disposed as close as possible to the pad portion 120. This makes it possible to reduce the area of the wiring connecting these, facilitating miniaturization of the imaging device 1. Note that the VSS contact region 218 is provided between the semiconductor layer 200S including the selection transistor SEL and the amplification transistor AMP and the semiconductor layer 200S including the reset transistor RST and the FD conversion gain switching transistor FDG. For example, the plurality of pixel circuits 210 has the same arrangement.

The imaging device 1 including such a second substrate 200 can also obtain the effects similar to those described in the above embodiment. The arrangement of the pixel sharing unit 539 of the second substrate 200 is not limited to the arrangement described in the above embodiment and the present modification.

4. Third Modification

Figure 26:
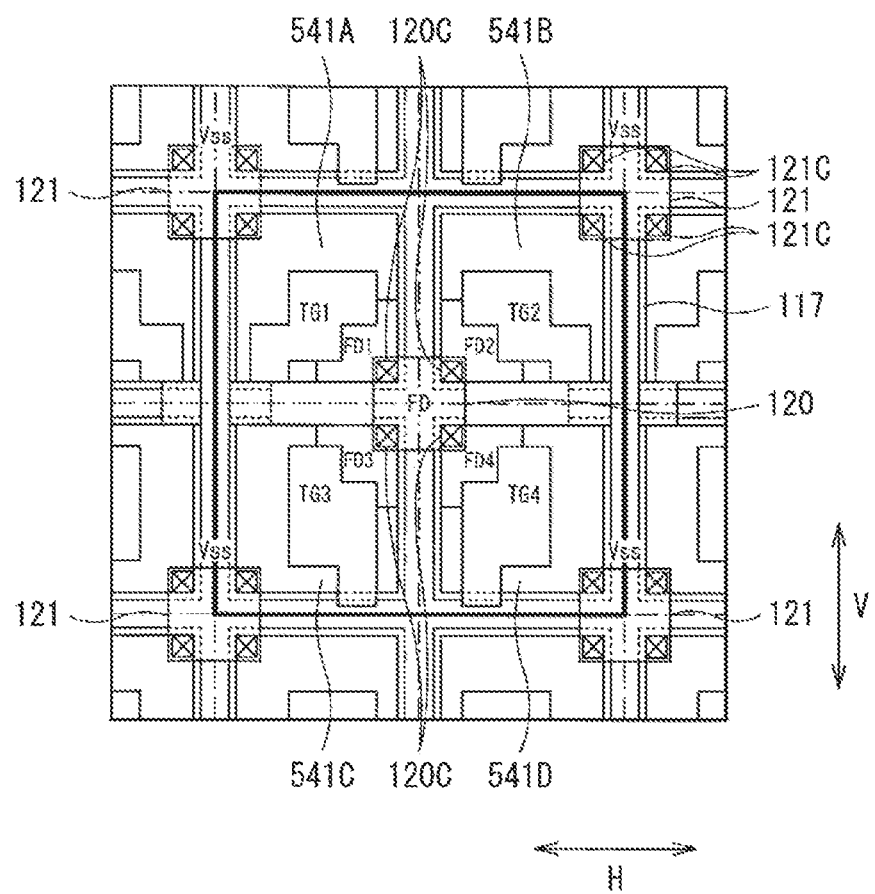
FIG. 26 is a schematic diagram illustrating another example of the planar configuration of the first substrate illustrated in FIG. 20.
Figure 27:
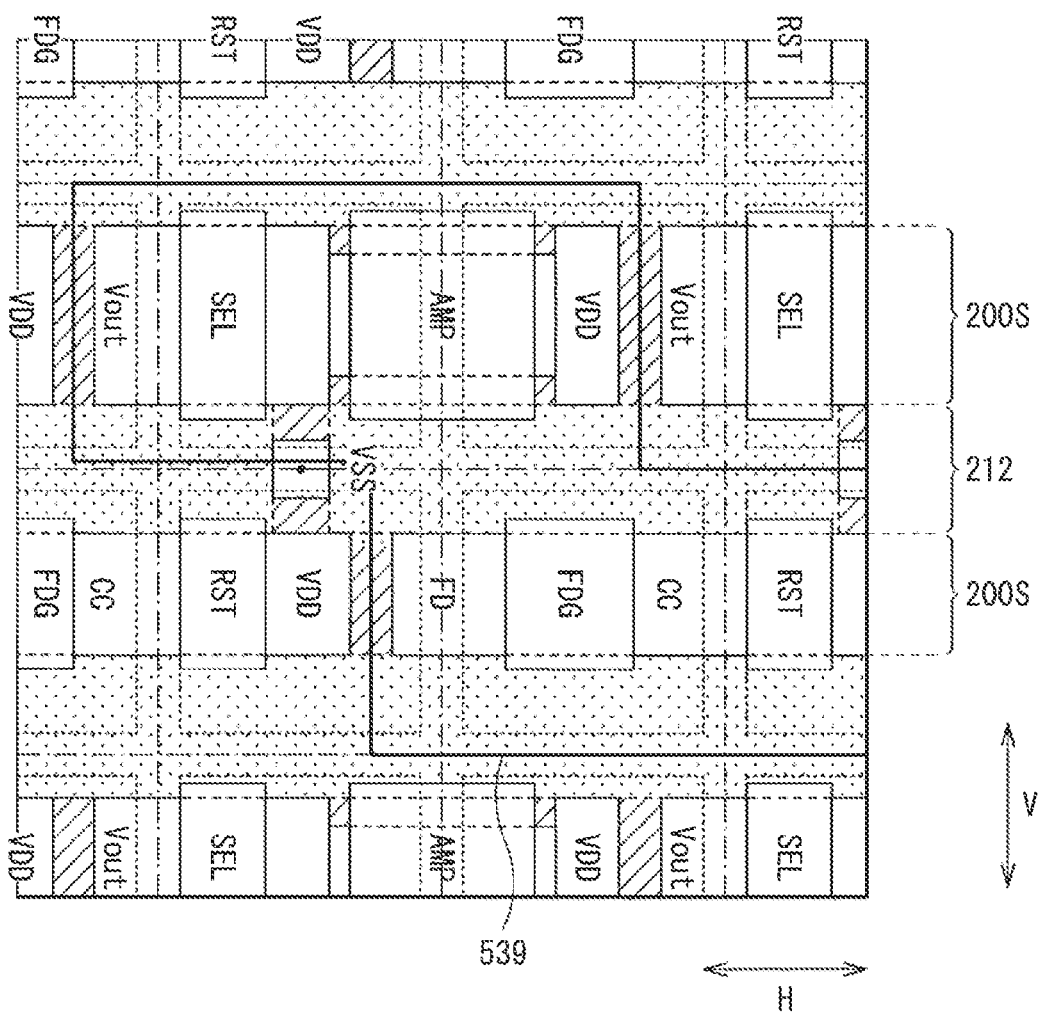
FIG. 27 is a schematic diagram illustrating an example of a planar configuration of the second substrate (semiconductor layer) stacked on the first substrate illustrated in FIG. 26.
Figure 28:
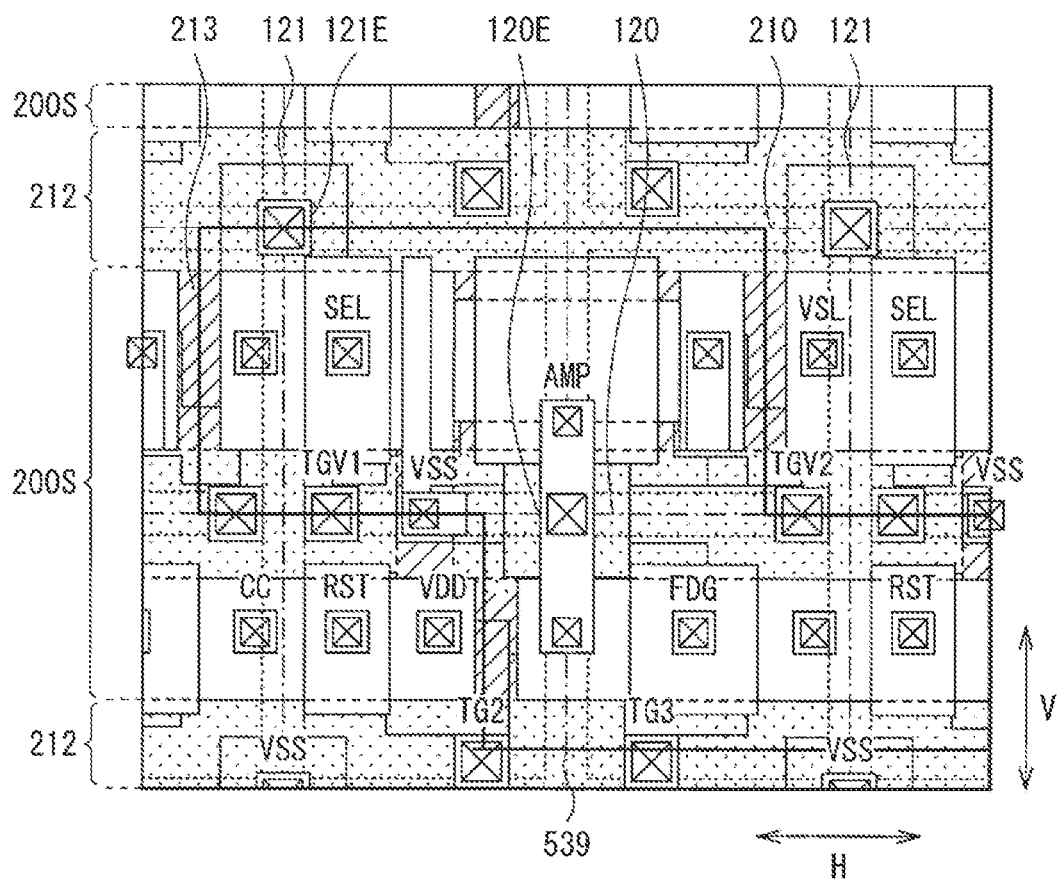
FIG. 28 is a schematic diagram illustrating an example of a planar configuration of the first wiring layer together with the pixel circuit illustrated in FIG. 27.
Figure 29:
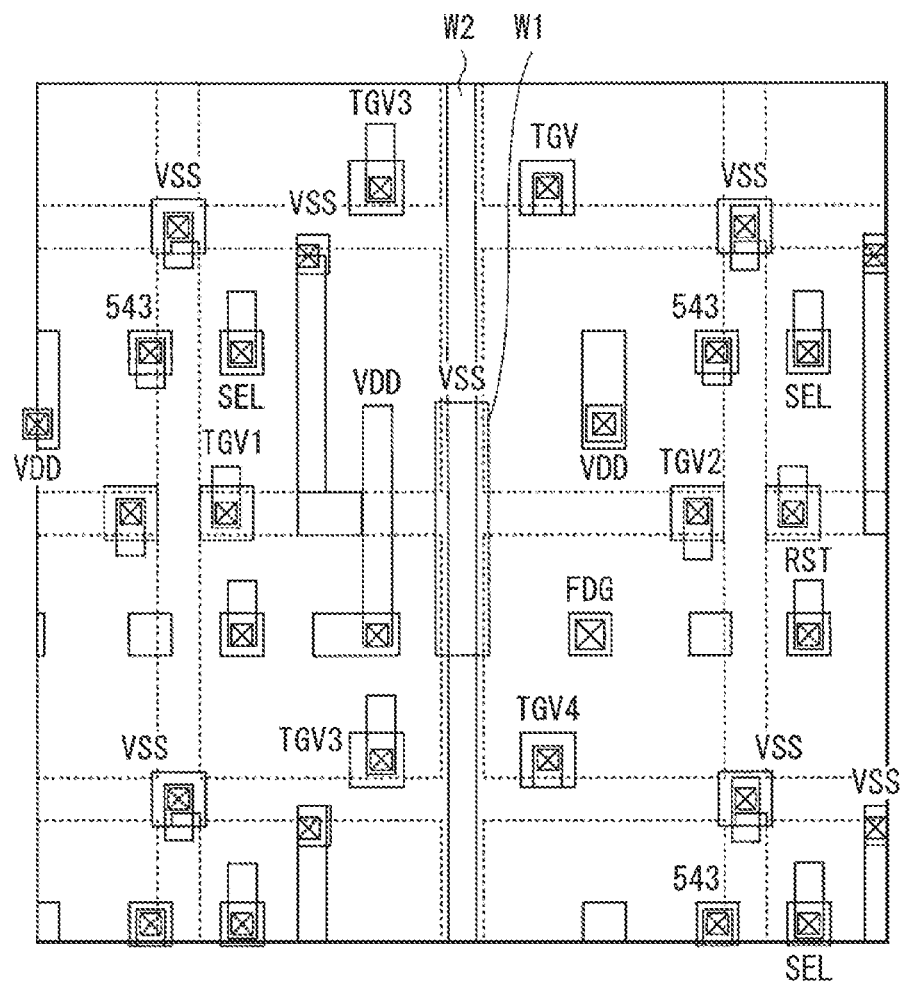
FIG. 29 is a schematic diagram illustrating an example of a planar configuration of the second wiring layer together with the first wiring layer illustrated in FIG. 28.
Figure 30:
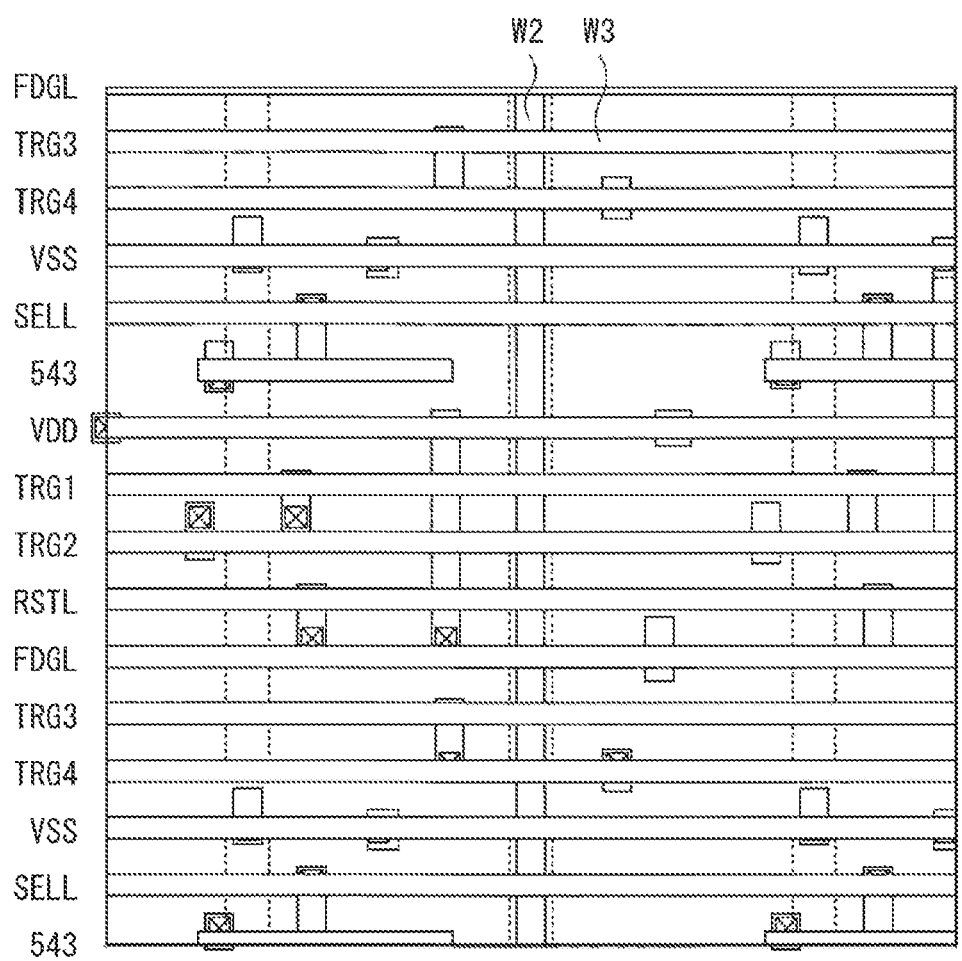
FIG. 30 is a schematic diagram illustrating an example of a planar configuration of the third wiring layer together with the second wiring layer illustrated in FIG. 29.
Figure 31:
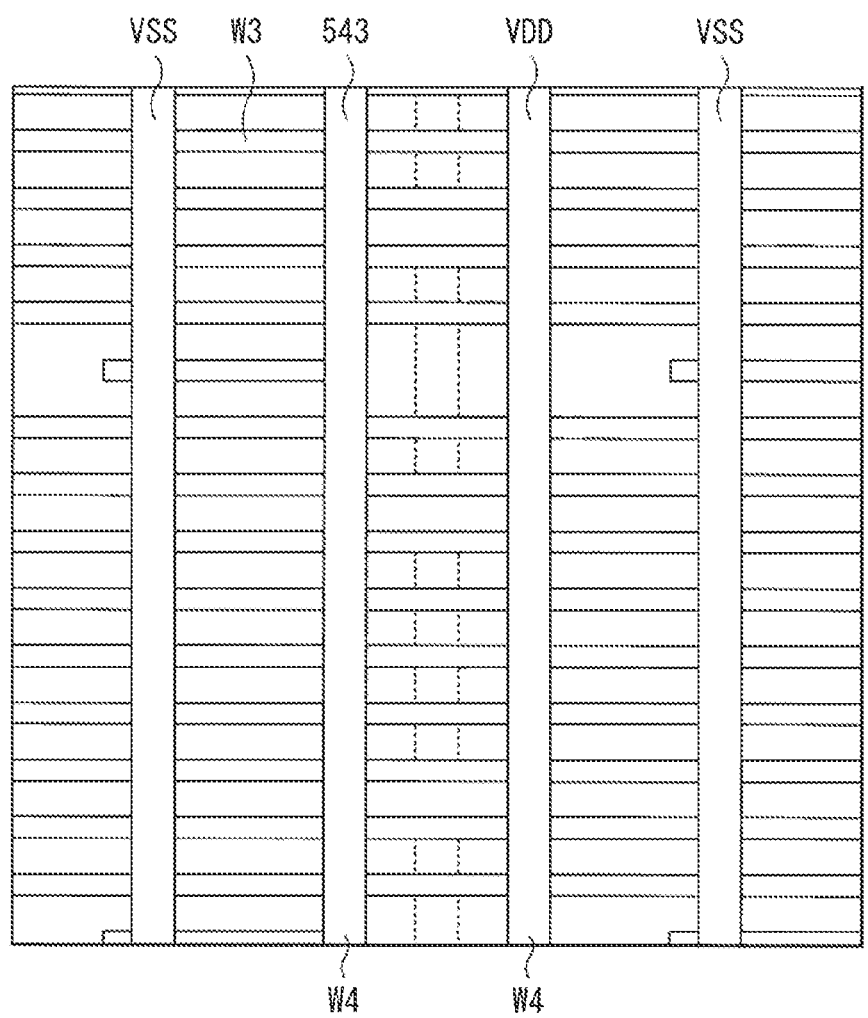
FIG. 31 is a schematic diagram illustrating an example of a planar configuration of the fourth wiring layer together with the third wiring layer illustrated in FIG. 30.

FIGS. 26 to 31 illustrate a modification of the planar configuration of the imaging device 1 according to the above embodiment. FIG. 26 schematically illustrates a planar configuration of the first substrate 100, and corresponds to FIG. 7B described in the above embodiment. FIG. 27 schematically illustrates a planar configuration in the vicinity of the front surface of the semiconductor layer 200S of the second substrate 200, and corresponds to FIG. 8 described in the above embodiment. FIG. 28 schematically illustrates a configuration of each of portions of the first wiring layer W1, the semiconductor layer 200S connected to the first wiring layer W1, and the first substrate 100, and corresponds to FIG. 9 described in the above embodiment. FIG. 29 illustrates an example of a planar configuration of the first wiring layer W1 and the second wiring layer W2, and corresponds to FIG. 10 described in the above embodiment. FIG. 30 illustrates an example of a planar configuration of the second wiring layer W2 and the third wiring layer W3, and corresponds to FIG. 11 described in the above embodiment. FIG. 31 illustrates an example of a planar configuration of the third wiring layer W3 and the fourth wiring layer W4, and corresponds to FIG. 12 described in the above embodiment.

In the present modification, the semiconductor layer 200S of the second substrate 200 extends in the H direction (FIG. 28). That is, this configuration substantially corresponds to the configuration in which the planar configuration of the imaging device 1 illustrated in FIG. 21 and the like is rotated by 90 degrees.

For example, similarly to the description in the above embodiment, the pixel sharing unit 539 of the first substrate 100 is formed over a pixel region of 2 rows×2 columns, and has a substantially square planar shape (FIG. 26). For example, in each of the pixel sharing units 539, the transfer gates TG1 and TG2 of the respective pixel 541A and the pixel 541B of one pixel row extend toward the central portion of the pixel sharing unit 539 in the V direction, while the transfer gates TG3 and TG4 of the respective pixel 541C and the pixel 541D of the other pixel row extend in the outer direction of the pixel sharing unit 539 in the V direction. The pad portion 120 connected to the floating diffusion FD is provided at a central portion of the pixel sharing unit 539, while the pad portion 121 connected to the VSS contact region 118 is provided at an end of the pixel sharing unit 539 at least in the V direction (in the V direction and the H direction in FIG. 26). At this time, the positions in the V direction of the through-substrate electrodes TGV1 and TGV2 of the transfer gates TG1 and TG2 are closer to the positions in the V direction of the through-substrate electrode 120E, and the positions in the V direction of the through-substrate electrodes TGV3 and TGV4 of the transfer gates TG3 and TG4 are closer to the positions in the V direction of the through-substrate electrode 121E (FIG. 28). Therefore, the width (the size in the V direction) of the semiconductor layer 200S extending in the H direction can be increased for the reason similar to the description in the above embodiment. This makes it possible to increase the size of the amplification transistor AMP and suppress noise.

In each of the pixel circuits 210, the selection transistor SEL and the amplification transistor AMP are arranged side by side in the H direction, while the reset transistor RST is arranged at a position adjacent in the V direction with and interposed between the selection transistor SEL and the insulating region 212 (FIG. 27). The FD conversion gain switching transistor FDG is arranged side by side with the reset transistor RST in the H direction. The VSS contact region 218 is provided in an island shape in the insulating region 212. For example, the third wiring layer W3 extends in the H direction (FIG. 30), and the fourth wiring layer W4 extends in the V direction (FIG. 31).

The imaging device 1 including such a second substrate 200 can also obtain the effects similar to those described in the above embodiment. The arrangement of the pixel sharing unit 539 of the second substrate 200 is not limited to the arrangement described in the above embodiment and the present modification. For example, the semiconductor layer 200S described in the above embodiment and first modification may extend in the H direction.

5. Fourth Modification

Figure 32:
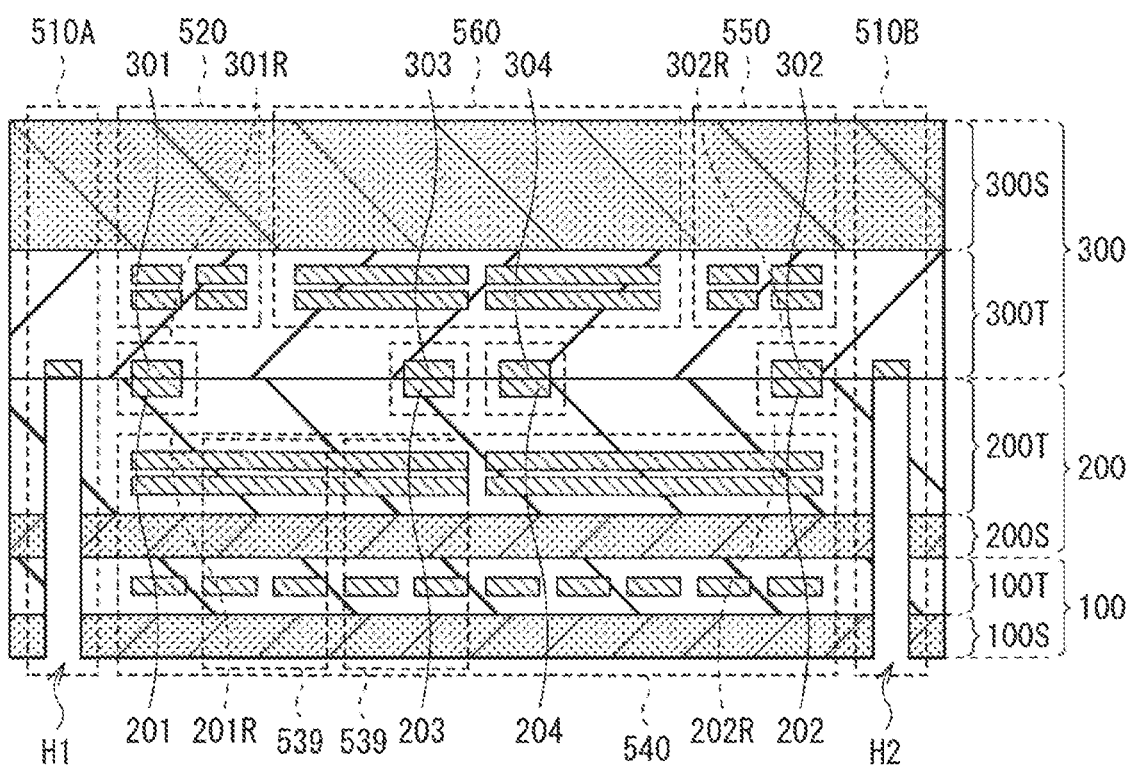
FIG. 32 is a schematic cross-sectional view illustrating another example of the imaging device illustrated in FIG. 3.

FIG. 32 schematically illustrates a modification of the cross-sectional configuration of the imaging device 1 according to the above embodiment. FIG. 32 corresponds to FIG. 3 described in the above embodiment. In the present modification, in addition to the contact portions 201, 202, 301, and 302, the imaging device 1 includes contact portions 203, 204, 303, and 304 at positions facing the central portion of the pixel array unit 540. In this respect, the imaging device 1 of the present modification is different from the imaging device 1 described in the above embodiment.

The contact portions 203 and 204 are provided on the second substrate 200, and are exposed on a bonding surface with the third substrate 300. The contact portions 303 and 304 are provided on the third substrate 300 and are exposed on a bonding surface with the second substrate 200. The contact portion 203 is in contact with the contact portion 303, while the contact portion 204 is in contact with the contact portion 304. That is, in the imaging device 1, the second substrate 200 and the third substrate 300 are connected by the contact portions 203, 204, 303, and 304 in addition to the contact portions 201, 202, 301, and 302.

Figure 33:
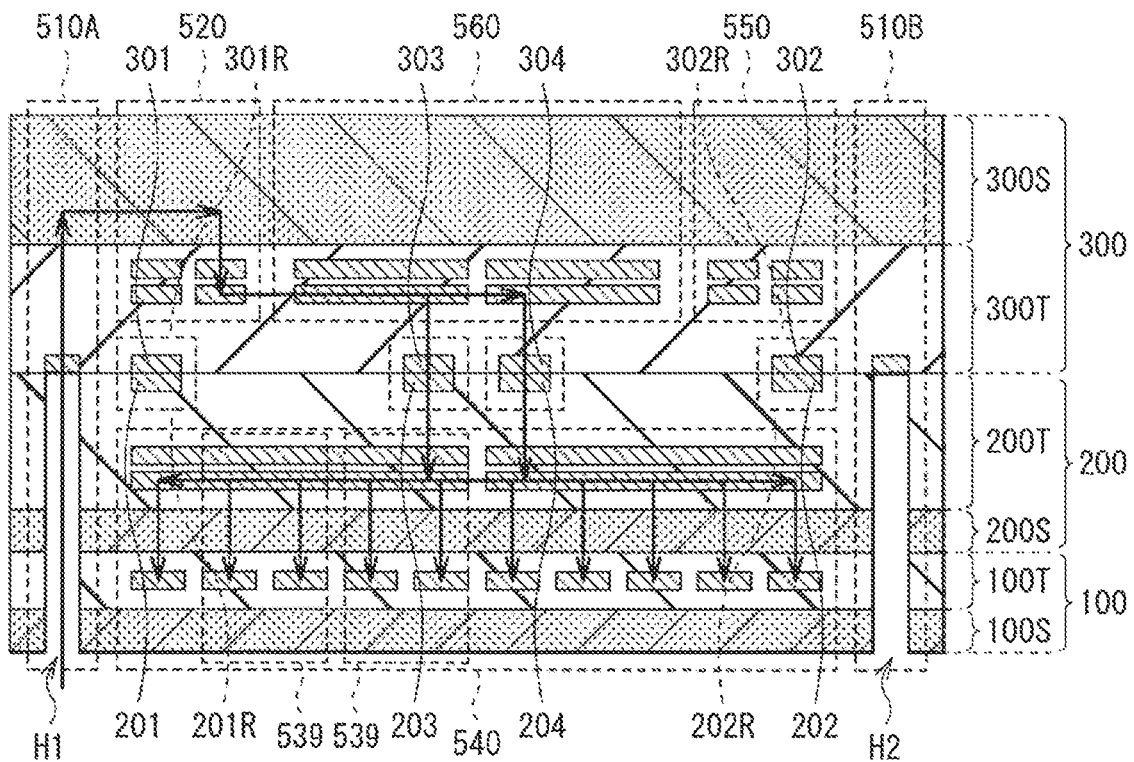
FIG. 33 is a schematic diagram illustrating a route of an input signal to the imaging device illustrated in FIG. 32.
Figure 34:
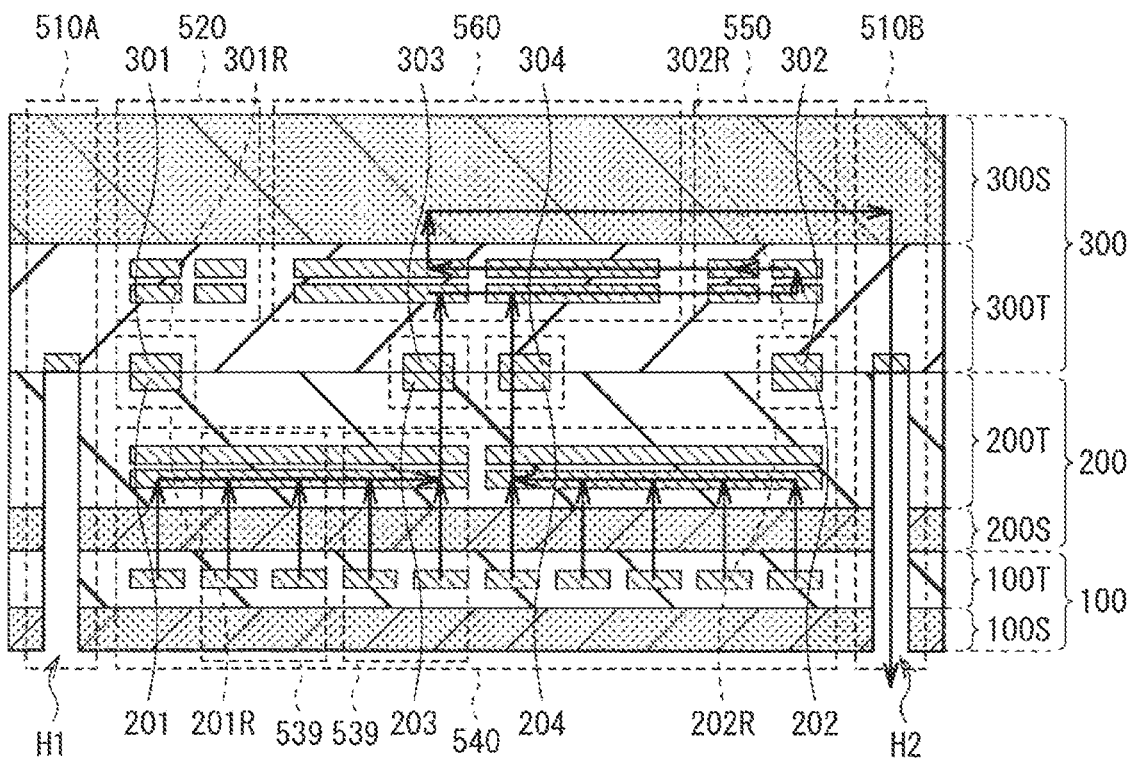
FIG. 34 is a schematic diagram illustrating a signal route of a pixel signal of the imaging device illustrated in FIG. 32.

Next, operation of the imaging device 1 will be described with reference to FIGS. 33 and 34. In FIG. 33, routes of an input signal input to the imaging device 1 from the outside and routes of a power supply potential and a reference potential are indicated by arrows. In FIG. 34, a signal route regarding a pixel signal output from the imaging device 1 to the outside is indicated by arrows. For example, an input signal input to the imaging device 1 via the input unit 510A is transmitted to the row drive unit 520 of the third substrate 300 to allow the row drive unit 520 to generate a row drive signal. The row drive signal is sent to the second substrate 200 via the contact portions 303 and 203. Furthermore, the row drive signal reaches each of the pixel sharing units 539 of the pixel array unit 540 via the row drive signal line 542 in the wiring layer 200T. Among the row drive signals reaching the pixel sharing unit 539 of the second substrate 200, drive signals other than those for the transfer gate TG are input to the pixel circuit 210 so as to drive each of transistors included in the pixel circuit 210. The drive signal for the transfer gate TG is input to the transfer gates TG1, TG2, TG3, and TG4 of the first substrate 100 via the through-substrate electrode TGV so as to drive the pixels 541A, 541B, 541C, and 541D. Furthermore, the power supply potential and the reference potential supplied from the outside of the imaging device 1 to the input unit 510A (input terminal 511) of the third substrate 300 are sent to the second substrate 200 via the contact portions 303 and 203, and supplied to the pixel circuit 210 of each of the pixel sharing units 539 via the wiring in the wiring layer 200T. The reference potential is further supplied to the pixels 541A, 541B, 541C, and 541D of the first substrate 100 via the through-substrate electrode 121E. On the other hand, the pixel signal photoelectrically converted by the pixels 541A, 541B, 541C, and 541D of the first substrate 100 is sent to the pixel circuit 210 of the second substrate 200 for each of the pixel sharing units 539. The pixel signal based on this pixel signal is sent from the pixel circuit 210 to the third substrate 300 via the vertical signal line 543 and the contact portions 204 and 304. This pixel signal is processed by the column signal processing unit 550 and the image signal processing unit 560 of the third substrate 300, and then output to the outside via the output unit 510B.

The imaging device 1 including such contact portions 203, 204, 303, and 304 can also obtain effects similar to those described in the above embodiment. The position, the number, and the like of the contact portions can be changed according to the design of the circuit and the like of the third substrate 300 to which the wiring lines are to be connected via the contact portions 303 and 304.

6. Fifth Modification

Figure 35:
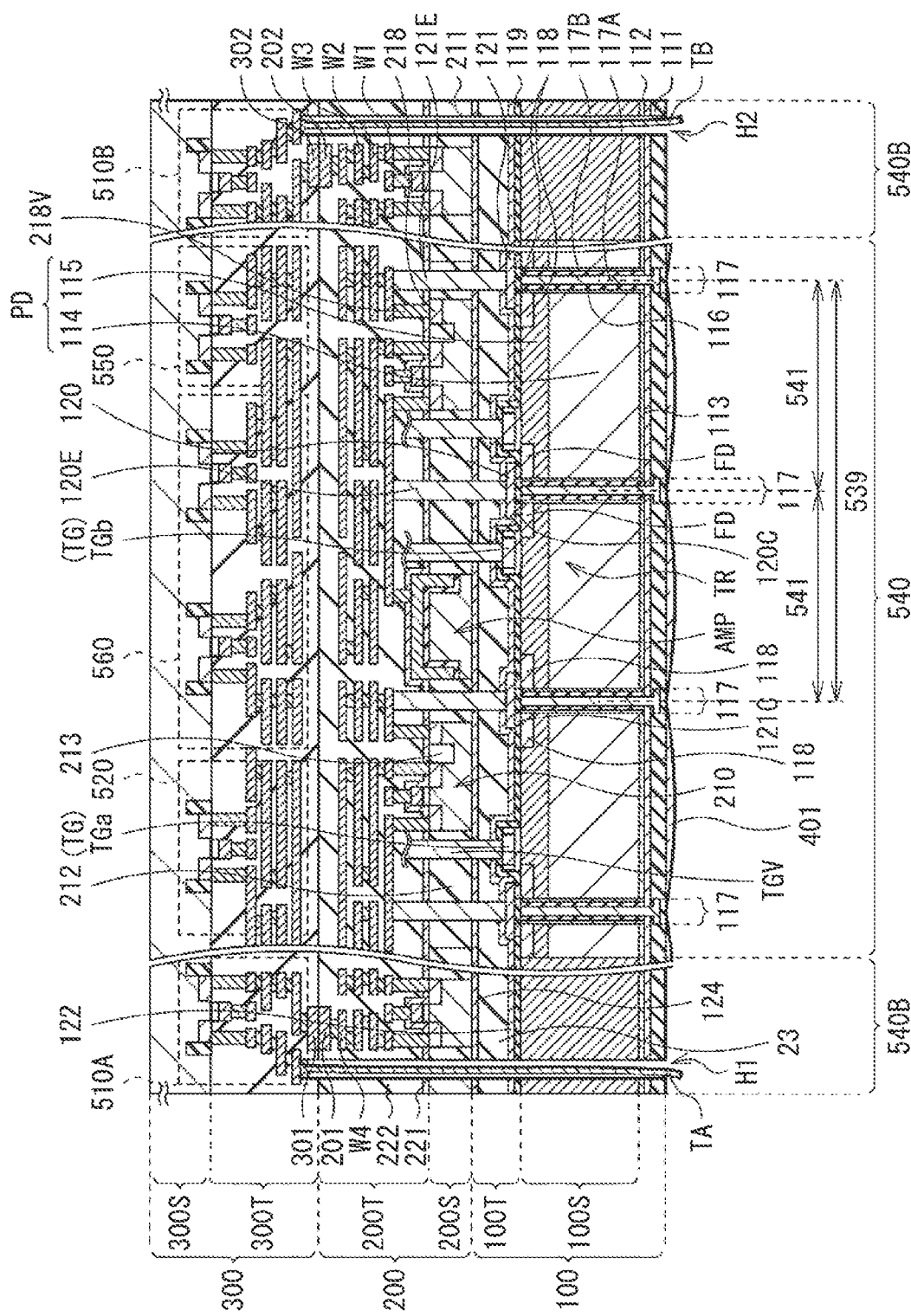
FIG. 35 is a schematic cross-sectional view illustrating another example of the imaging device illustrated in FIG. 6.

FIG. 35 illustrates a modification of the cross-sectional configuration of the imaging device 1 according to the above embodiment. FIG. 35 corresponds to FIG. 6 described in the above embodiment. In the present modification, the transfer transistor TR having a planar structure is provided on the first substrate 100. In this respect, the imaging device 1 of the present modification is different from the imaging device 1 described in the above embodiment.

In the transfer transistor TR, a transfer gate TG is configured only by the horizontal portion TGb. In other words, the transfer gate TG has no vertical portion TGa, and is provided to face the semiconductor layer 100S.

The imaging device 1 including the transfer transistor TR having such a planar structure can also obtain effects similar to those described in the above embodiment. Furthermore, it is also conceivable to form the photodiode PD closer to the front surface of the semiconductor layer 100S by providing the planar transfer gate TG on the first substrate 100 as compared with the case where the vertical transfer gate TG is provided on the first substrate 100, thereby increasing a saturation signal amount (Qs). In addition, the method of forming the planar transfer gate TG on the first substrate 100 can be considered to have a smaller number of manufacturing processes than the method of forming the vertical transfer gate TG on the first substrate 100 and have a less likelihood of occurrence of adverse effects due to the manufacturing processes, on the photodiode PD.

7. Sixth Modification

Figure 36:
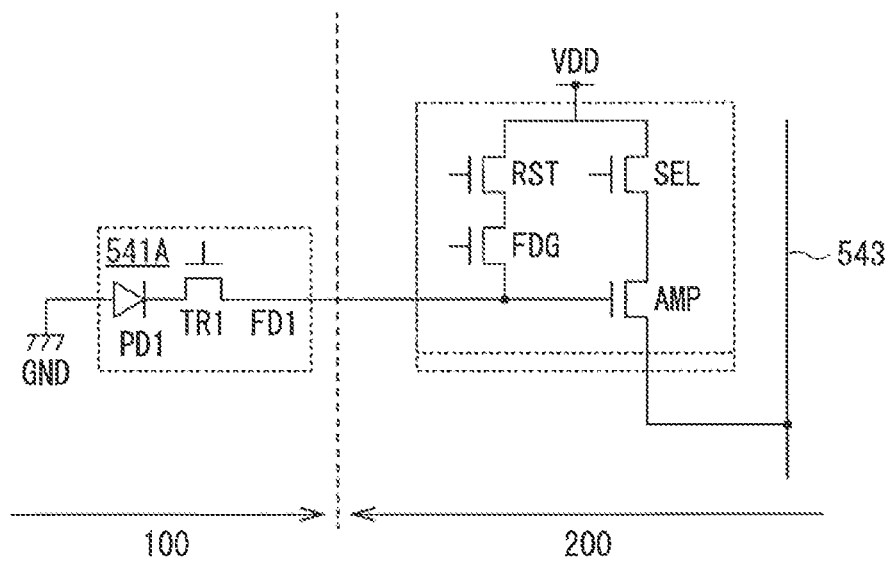
FIG. 36 is a diagram illustrating another example of the equivalent circuit illustrated in FIG. 4.

FIG. 36 illustrates a modification of the pixel circuit of the imaging device 1 according to the above embodiment. FIG. 36 corresponds to FIG. 4 described in the above embodiment. In the present modification, the pixel circuit 210 is provided for each pixel (pixel 541A). That is, the pixel circuit 210 is not shared by a plurality of pixels. In this respect, the imaging device 1 of the present modification is different from the imaging device 1 described in the above embodiment.

The imaging device 1 of the present modification is the same as the imaging device 1 described in the above embodiment in that the pixel 541A and the pixel circuit 210 are provided on different substrates (the first substrate 100 and the second substrate 200). Therefore, the imaging device 1 according to the present modification can also obtain effects similar to those described in the above embodiment.

8. Seventh Modification

Figure 37:
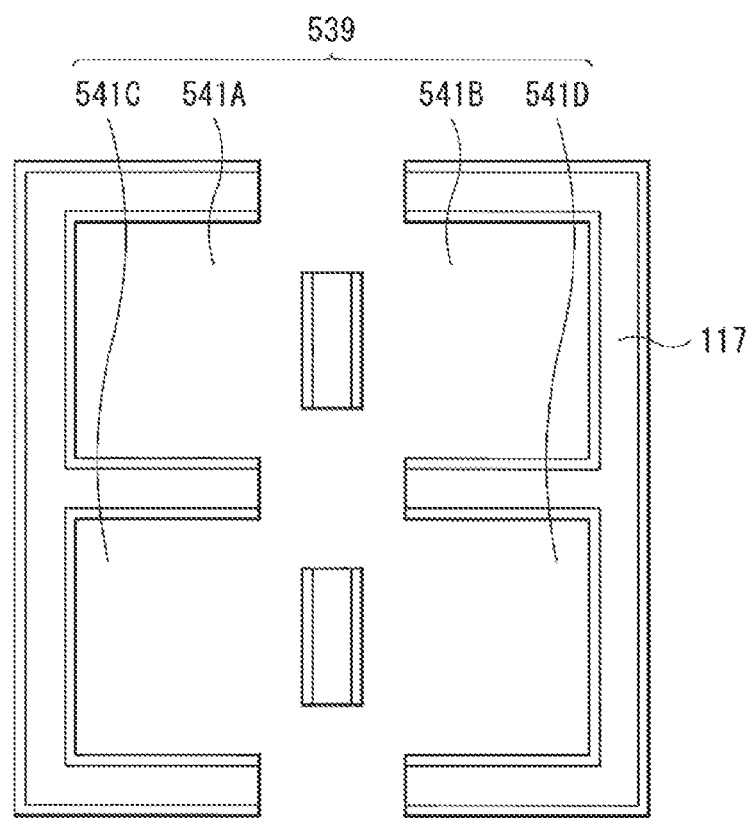

FIG. 37 illustrates a modification of the planar configuration of the pixel isolation portion 117 described in the above embodiment. The pixel isolation portion 117 surrounding each of the pixels 541A, 541B, 541C, and 541D may have gaps. That is, the entire circumference of the pixels 541A, 541B, 541C, and 541D does not have to be surrounded by the pixel isolation portion 117. For example, the gaps of the pixel isolation portion 117 are provided in the vicinity of the pad portions 120 and 121 (refer to FIG. 7B).

The above embodiment is an example in which the pixel isolation portion 117 has the FTI structure penetrating the semiconductor layer 100S (refer to FIG. 6). Alternatively, the pixel isolation portion 117 may have a configuration other than the FTI structure. For example, the pixel isolation portion 117 does not have to completely penetrate the semiconductor layer 100S, and may have a structure referred to as a deep trench isolation (DTI) structure.

9. Eighth Modification

Meanwhile, in the embodiments described above, the pixel circuit 210 including the amplification transistor AMP, the reset transistor RST, and the selection transistor SEL is supposed to be provided on the second substrate 200. In other words, in the embodiments described above, the amplification transistor AMP, the reset transistor RST, and the selection transistor SEL are formed on the same substrate 200. However, in the embodiment of the present disclosure, for example, it is allowable to use two stacked substrates instead of one second substrate 200. In this case, at least one transistor among the transistors included in the pixel circuit 210 may be provided on one substrate of the stacked substrates, while the remaining transistors may be provided on the other substrate. Specifically, it is allowable to use stacked substrates, namely, a lower substrate 2100 and an upper substrate 2200 (refer to FIG. 38) instead of the one second substrate 200, for example. In this case, formation of an interlayer insulating film 53 and wiring is performed on the lower substrate 2100, and then the upper substrate 2200 is further stacked on the lower substrate 2100. The upper substrate 2200 is stacked on the side of the lower substrate 2100 opposite to the surface facing a semiconductor substrate 11, enabling desired transistors to be provided. As an example, the amplification transistor AMP can be formed on the lower substrate 2100, while the reset transistor RST and/or the selection transistor SEL can be formed on the upper substrate 2200.

In the embodiment of the present disclosure, it is allowable to use three or more stacked substrates instead of one second substrate 200. In addition, a desired transistor among the plurality of transistors included in the pixel circuit 210 may be provided on each of the stacked substrates. In this case, the type of the transistors provided on the stacked substrates is not limited.

In this manner, by using a plurality of stacked substrates instead of one second substrate 200, the area used for the pixel circuit 210 can be reduced. Furthermore, by reducing the area of the pixel circuit 210 and miniaturizing individual transistors, the area of the chips constituting the imaging device 1 can also be reduced. In such a case, the area of only a desired transistor among the amplification transistor AMP, the reset transistor RST, and the selection transistor SEL capable of constituting the pixel circuit 210 may be increased. For example, increasing the area of the amplification transistor AMP leads to reduction of noise.

Figure 38:
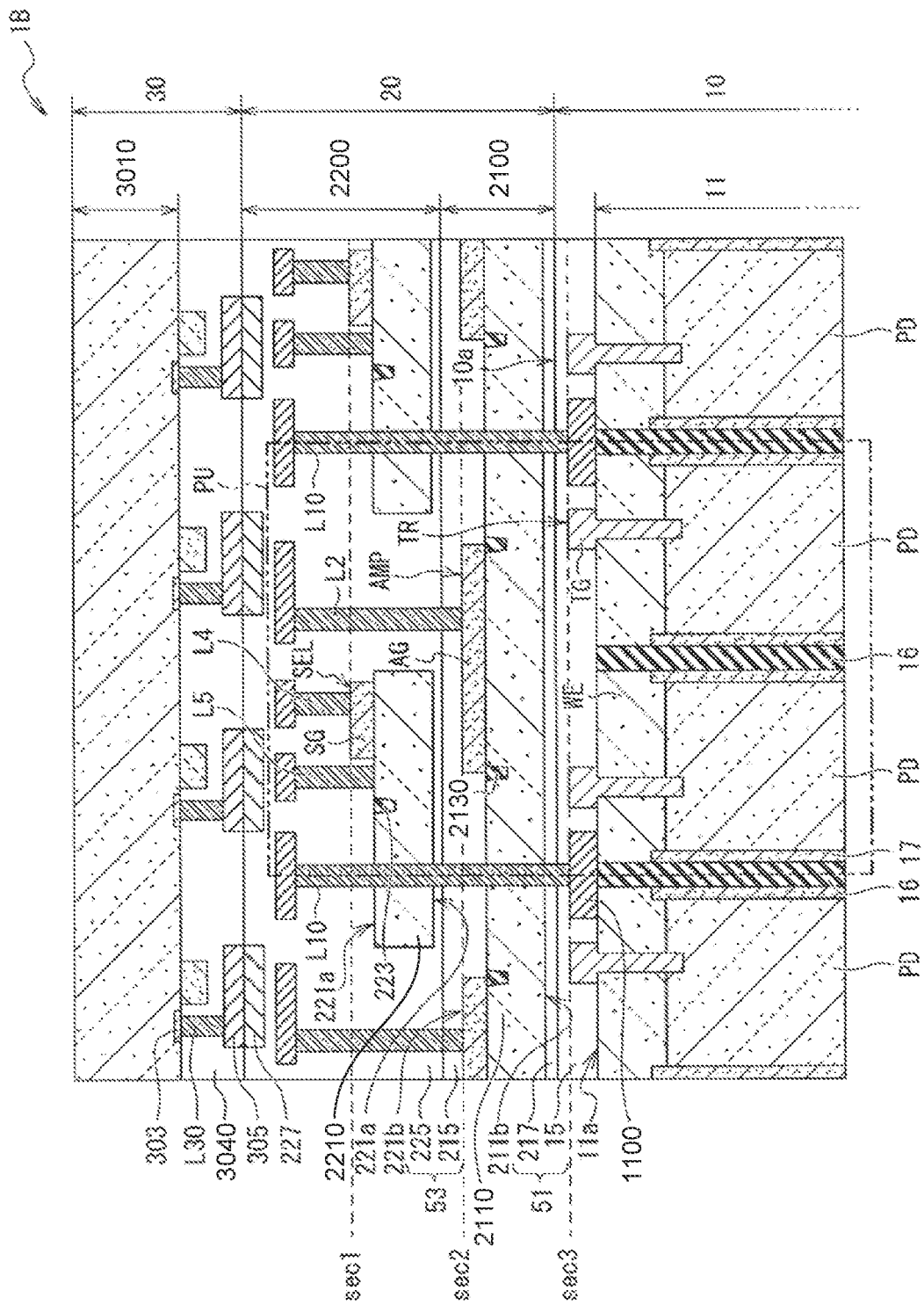
FIG. 38 is a cross-sectional view in a thickness direction illustrating a configuration example of an imaging device according to an eighth modification of a first embodiment of the present disclosure.
Figure 39:
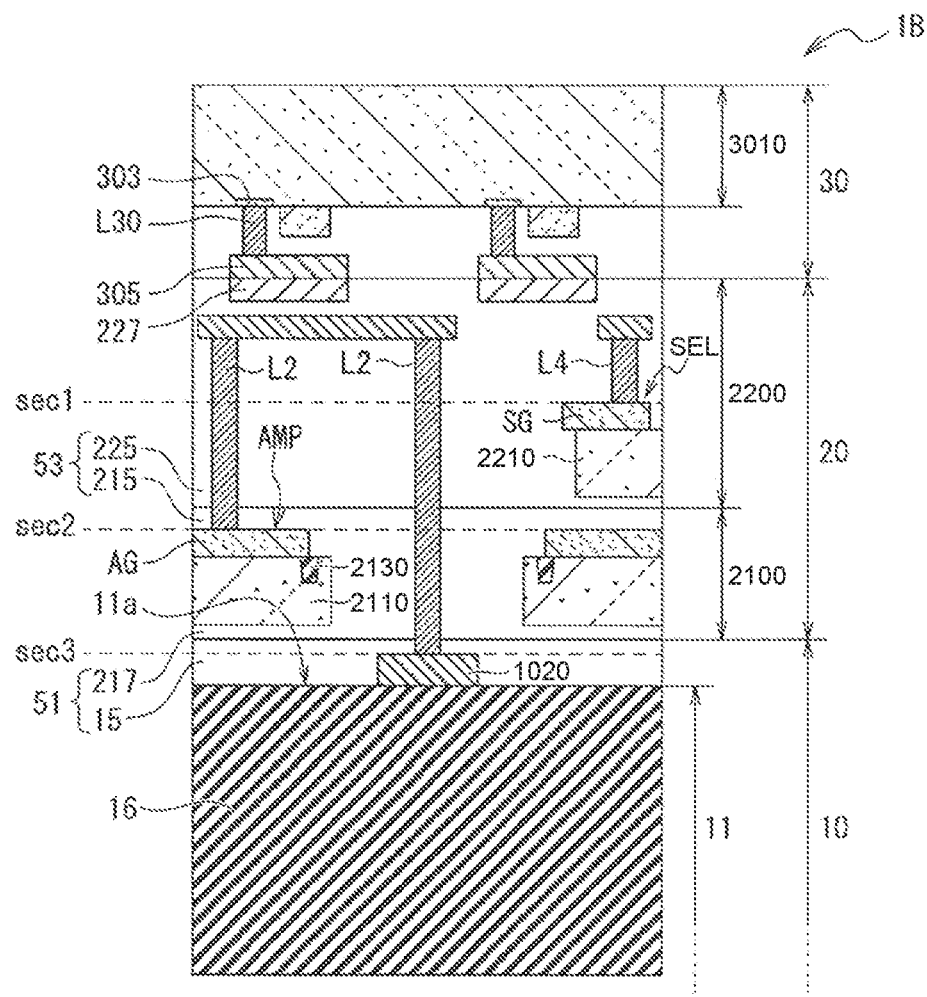
FIG. 39 is a cross-sectional view (part 1) in a thickness direction illustrating a configuration example of the imaging device according to the eighth modification of the first embodiment of the present disclosure.
Figure 40:
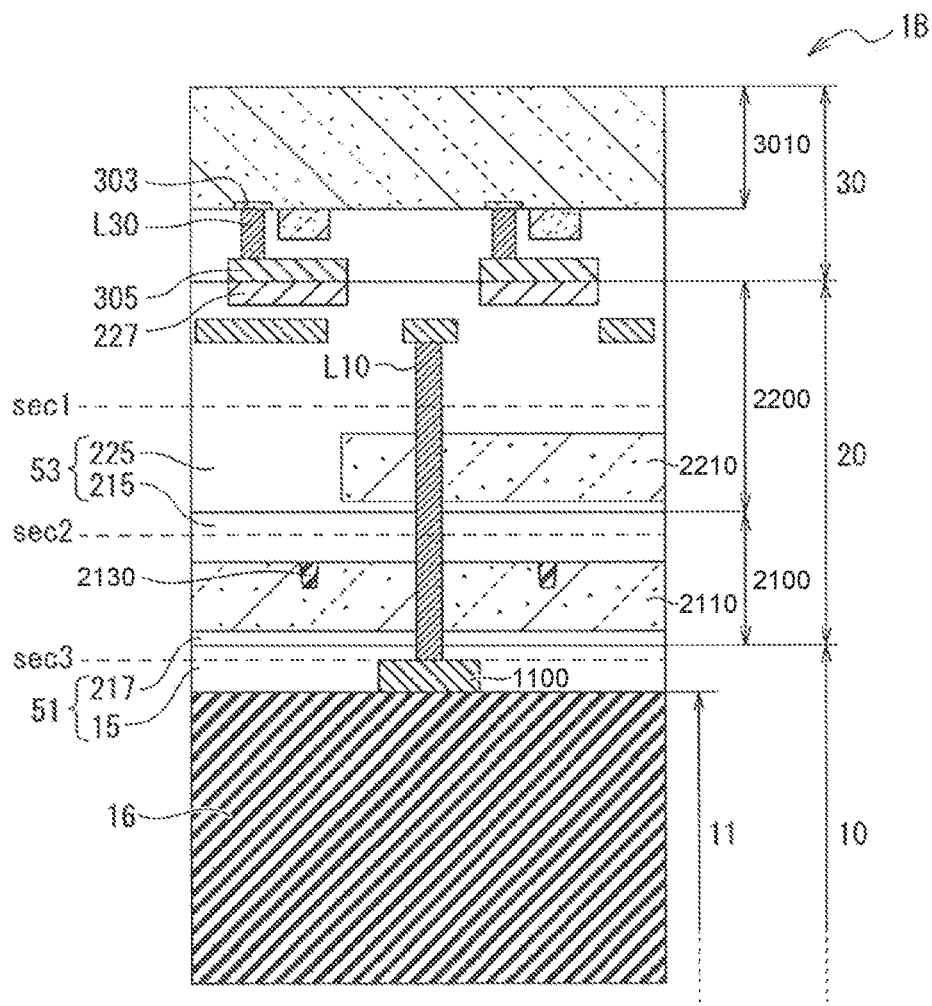
FIG. 40 is a cross-sectional view (part 2) in a thickness direction illustrating a configuration example of the imaging device according to the eighth modification of the first embodiment of the present disclosure.
Figure 41:
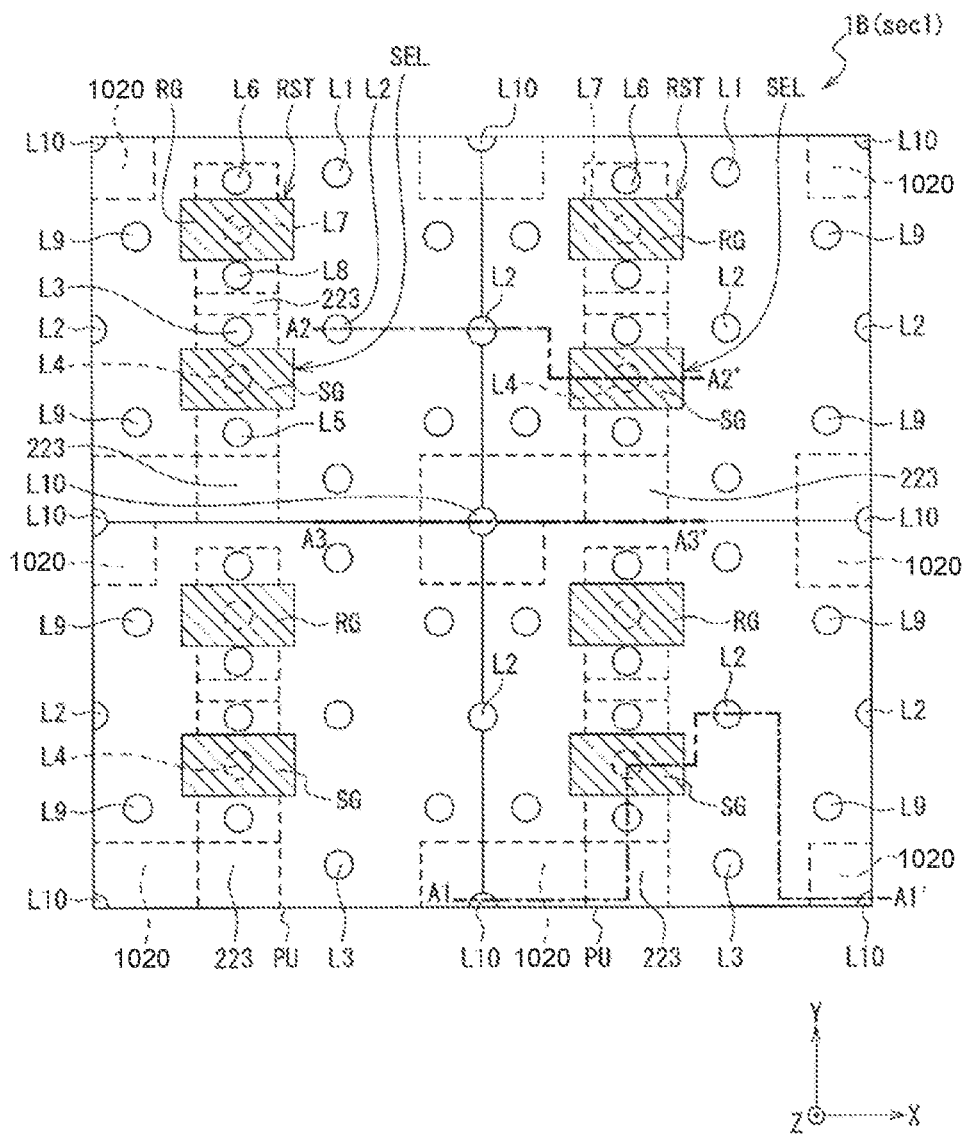
FIG. 41 is a cross-sectional view (part 1) in a horizontal direction illustrating a layout example of a plurality of pixel units according to the eighth modification of the first embodiment of the present disclosure.
Figure 42:
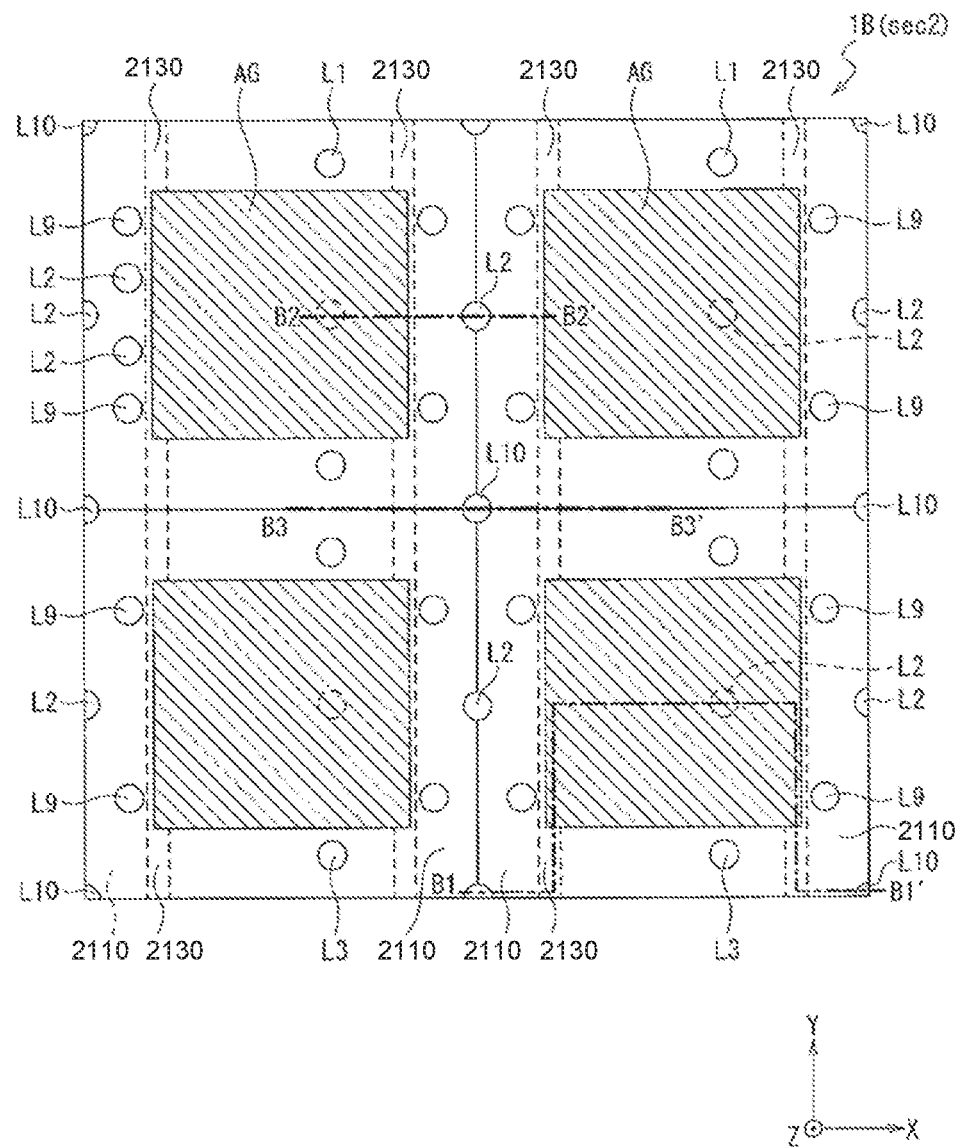
FIG. 42 is a cross-sectional view (part 2) in a horizontal direction illustrating a layout example of the plurality of pixel units according to the eighth modification of the first embodiment of the present disclosure.
Figure 43:
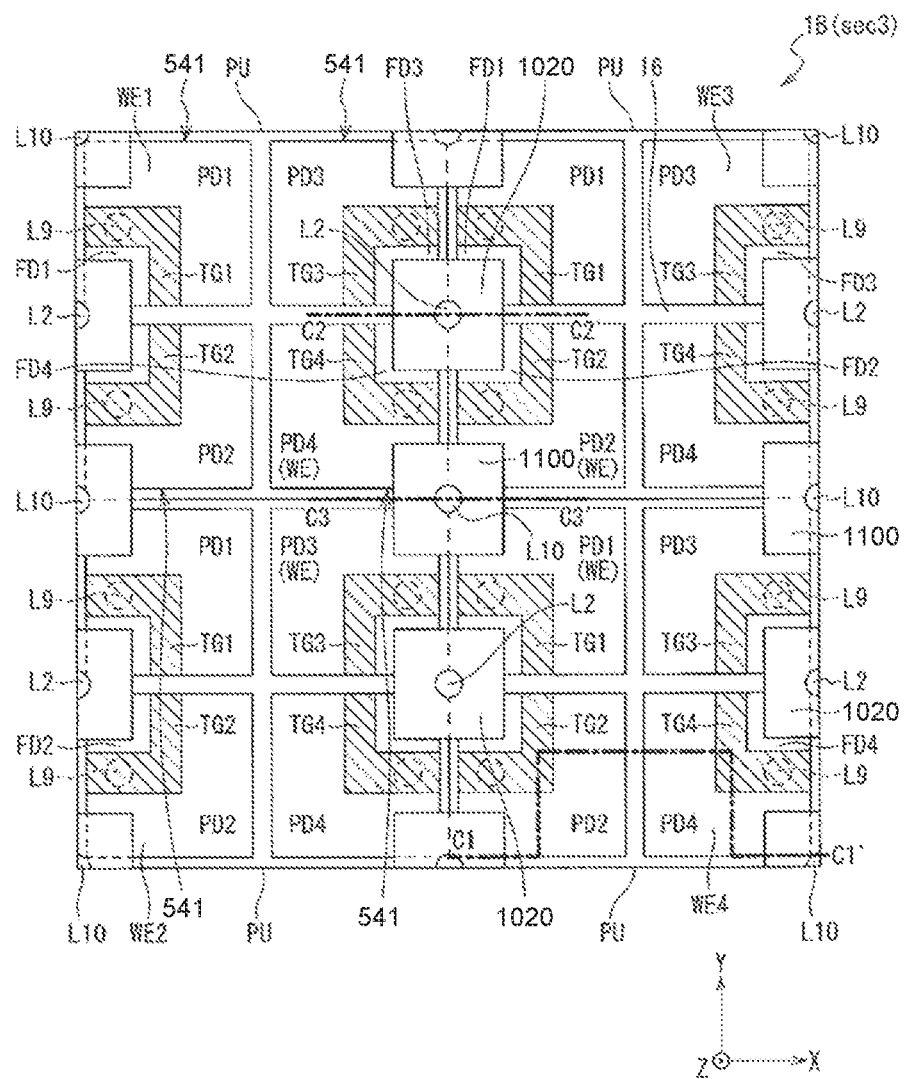
FIG. 43 is a cross-sectional view (part 3) in a horizontal direction illustrating a layout example of the plurality of pixel units according to the eighth modification of the first embodiment of the present disclosure.

An eighth modification in which two stacked substrates are used instead of one second substrate 200 will be described with reference to FIGS. 38 to 43. FIGS. 38 to 40 are cross-sectional views in the thickness direction illustrating a configuration example of an imaging device 1B according to the eighth modification of the present embodiment. FIGS. 41 to 43 are cross-sectional views in a horizontal direction illustrating exemplary layouts of a plurality of pixel units PU according to the eighth modification of the present embodiment. Note that the cross-sectional views illustrated in FIGS. 38 to 40 are merely schematic diagrams, and are not views intended to illustrate an actual structure with strict correctness. In the cross-sectional views illustrated in FIGS. 38 to 40, positions of the transistors and impurity diffusion layers in the horizontal direction are intentionally changed in positions sec1 to sec3 to facilitate illustrating the configuration of the imaging device 1B in the drawings.

Specifically, in the pixel unit PU of the imaging device 1B illustrated in FIG. 38, the cross section at the position sec1 is a cross section of FIG. 41 cut along line A1-A1', the cross section at the position sect is a cross section of FIG. 42 cut along line B1-B1', and the cross section at the position sec3 is a cross section of FIG. 43 cut along line C1-C1'. Similarly, in the imaging device 1B illustrated in FIG. 39, the cross section at the position sec1 is a cross section of FIG. 41 cut along line A2-A2', the cross section at the position sec2 is a cross section of FIG. 42 cut along line B2-B2', and the cross section at the position sec3 is a cross section of FIG. 43 cut along line C2-C2'. In the imaging device 1B illustrated in FIG. 40, the cross section at the position sec1 is a cross section of FIG. 41 cut along line A3-A3', the cross section at the position sec2 is a cross section of FIG. 42 cut along line B3-B3', and the cross section at the position sec3 is a cross section of FIG. 43 cut along line C3-C3'.

As illustrated in FIGS. 39 and 43, the imaging device 1B includes a common pad electrode 1020 disposed across the plurality of pixels 541 and one wiring line L2 provided on the common pad electrode 1020, as shared portions. For example, the imaging device 1B includes a region in which nodes of floating diffusion FD1 to FD4 of the four pixels 541 are adjacent to each other via an element isolation layer 16 in plan view. The common pad electrode 1020 is provided in this region. The common pad electrode 1020 is disposed across the four nodes of the floating diffusion FD1 to FD4, and is electrically connected to the four nodes of the floating diffusion FD1 to FD4, respectively. The common pad electrode 1020 is formed of a polysilicon film doped with an n type impurity or a p type impurity, for example.

On the central portion of the common pad electrode 1020, one wiring line L2 (that is, a floating diffusion contact) is provided. As illustrated in FIGS. 39 and 41 to 43, the wiring line L2 provided on the central portion of the common pad electrode 1020 extends from a first substrate portion 10 through the lower substrate 2100 of the second substrate portion 20 to reach the upper substrate 2200 of the second substrate portion 20, and is further connected to a gate electrode AG of the amplification transistor AMP via wiring and the like provided in the upper substrate 2200.

Furthermore, as illustrated in FIGS. 38 and 43, the imaging device 1B includes: a common pad electrode 1100 disposed across the plurality of pixels 541; and one wiring line L10 provided on the common pad electrode 1100, as shared portions. For example, the imaging device 1B includes a region in which well layers WE of the four pixels 541 are adjacent to each other, in plan view, with the element isolation layer 16 interposed therebetween. The common pad electrode 1100 is provided in this region. The common pad electrode 1100 is disposed across each of the well layers WE of the four pixels 541 and is electrically connected to each of the well layers WE of the four pixels 541. As an example, the common pad electrode 1100 is disposed between one common pad electrode 1020 and another common pad electrode 1020 aligned in the Y-axis direction. In the Y-axis direction, the common pad electrodes 1020 and 1100 are alternately arranged. The common pad electrode 1100 is formed of a polysilicon film doped with an n type impurity or a p type impurity, for example.

The one wiring line L10 (that is, well contact) is provided on the central portion of the common pad electrode 1100. As illustrated in FIGS. 38, 40, and 41 to 43, the wiring line L10 provided on the central portion of the common pad electrode 1100 extends from the first substrate portion 10 through the lower substrate 2100 of the second substrate portion 20 to reach the upper substrate 2200 of the second substrate portion 20, and is further connected to a reference potential line that supplies a reference potential (for example, ground potential: 0 V) through wiring or the like provided in the upper substrate 2200.

The wiring line L10 provided on the central portion of the common pad electrode 1100 is electrically connected to the upper surface of the common pad electrode 1100, the inner surface of a through hole provided in the lower substrate 2100, and the inner surface of a through hole provided in the upper substrate 2200, individually. With this configuration, the well layer WE of the semiconductor substrate 11 of the first substrate portion 10, the well layer of the lower substrate 2100 of the second substrate portion 20, and the well layer of the upper substrate 2200 are connected to the reference potential (for example, ground potential: 0 V).

The imaging device 1B according to the present modification has effects similar to the case of the imaging device 1 according to the embodiment of the present disclosure described above. Furthermore, the imaging device 1B further includes the common pad electrodes 1020 and 1100 provided on a front surface 11a side of the semiconductor substrate 11 constituting the first substrate portion 10 so as to be disposed across a plurality of (for example, four) pixels 541 adjacent to each other. The common pad electrode 1020 is electrically connected to the nodes of the floating diffusion FD of the four pixels 541. The common pad electrode 1100 is electrically connected to the well layers WE of the four pixels 541. With this configuration, the wiring line L2 connected to the floating diffusion FD can be used in common by a unit of the four pixels 541. This allows the wiring line L10 connected to the well layer WE to be used in common by the unit of the four pixels 541. This enables reduction of the number of wiring lines L2 and L10, leading to the decrease in the area of the pixel 541 and miniaturization of the imaging device 1B.

10. Second Embodiment

Figure 44:
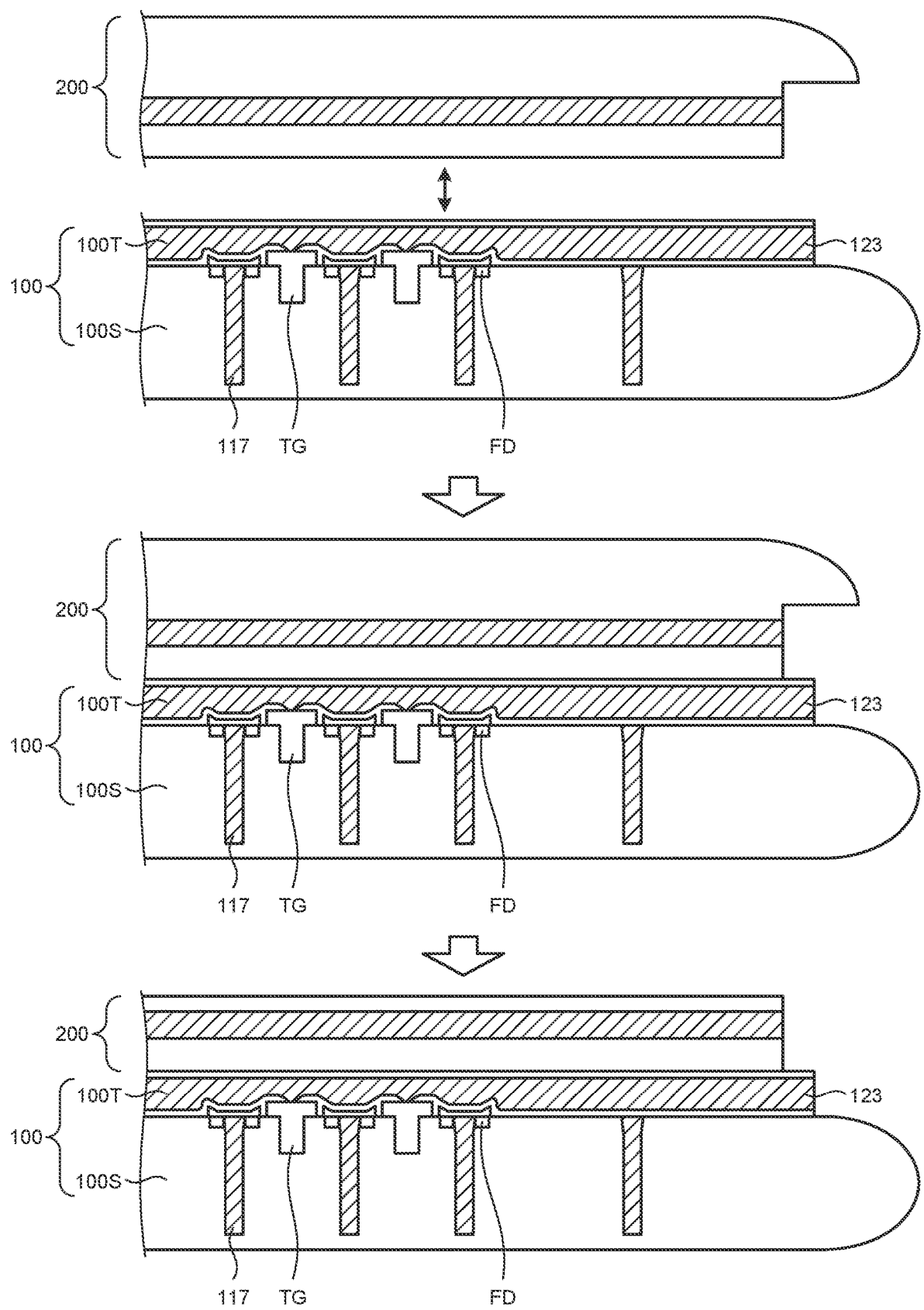
FIG. 44 is a process cross-sectional view illustrating a method of manufacturing the imaging device illustrated in FIG. 3.

The present inventors continued intensive studies to achieve further improvement over the imaging device 1 according to the first embodiment as described above, specifically, further suppression of manufacturing cost and the time related to the manufacturing process with further suppression of resource consumption, and have devised an imaging device 1 according to a second embodiment of the present disclosure. Hereinafter, details of achievement of the techniques of the second embodiment of the present disclosure devised by the present inventors will be described with reference to FIG. 44. FIG. 44 is a process cross-sectional view illustrating a method of manufacturing the imaging device 1 illustrated in FIG. 3. For the sake of clarity, FIG. 44 illustrates only the main part of the imaging device 1 related to the second embodiment, and omits illustrations of the other parts.

First, regarding the method of manufacturing the imaging device 1 illustrated in FIG. 3, as illustrated in the drawing at the top of FIG. 44, the first substrate 100 on which the photodiode (not illustrated), the floating diffusion FD, the transfer gate TG, the pixel isolation portion 117, and the like are formed is bonded with the second substrate 200 via the interlayer insulating film 123. This leads to acquisition of a structure as illustrated in the drawing in the middle of FIG. 44.

Next, in the method of manufacturing the imaging device 1 illustrated in FIG. 3, processing of grinding or the like is performed on the second substrate 200 to thin the second substrate 200 as illustrated in the drawing at the bottom of FIG. 44. Thereafter, various transistors (for example, an amplification transistor AMP or the like) are formed on the second substrate 200, and subsequently the third substrate 300 (not illustrated) is bonded onto the second substrate 200.

However, since the method of manufacturing the imaging device 1 in FIG. 44 uses the three substrates 100, 200, and 300 and bonds the substrates 100, 200, and 300 to each other as described above, it is difficult to suppress an increase in manufacturing cost and an increase in time related to a manufacturing process. Furthermore, since the method of manufacturing the imaging device 1 in FIG. 44 thins the second substrate 200, the silicon layer and the like of the second substrate 200 not used as the imaging device 1 as a final product are removed by grinding, making it difficult to avoid an increase in consumption of resources such as silicon.

In view of such a situation, the present inventors continued intensive studies on a configuration and a manufacturing method of the imaging device 1 capable of suppressing an increase in manufacturing cost and an increase in time related to the manufacturing process and suppressing resource consumption, and have devised the second embodiment of the present disclosure. The present embodiment uses another method rather than the method in which the second substrate 200 on which the pixel circuit 210 including the amplification transistor AMP and the like is to be provided is bonded with the first substrate 100. Specifically, in the method of the present embodiment, an organic semiconductor layer 200Y (refer to FIG. 45) on which the pixel circuit 210 is to be provided is formed on the first substrate 100. With this configuration, in the present embodiment, instead of bonding the second substrate 200 to the first substrate 100, the organic semiconductor layer 200Y is formed on the first substrate 100, making it possible to avoid the use of one substrate 200. As a result, according to the present embodiment, it is possible to suppress an increase in manufacturing cost and an increase in time related to the manufacturing process. Furthermore, the present embodiment has no need to thin the second substrate 200, making it possible to suppress resource consumption as well. Hereinafter, the present embodiment like this will be sequentially described in detail. The following description will describe only the points different from the above-described first embodiment, and description of points common to the first embodiment will be omitted.

[Configuration]

Figure 45:
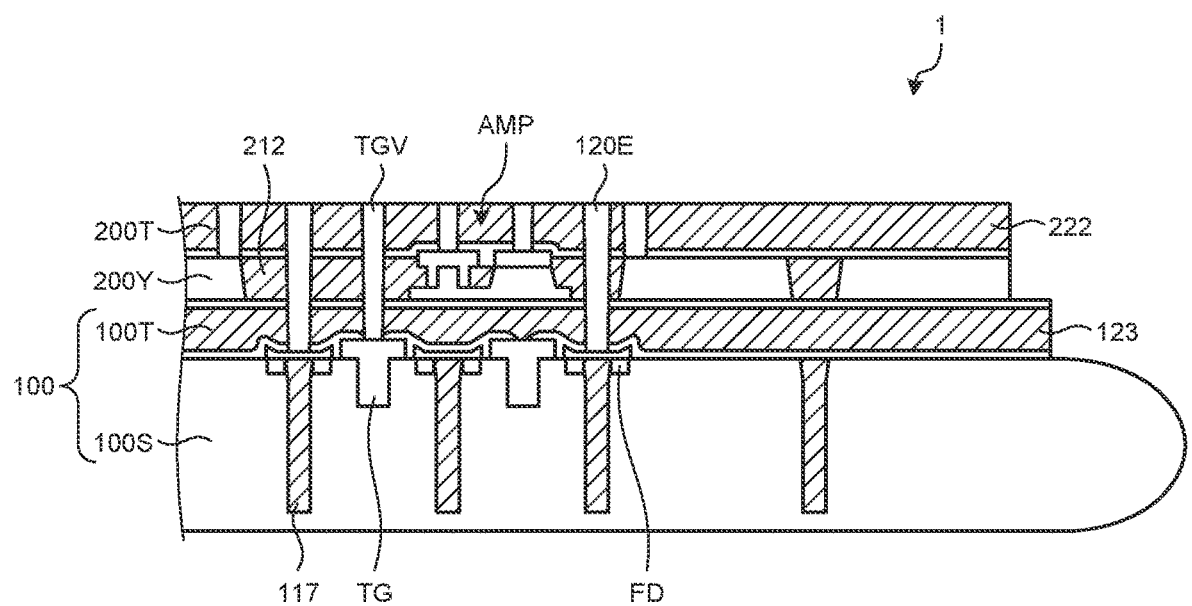
FIG. 45 is a schematic cross-sectional view illustrating an example of a main part of a configuration of an imaging device according to a second embodiment of the present disclosure.

First, the structure of the imaging device 1 according to the present embodiment will be described with reference to FIG. 45. FIG. 45 is a schematic cross-sectional view illustrating an example of a main part of the configuration of the imaging device 1 according to the present embodiment. For the sake of clarity, FIG. 45 illustrates only the main part of the imaging device 1 related to the present embodiment, and omits illustrations of the other parts.

As illustrated in FIG. 45, in the present embodiment, instead of the second substrate 200 of the first embodiment, the organic semiconductor layer (semiconductor layer) 200Y is provided on the first substrate 100, in other words, on the semiconductor layer 100S via the interlayer insulating film (insulating film) 123. The organic semiconductor layer 200Y is provided with a plurality of pixel transistors included in the pixel circuit 210 that reads out the charge held in the floating diffusion FD and outputs a pixel signal. Specifically, in the present embodiment, the pixel circuit 210 includes, for example, a reset transistor RST that resets the potential of the floating diffusion FD to a predetermined potential, and an amplification transistor AMP that outputs a pixel signal in accordance with the amount of charge held in the floating diffusion FD. Furthermore, the pixel circuit 210 includes a selection transistor SEL that controls the timing of outputting the pixel signal from the amplification transistor AMP.

In the present embodiment, the organic semiconductor layer 200Y can be formed of a low molecular weight organic semiconductor material, namely, a material selected from materials including a tetracene material, a naphthalene material, a pentacene material, a rubrene material, a thienoacene material, and the like, for example. Furthermore, the organic semiconductor layer 200Y can be formed of a polymer organic semiconductor material, namely, a material selected from materials including a polythiophene material (polythiophene and substituted polythiophene), a polyfluorene material (polyfluorene and substituted polyfluorene), a poly-hexylophene material (polyhexylophene and substituted polyhexylophene), and the like, for example.

More specifically, in a case where the organic semiconductor layer 200Y is formed as a p type organic semiconductor layer, the following materials can be exemplified as materials of the p type organic semiconductor layer. For example, the materials include naphthalene derivatives, anthracene derivatives, phenanthrene derivatives, pyrene derivatives, perylene derivatives, tetracene derivatives, pentacene derivatives, quinacridone derivatives, coumarin derivatives, pyrromethene derivatives, pyran derivatives, phenoxazone derivatives, thiophene derivatives, thienothiophene derivatives, benzothiophene derivatives, benzothienobenzothiophene (BTBT) derivatives, dinaphthothienothiophene (DNTT) derivatives, dianthracenothienothiophene (DATT) derivatives, benzobisbenzothiophene (BBBT) derivatives, naphthalene bisbenzothiophene (NBBT), thienobisbenzothiophene (TBBT) derivatives, dibenzothienobisbenzothiophene (DBTBT) derivatives, dithienobenzodithiophene (DTBDT) derivatives, dibenzo-thieno-dithiophene (DBTDT) derivatives, benzodithiophene (BDT) derivatives, naphthodithiophene (NDT) derivatives, anthracenodithiophene (ADT) derivatives, tetracenodithiophene (TDT) derivatives, pentacenodithiophene (PDT), triallylamine derivatives, carbazole derivatives, picene derivatives, chrysene derivatives, fluoranthene derivatives, phthalocyanine derivatives, subphthalocyanine derivatives, subporphyrazine derivatives, metal complexes having a heterocyclic compound as a ligand, polythiophene derivatives, polybenzothiadiazole derivatives, polyfluorene derivatives, and the like.

More specifically, in a case where the organic semiconductor layer 200Y is formed as an n type organic semiconductor layer, the following materials can be exemplified as materials of the n type organic semiconductor layer. For example, the materials include a heterocyclic compound containing a nitrogen atom, an oxygen atom, or a sulfur atom; for example, an organic molecule having a pyridine derivative, a pyrromethene derivative, a pyrazine derivative, a pyrimidine derivative, a triazine derivative, a quinoline derivative, a quinoxaline derivative, an isoquinoline derivative, a coumarin derivative, a pyran derivative, a phenoxazone derivative, a perylene derivative, an acridine derivative, a phenazine derivative, a phenanthroline derivative, a tetrazole derivative, a pyrazole derivative, an imidazole derivative, a thiazole derivative, an oxazole derivative, an imidazole derivative, a benzimidazole derivative, a benzotriazole derivative, a benzoxazole derivative, a carbazole derivative, a benzofuran derivative, a dibenzofuran derivative, a subporphyrazine derivative, a polyphenylenevinylene derivative, a polybenzothiadiazole derivative, a polyfluorene derivative, or the like as a part of a molecular skeleton; an organometallic complex; and a subphthalocyanine derivative. In addition, examples of a group contained in the fullerene derivative include a branched or cyclic alkyl group or a phenyl group; a group having a linear or condensed aromatic compound; a group having a halide; a partial fluoroalkyl group; a perfluoroalkyl group; a silylalkyl group; a silylalkoxy group; an arylsilyl group; an arylsulfanyl group; an alkylsulfanyl group; an arylsulfonyl group; an alkylsulfonyl group; an arylsulfide group; an alkylsulfide group; an amino group; an alkylamino group; an arylamino group; a hydroxy group; an alkoxy group; an acylamino group; an acyloxy group; a carbonyl group; a carboxy group; a carboxamide group; a carboalkoxy group; an acyl group; a sulfonyl group; a cyano group; a nitro group; a group having chalcogenide; a phosphine group; a phosphone group; or derivatives of these.

In the above description, the organic semiconductor layer 200Y is classified into p type and n type organic semiconductor layers, in which p type means that holes are easily transported, and n type means that electrons are easily transported. That is, the organic semiconductor layer and the organic semiconductor material are not to be limited to the interpretation that the organic semiconductor layer and the organic semiconductor material have holes or electrons as majority carriers of thermal excitation, unlike the inorganic semiconductor material.

In addition, a doping material may be deposited in the organic semiconductor layer 200Y by ion implantation as necessary.

Furthermore, the electrodes such as the gates of various transistors provided in the organic semiconductor layer 200Y can be formed of a metal material, for example. More specifically, the electrodes can be formed of alloy of aluminum and neodymium (Al—Nd) or alloy of aluminum, samarium, and copper (ASC).

Furthermore, the organic semiconductor layer 200Y includes an insulating region 212 penetrating the organic semiconductor layer 200Y, similarly to the semiconductor layer 200S of the first embodiment. For example, the material of the insulating film constituting the insulating region 212 may include: a silicon oxide-based material; silicon nitride (SiNY); and a metal oxide insulating material such as aluminum oxide ($Al_2O_3$). Also in the present embodiment, similarly to the first embodiment, the organic semiconductor layer 200Y is provided with the interlayer insulating film 222 corresponding to the wiring layer 200T, the through-substrate electrode 120E, the through-substrate electrode TGV, and the like, penetrating the insulating region 212.

Note that the present embodiment is not limited to the configuration in which the plurality of photodiodes PD (not illustrated) is not stacked on each other, and the plurality of photodiodes PD may be stacked on each other on the first substrate 100. In addition, the organic semiconductor layer 200Y has a configuration similar to the second substrate 200 of the first embodiment except that the semiconductor region is formed of an organic material.

Furthermore, in the present embodiment, the second substrate 200 may include a plurality of stacked semiconductor substrates, similarly to the eighth modification described with reference to FIGS. 38 to 43. In such a case, the organic semiconductor layer (semiconductor layer) 200Y may be provided on each of the semiconductor substrates.

[Manufacturing Method]

Figure 46:
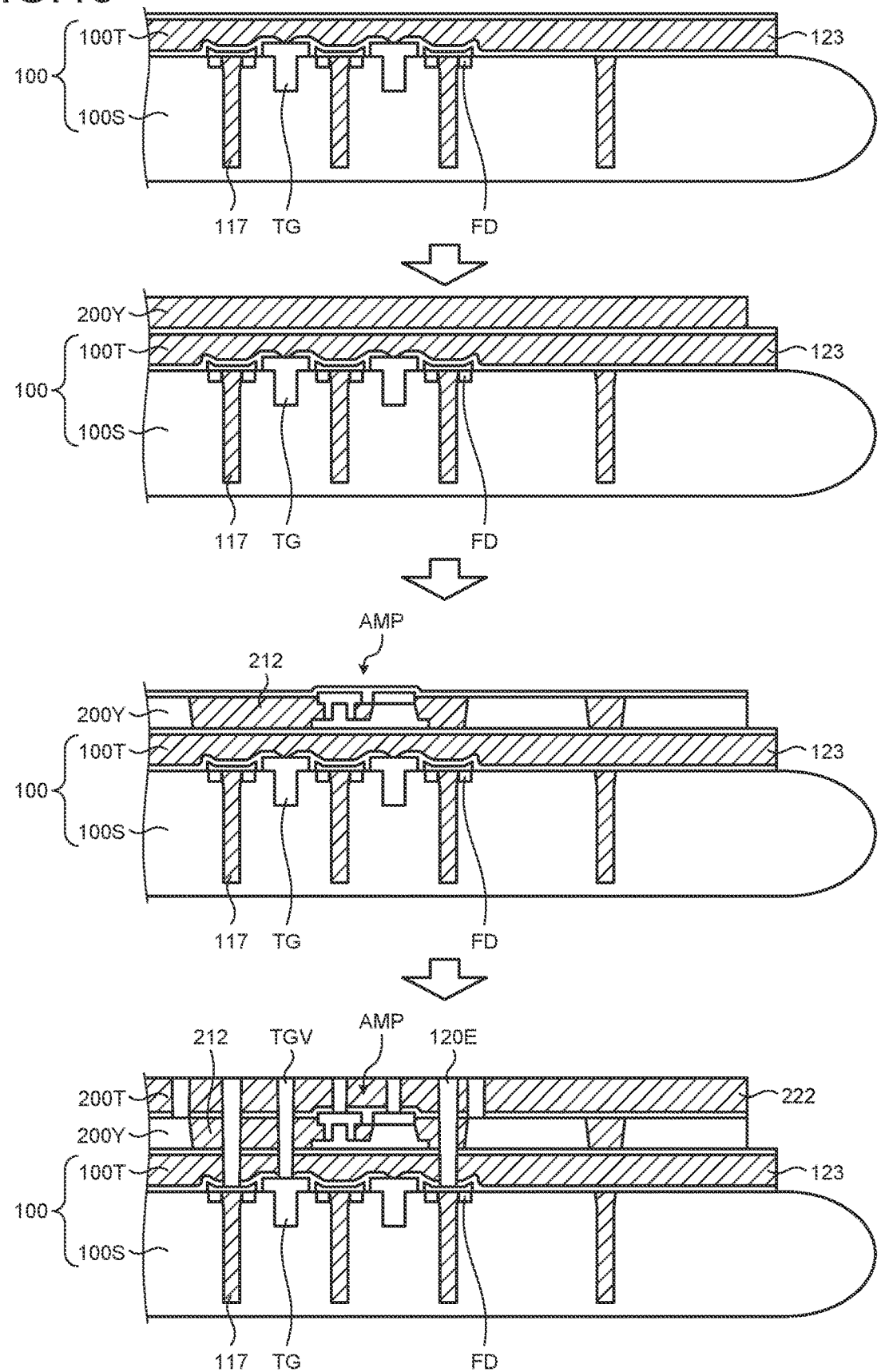
FIG. 46 is a process cross-sectional view illustrating a method of manufacturing the imaging device according to the second embodiment of the present disclosure, corresponding to FIG. 45.

Next, a method of manufacturing the imaging device 1 according to the present embodiment will be described with reference to FIG. 46. FIG. 46 is a process cross-sectional view illustrating the method of manufacturing the imaging device 1 according to the present embodiment, corresponding to FIG. 45. For the sake of clarity, FIG. 46 illustrates only the main part of the imaging device 1 related to the present embodiment, and omits illustrations of the other parts.

First, similarly to the method of manufacturing the imaging device 1 described with reference to FIG. 44, the present embodiment forms the first substrate 100 as illustrated in the drawing at the top of FIG. 46 by using various semiconductor process technologies.

Next, as illustrated in the second drawing from the top in FIG. 46, the organic semiconductor layer 200Y is formed on the flattened interlayer insulating film 123. In the present embodiment, examples of a film forming method of the organic semiconductor layer 200Y include a dry film formation method and a wet film formation method. Examples of the dry film formation method include: a vacuum vapor deposition method using resistance heating, high frequency heating, or electron beam heating; a flash vapor deposition method; a plasma vapor deposition method; an EB vapor deposition method; various sputtering methods (two-electrode sputtering method, direct current sputtering method, direct current magnetron sputtering method, radio frequency sputtering method, magnetron sputtering method, RF-DC coupled bias sputtering method, ECR sputtering method, facing target sputtering method, ion beam sputtering method); a direct current (DC) method; a radio frequency (RF) method; a multi-cathode method; an activation reaction method; an electric field vapor deposition method; various ion plating methods such as a radio frequency ion plating method and a reactive ion plating method; a laser ablation method; a molecular beam epitaxy method; a laser transfer method; and a molecular beam epitaxy method (MBE method). Examples of the CVD method include a plasma CVD method, a thermal CVD method, an MOCVD method, and an optical CVD method. On the other hand, the wet method includes, specifically, for example: a spin coating method; an immersion method; a casting method; microcontact printing; a drop cast method; various printing methods such as a screen printing method, an inkjet printing method, an offset printing method, a gravure printing method, and a flexographic printing method; a stamping method; a spray method; and various coating methods such as an air doctor coater method, a blade coater method, a rod coater method, a knife coater method, a squeeze coater method, a reverse roll coater method, a transfer roll coater method, a gravure coater method, a kiss coater method, a cast coater method, a spray coater method, a slit orifice coater method, and a calendering coater method. In the coating method, examples of the solvent include nonpolar or low-polar organic solvents such as toluene, chloroform, hexane, and ethanol.

In the present embodiment, the impurity may be introduced (doped) into the organic semiconductor layer 200Y by using an ion implantation method or the like after the formation of the organic semiconductor layer 200Y, with no particular limitation.

Next, as illustrated in the third drawing from the top in FIG. 46, various transistors (for example, the amplification transistor AMP or the like), the insulating region 212, and the like are formed in the organic semiconductor layer 200Y using various semiconductor process technologies. Examples of a patterning method applicable to the organic semiconductor layer 200Y can include: chemical etching such as shadow mask, laser transfer, and photolithography; and physical etching using ultraviolet rays, laser, and the like. In addition, examples of the planarization technique applicable to the organic semiconductor layer 200Y can include a laser planarization method, and a reflow method.

Furthermore, as illustrated in the drawing at the bottom of FIG. 46, through-substrate electrodes 120E, TGV, and the like electrically connected to the transistors and the like are formed using various semiconductor process technologies.

[Effects]

As described above, in the present embodiment, instead of bonding the second substrate 200 to the first substrate 100, the organic semiconductor layer 200Y including the pixel circuit 210 is formed on the first substrate 100. With this configuration, in the present embodiment, instead of bonding the second substrate 200 to the first substrate 100, the organic semiconductor layer 200Y is formed on the first substrate 100, making it possible to avoid the use of one substrate 200. As a result, according to the present embodiment, it is possible to suppress an increase in manufacturing cost and an increase in time related to the manufacturing process. Furthermore, according to the present embodiment, since the second substrate 200 is not thinned, leading to suppression of consumption of resources such as silicon.

11. Third Embodiment

Next, a second embodiment of the present disclosure will be described. In the present embodiment, instead of bonding the second substrate 200 to the first substrate 100, an epitaxial growth layer 200E on which the pixel circuit 210 is to be provided is formed on the first substrate 100. With this configuration, in the third embodiment of the present disclosure, similarly to the above-described second embodiment, the epitaxial growth layer 200E is formed on the first substrate 100 instead of bonding the second substrate 200 to the first substrate 100, making it possible to avoid the use of one substrate 200. As a result, according to the present embodiment, it is possible to suppress an increase in manufacturing cost and an increase in time related to the manufacturing process. Furthermore, according to the present embodiment, since the second substrate 200 is not thinned, leading to suppression of consumption of resources such as silicon. Hereinafter, details of the present embodiment will be sequentially described. The following description will describe only the points different from the above-described first embodiment, and description of points common to the first embodiment will be omitted.

[Configuration]

Figure 47:
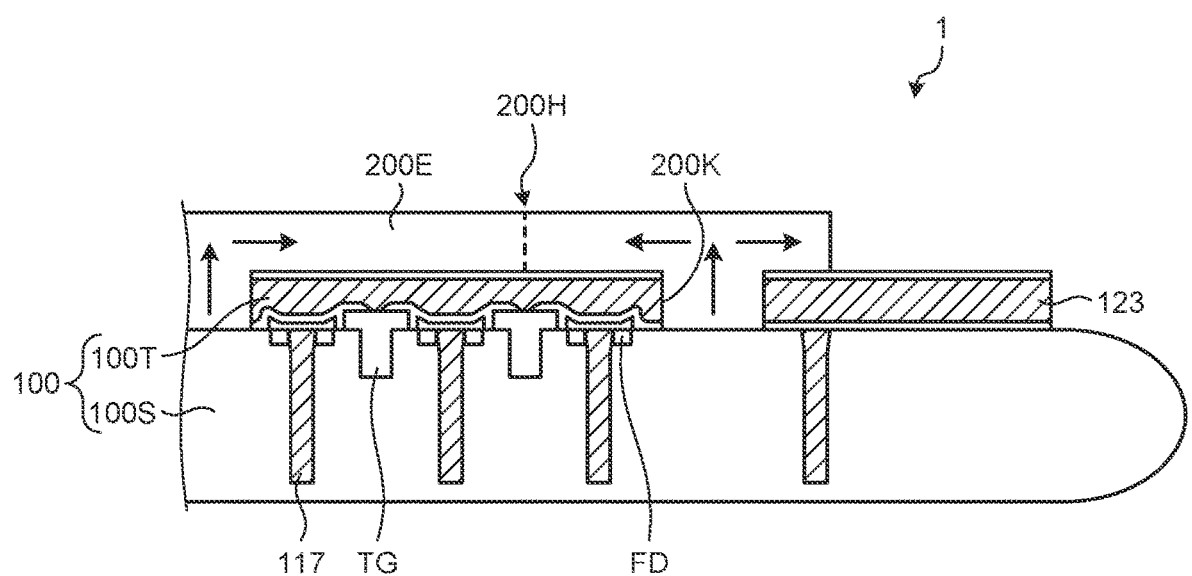
FIG. 47 is a schematic cross-sectional view illustrating an example of a main part of a configuration of an imaging device according to a third embodiment of the present disclosure.

First, a structure of an imaging device 1 according to the third embodiment of the present disclosure will be described with reference to FIG. 47. FIG. 47 is a schematic cross-sectional view illustrating an example of a main part of the configuration of the imaging device 1 according to the present embodiment. For the sake of clarity, FIG. 47 illustrates only the main part of the imaging device 1 related to the present embodiment, and omits illustrations of the other parts.

As illustrated in FIG. 47, in the present embodiment, instead of the second substrate 200, the epitaxial growth layer (semiconductor layer) 200E is provided on the first substrate 100, in other words, on the semiconductor layer 100S via the interlayer insulating film (insulating film) 123. The epitaxial growth layer 200E is provided with a plurality of pixel transistors included in the pixel circuit 210 that reads out the charge held in the floating diffusion FD and outputs a pixel signal. Specifically, in the present embodiment, the pixel circuit 210 includes, for example, a reset transistor RST that resets the potential of the floating diffusion FD to a predetermined potential, and an amplification transistor AMP that outputs a pixel signal in accordance with the amount of charge held in the floating diffusion FD. Furthermore, the pixel circuit 210 includes a selection transistor SEL that controls the timing of outputting the pixel signal from the amplification transistor AMP.

In addition, as illustrated in FIG. 47, the epitaxial growth layer 200E is stacked on the semiconductor layer (first semiconductor substrate) 100S described above with the interlayer insulating film 123 interposed therebetween, and is also stacked on the front surface of the semiconductor layer 100S exposed from a plurality of openings 200K provided in a part of the interlayer insulating film 123. Specifically, the epitaxial growth layer 200E is a layer obtained by growing a single crystal under the influence of the crystal structure (crystal directions or lattice constants) of the front surface of the semiconductor layer 100S exposed from the opening 200K provided in the interlayer insulating film 123.

In the present embodiment, the epitaxial growth layer 200E may be a homoepitaxial growth layer which is obtained by homoepitaxial growth. In the present embodiment, by selecting growth of a homoepitaxial growth layer, that is, a crystal having the same lattice constant as the crystal of the exposed semiconductor layer 100S, it is possible to obtain the epitaxial growth layer 200E having high-quality crystals with few defects. Specifically, for example, when the first substrate 100 is a silicon substrate, the epitaxial growth layer can be formed of a silicon material. For example, when the first substrate 100 is silicon germanium (Site) substrate, the epitaxial growth layer can be formed of a silicon germanium material.

Meanwhile, in the present embodiment, the epitaxial growth layer 200E may be a heteroepitaxial growth layer obtained by heteroepitaxial growth. The present embodiment allows selection of growing a heteroepitaxial growth layer, that is, a crystal of a different material having a lattice constant different from that of the crystal of the exposed semiconductor layer 100S. In this case, it is possible to increase the number of types of materials selectable as the material of the epitaxial growth layer 200E, leading to facilitated formation of a transistor having desired characteristics. Even when the heteroepitaxial growth layer is selected, when the difference in lattice constant between the semiconductor layer 100S and the epitaxial growth layer 200E is slight, it is also possible to obtain a high-quality crystal in the epitaxial growth layer 200E. Specifically, for example, when the first substrate 100 is a silicon substrate, the epitaxial growth layer can be formed of a silicon germanium material. Furthermore, for example, when the first substrate 100 is a silicon germanium substrate, the epitaxial growth layer can be formed of a silicon material. In the present embodiment, in order to avoid occurrence of defects such as transition due to a difference in lattice constant, there may be provided a buffer layer (not illustrated) between the semiconductor layer 100S and the epitaxial growth layer 200E. At this time, the buffer layer can be formed of, for example, amorphous silicon.

In the present embodiment, the interlayer insulating film 123 is provided with the opening 200K that exposes the front surface of the semiconductor layer 100S in order to form the epitaxial growth layer 200E. In the present embodiment, for example, the opening 200K is preferably provided in a region of the interlayer insulating film 123 other than a region corresponding to the lower side of a region where various transistors included in the pixel circuit 210 are to be formed. Furthermore, for example, the opening 200K is preferably provided in a region of the interlayer insulating film 123 other than the region corresponding to the lower side of the region where the through-substrate electrodes and the contacts are to be formed. Furthermore, in the present embodiment, in order to improve the crystallinity of the epitaxial growth layer 200E, the number of openings 200K provided in the interlayer insulating film 123 is preferably larger, and the opening width of the opening 200K is preferably greater. Therefore, in the present embodiment, the epitaxial growth layer 200E grows under the influence of the crystal structure of the front surface of the semiconductor layer 100S exposed from the plurality of openings 200K, so as to be a layer that fills each of the openings 200K and covers the interlayer insulating film 123. Accordingly, the epitaxial growth layer 200E is partially provided above the surface of the interlayer insulating film 123 opposite to the surface facing the semiconductor layer 100S.

Furthermore, in the present embodiment, the epitaxial growth layer 200E is formed by growing from the front surface of the semiconductor layer 100S exposed from the opening 200K and continuously growing onto the interlayer insulating film 123. Therefore, in the present embodiment, there is a possibility that a crystal defect (haze) 200H occurs at a portion where the epitaxial growth layers 200E, which have grown from the front surface of the semiconductor layer 100S exposed from each of the openings 200K and further grown from each of the openings 200K on the interlayer insulating film 123, are connected to each other, for example. More specifically, the crystal defect is a plane defect occurring at an interface due to a slight difference in crystal direction between portions grown from the front surfaces of the semiconductor layer 100S exposed from each of the openings 200K.

Therefore, in the present embodiment, it is preferable to make a portion where the crystal defect 200H might occur into a region for forming an insulating film such as the insulating region 212 so that the crystal defect 200H can be removed in a subsequent process. Alternatively, it is also allowable in the present embodiment to preliminarily form, on the interlayer insulating film 123, a wall that limits the range of epitaxial growth. In this case, the epitaxial growth layer 200E grows from each of the openings 200K, then grows only in the region enclosed by the wall, and is separated by this wall from the epitaxial growth layer 200E grown from the other opening 200K. Therefore, formation of the wall can avoid the occurrence of the crystal defect 200H. In the above case, it is allowable to remove the wall by wet etching or the like and embed an insulating film in the removed portion so as to form the insulating region 212 and the like.

Note that the present embodiment is not limited to the configuration in which the plurality of photodiodes PD (not illustrated) is not stacked on each other, and the plurality of photodiodes PD may be stacked on each other on the first substrate 100. In the present embodiment, the epitaxial growth layer 200E has a configuration similar to the second substrate 200 of the first embodiment except that the layer is an epitaxial growth layer and the opening 200K is formed.

Furthermore, in the present embodiment, the second substrate 200 may include a plurality of stacked semiconductor substrates, similarly to the eighth modification described with reference to FIGS. 38 to 43. In such a case, at least a part of the plurality of semiconductor substrates may be the epitaxial growth layer 200E obtained by epitaxial growth from the front surface of the adjacent semiconductor substrate.

[Manufacturing Method]

Figure 48:
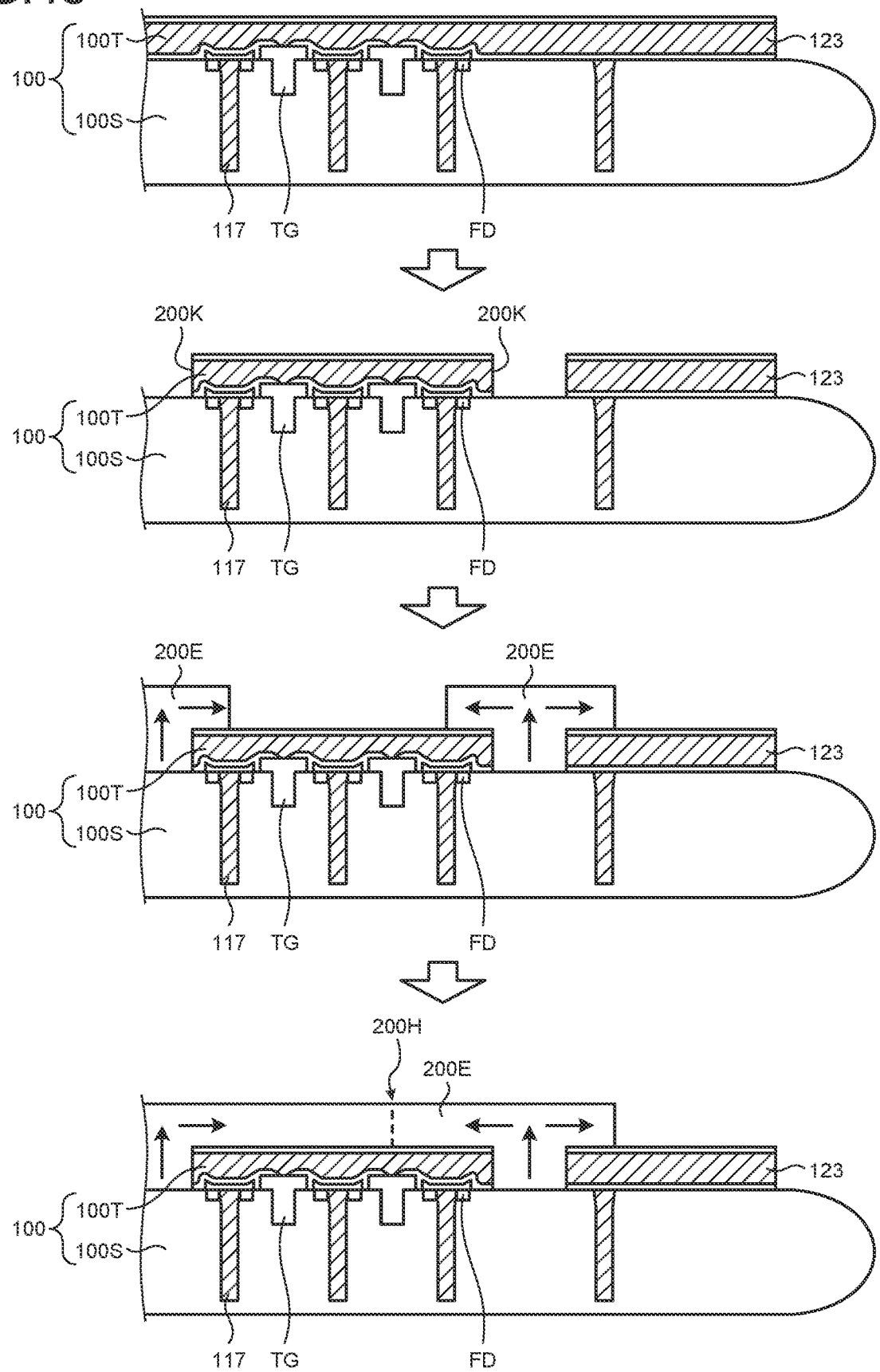
FIG. 48 is a process cross-sectional view illustrating a method of manufacturing the imaging device according to the third embodiment of the present disclosure, corresponding to FIG. 47.

Next, a method of manufacturing the imaging device 1 according to the present embodiment will be described with reference to FIG. 48. FIG. 48 is a process cross-sectional view illustrating the method of manufacturing the imaging device 1 according to the present embodiment, corresponding to FIG. 47. For the sake of clarity, FIG. 48 illustrates only the main part of the imaging device 1 related to the present embodiment, and omits illustrations of the other parts.

First, similarly to the method of manufacturing the imaging device 1 described with reference to FIG. 44, the present embodiment forms the first substrate 100 as illustrated in the drawing at the top of FIG. 48 by using various semiconductor process technologies.

Next, as illustrated in the second drawing from the top in FIG. 48, by using a reactive ion etching (RIE) method, for example, the opening 200K for exposing the front surface of the semiconductor layer 100S is formed in the interlayer insulating film 123. Thereafter, the front surface of the semiconductor layer 100S exposed from the opening 200K is subjected to plasma treatment, wet cleaning, or the like to remove the natural oxide film on the front surface.

Further, as illustrated in the third drawing from the top in FIG. 48, the epitaxial growth layer 200E is formed in the opening 200K and on the interlayer insulating film 123. Examples of a method of forming the epitaxial growth layer 200E include vapor phase epitaxy (VPE) or chemical vapor deposition (CVD) in which a component in a vapor phase is deposited on a substrate crystal surface, and liquid phase epitaxy (LPE) in which a crystal component is precipitated on a substrate crystal surface from a supersaturated solution. Other examples of a method for forming the epitaxial growth layer 200E include solid phase epitaxy (SPE) in which a material deposited on a substrate crystal surface is heated by electron beam irradiation or the like to change to the same crystal structure as the substrate crystal. Still other examples of the method for forming the epitaxial growth layer 200E include molecular beam epitaxy (MBE) in which an element constituting a target crystal or a material containing the element is heated and evaporated in ultra-high vacuum ($10^{-8}$ to $10^{-9}$ Pa) to deposit the crystal on the heated substrate crystal.

In the present embodiment, the configuration as illustrated in the drawing at the bottom of FIG. 48 can be obtained as described above. Thereafter, in the present embodiment, regarding the portion where the crystal defect 200H occurs in the epitaxial growth layer 200E, the portion may be removed and then an insulating film may be embedded by a high density plasma (HDP) method or the like to form the insulating region 212 and the like.

[Effects]

In the present embodiment, similarly to the above-described second embodiment, the epitaxial growth layer 200E is formed on the first substrate 100 instead of bonding the second substrate 200 to the first substrate 100, making it possible to avoid the use of one substrate 200. As a result, the present embodiment makes it possible to suppress an increase in the manufacturing cost, enabling execution of processes in a clean and closed environment. Furthermore, the number of processes can be reduced, making it possible to suppress an increase in time related to the manufacturing process. Furthermore, according to the present embodiment, since the second substrate 200 is not thinned, leading to suppression of consumption of resources such as silicon.

[Modifications]

Figure 49:
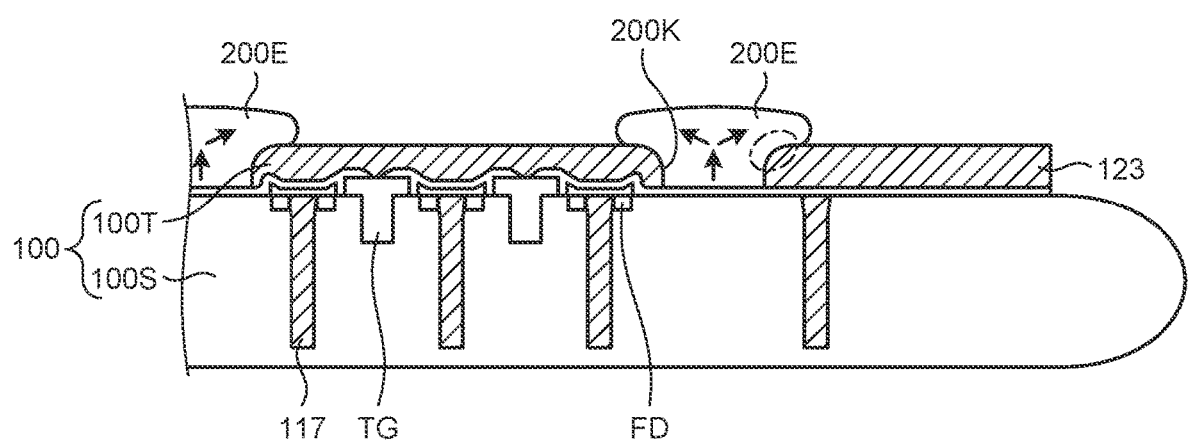
FIG. 49 is a schematic cross-sectional view illustrating an example of a main part of a configuration of an imaging device according to a modification of the third embodiment of the present disclosure.
Figure 50:
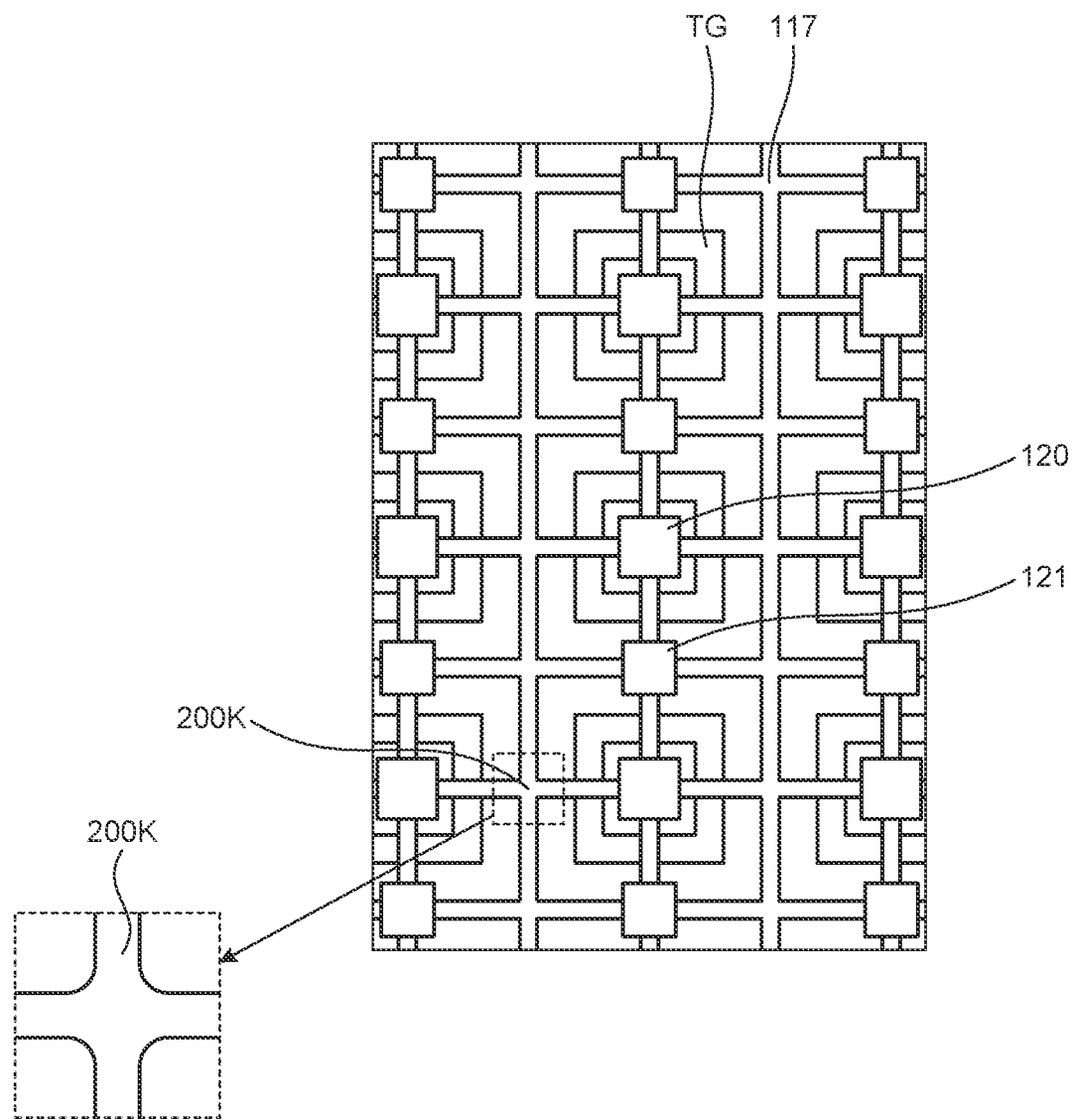
FIG. 50 is a schematic plan view illustrating an example of an opening illustrated in FIG. 49.

In the present embodiment, for the purpose of improving the crystallinity of the epitaxial growth layer 200E, the opening 200K can be modified as follows. Accordingly, a modification of the present embodiment will be described with reference to FIGS. 49 and 50. FIG. 49 is a schematic cross-sectional view illustrating an example of a main part of a configuration of an imaging device 1 according to the modification of the present embodiment; and FIG. 50 is a schematic plan view illustrating an example of an opening 200K illustrated in FIG. 49. For the sake of clarity, FIGS. 49 and 50 illustrate only the main part of the imaging device 1 related to the present modification, and omit illustrations of the other parts. Here, only points different from the above-described third embodiment will be described, and description of points common to the third embodiment will be omitted.

As illustrated in FIG. 49, in the present modification, the opening 200K has a tapered shape in which the opening width narrows from the upper surface side of the interlayer insulating film 123 toward the front surface of the semiconductor layer 100S corresponding to the bottom surface of the opening 200K. Furthermore, as illustrated in FIG. 49, the inner wall of the opening 200K preferably has a rounded curved surface protruding inward (specifically, a center line passing through the opening of the opening 200K). Furthermore, as illustrated in FIG. 50, the opening 200K according to the present modification is preferably provided in a region other than a region where various transistors included in the pixel circuit 210 are to be formed and a region corresponding to the lower side of a region where a through-substrate electrodes or contacts are to be formed.

In the present modification, the opening 200K is provided in this manner, making it possible to facilitate the epitaxial growth in the lateral direction along the upper surface of the interlayer insulating film 123. Furthermore, in the present modification, the opening 200K is formed in this manner, thereby avoiding formation of an acute angle in the inner wall of the opening 200K, making it possible to suppress occurrence of crystal defects in the grown epitaxial growth layer 200E, leading to improvement of the crystallinity of the epitaxial growth layer 200E. For example, the opening 200K having such a tapered shape can be formed by selecting a processing method that easily makes a tapered shape during the processing.

12. Application Examples

Figure 51:
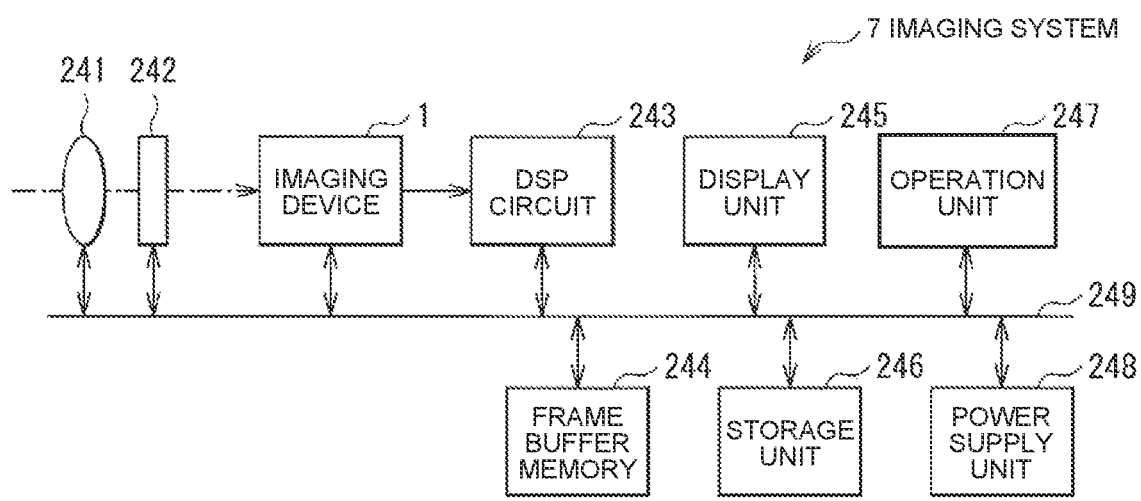
FIG. 51 is a diagram illustrating an example of a schematic configuration of an imaging system including the imaging device according to the embodiments and their modifications.

FIG. 51 illustrates an example of a schematic configuration of an imaging system 7 including the imaging device 1 according to the embodiments and their modifications.

The imaging system 7 is, for example, an electronic device exemplified by an imaging device such as a digital still camera or a video camera, or a portable terminal device such as a smartphone or a tablet terminal. The imaging system 7 includes, for example, the imaging device 1 according to the above-described embodiments and their modifications, a DSP circuit 243, frame buffer memory 244, a display unit 245, a storage unit 246, an operation unit 247, and a power supply unit 248. In the imaging system 7, the imaging device 1 according to the above-described embodiments and their modifications, the DSP circuit 243, the frame buffer memory 244, the display unit 245, the storage unit 246, the operation unit 247, and the power supply unit 248 are connected to each other via a bus line 249.

The imaging device 1 according to the above-described embodiments and their modifications outputs image data according to incident light. The DSP circuit 243 is a signal processing circuit that processes a signal (image data) output from the imaging device 1 according to the above-described embodiments and their modifications. The frame buffer memory 244 temporarily holds the image data processed by the DSP circuit 243 in units of frames. The display unit 245 includes, for example, a panel-type display device such as a liquid crystal panel or an organic electro luminescence (EL) panel, and displays a moving image or a still image captured by the imaging device 1 according to the above-described embodiments and their modifications. The storage unit 246 records image data of a moving image or a still image captured by the imaging device 1 according to the above-described embodiments and their modifications in a recording medium such as semiconductor memory or a hard disk. The operation unit 247 issues operation commands for various functions of the imaging system 7 in accordance with an operation by the user. The power supply unit 248 appropriately supplies various types of power as operation power of the imaging device 1 according to the above-described embodiments and their modifications, the DSP circuit 243, the frame buffer memory 244, the display unit 245, the storage unit 246, and the operation unit 247 to these supply targets.

Next, an imaging procedure in the imaging system 7 will be described.

Figure 52:
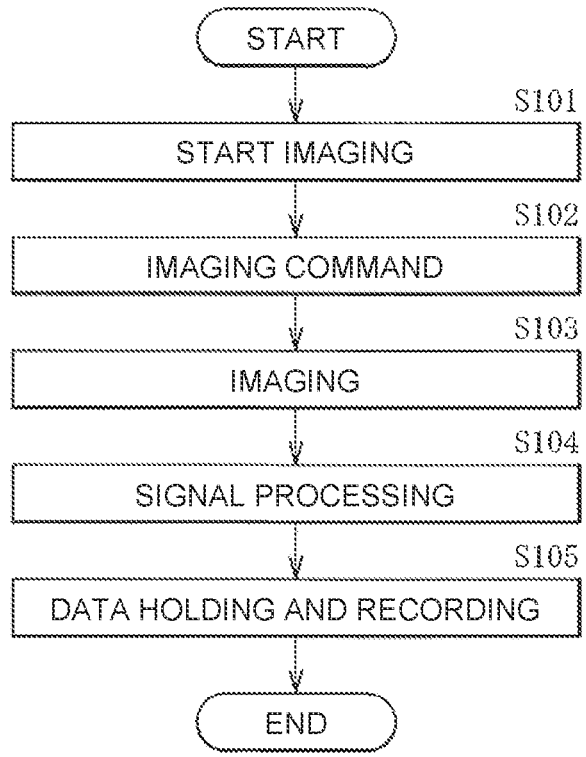
FIG. 52 is a diagram illustrating an example of an imaging procedure of the imaging system illustrated in FIG. 51.

FIG. 52 illustrates an example of a flowchart of an imaging operation in the imaging system 7. A user instructs start of imaging by operating the operation unit 247 (step S101). Subsequently, the operation unit 247 transmits an imaging command to the imaging device 1 (step S102). Having received the imaging command, the imaging device 1 (specifically, a system control circuit 36) executes imaging by a predetermined imaging method (step S103).

The imaging device 1 outputs image data obtained by imaging to the DSP circuit 243. Here, the image data represents data for all the pixels of the pixel signal generated based on the charge temporarily held in the floating diffusion FD. The DSP circuit 243 performs predetermined signal processing (for example, noise reduction processing) based on the image data input from the imaging device 1 (step S104). The DSP circuit 243 causes the frame buffer memory 244 to hold the image data subjected to predetermined signal processing, and then, the frame buffer memory 244 causes the storage unit 246 to store the image data (step S105). In this manner, imaging in the imaging system 7 is performed.

In the present application example, the imaging device 1 according to the above-described embodiments and their modifications is applied to the imaging system 7. With this application, the imaging device 1 can be downsized or have high definition, making it possible to provide the small or high definition imaging system 7.

13. Examples of Application to Products

[First Example of Application to Products]

The technology according to the present disclosure (the present technology) is applicable to various products. The technology according to the present disclosure may be applied to devices mounted on any of moving objects such as automobiles, electric vehicles, hybrid electric vehicles, motorcycles, bicycles, personal mobility, airplanes, drones, ships, and robots.

Figure 53:
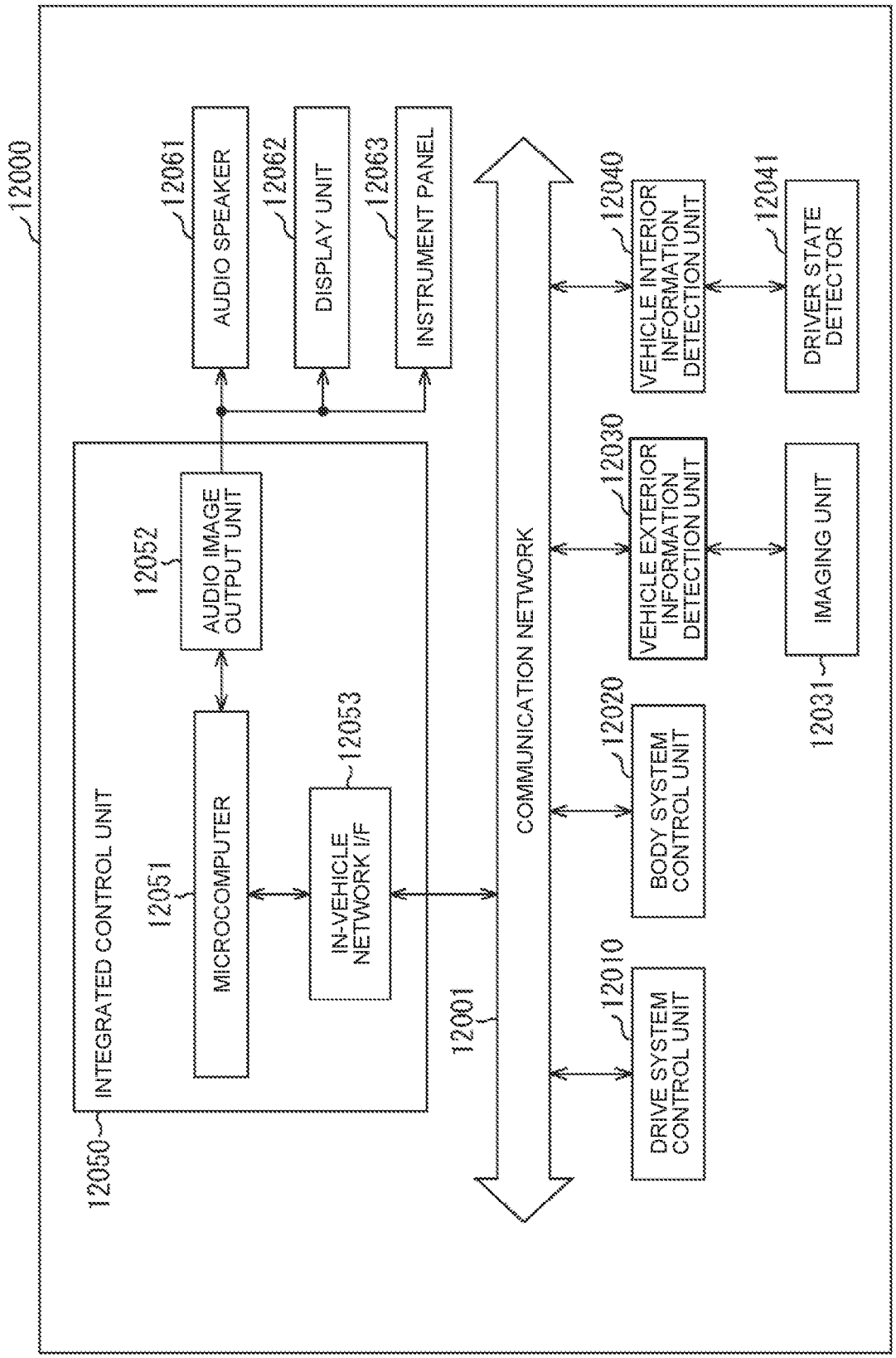
FIG. 53 is a block diagram illustrating an example of a schematic configuration of a vehicle control system.

FIG. 53 is a block diagram illustrating a schematic configuration example of a vehicle control system, which is an example of a moving body control system to which the technology according to the present disclosure is applicable.

A vehicle control system 12000 includes a plurality of electronic control units connected via a communication network 12001. In the example illustrated in FIG. 53, the vehicle control system 12000 includes a drive system control unit 12010, a body system control unit 12020, a vehicle exterior information detection unit 12030, a vehicle interior information detection unit 12040, and an integrated control unit 12050. Furthermore, as a functional configuration of the integrated control unit 12050, a microcomputer 12051, an audio image output unit 12052, and an in-vehicle network interface (I/F) 12053 are illustrated.

The drive system control unit 12010 controls the operation of the device related to the drive system of the vehicle in accordance with various programs. For example, the drive system control unit 12010 functions as a control device of a driving force generation device that generates a driving force of a vehicle such as an internal combustion engine or a driving motor, a driving force transmission mechanism that transmits a driving force to the wheels, a steering mechanism that adjusts steering angle of the vehicle, a braking device that generates a braking force of the vehicle, or the like.

The body system control unit 12020 controls the operation of various devices mounted on the vehicle body in accordance with various programs. For example, the body system control unit 12020 functions as a control device for a keyless entry system, a smart key system, a power window device, or various lamps such as a head lamp, a back lamp, a brake lamp, a turn signal lamp, or a fog lamp. In this case, the body system control unit 12020 can receive input of radio waves transmitted from a portable device that substitutes for the key or signals from various switches. The body system control unit 12020 receives the input of these radio waves or signals and controls the door lock device, the power window device, the lamp, or the like, of the vehicle.

The vehicle exterior information detection unit 12030 detects information outside the vehicle equipped with the vehicle control system 12000. For example, an imaging unit 12031 is connected to the vehicle exterior information detection unit 12030. The vehicle exterior information detection unit 12030 causes the imaging unit 12031 to capture an image of the exterior of the vehicle and receives the captured image. The vehicle exterior information detection unit 12030 may perform an object detection process or a distance detection process of people, vehicles, obstacles, signs, or characters on the road surface based on the received image.

The imaging unit 12031 is an optical sensor that receives light and outputs an electric signal corresponding to the amount of received light. The imaging unit 12031 can output the electric signal as an image and also as distance measurement information. Furthermore, the light received by the imaging unit 12031 may be visible light or invisible light such as infrared rays.

The vehicle interior information detection unit 12040 detects vehicle interior information. The vehicle interior information detection unit 12040 is connected to a driver state detector 12041 that detects the state of the driver, for example. The driver state detector 12041 may include a camera that images the driver, for example. The vehicle interior information detection unit 12040 may calculate the degree of fatigue or degree of concentration of the driver or may determine whether the driver is dozing off based on the detection information input from the driver state detector 12041.

The microcomputer 12051 can calculate a control target value of the driving force generation device, the steering mechanism, or the braking device based on vehicle external/internal information obtained by the vehicle exterior information detection unit 12030 or the vehicle interior information detection unit 12040, and can output a control command to the drive system control unit 12010. For example, the microcomputer 12051 can perform cooperative control for the purpose of achieving a function of an advanced driver assistance system (ADAS) including collision avoidance or impact mitigation of vehicles, follow-up running based on an inter-vehicle distance, cruise control, vehicle collision warning, vehicle lane departure warning, or the like.

Furthermore, it is allowable such that the microcomputer 12051 controls the driving force generation device, the steering mechanism, the braking device, or the like, based on the information regarding the surroundings of the vehicle obtained by the vehicle exterior information detection unit 12030 or the vehicle interior information detection unit 12040, thereby performing cooperative control for the purpose of autonomous driving or the like, in which the vehicle performs autonomous traveling without depending on the operation of the driver.

Furthermore, the microcomputer 12051 can output a control command to the body system control unit 12020 based on the vehicle exterior information acquired by the vehicle exterior information detection unit 12030. For example, the microcomputer 12051 can control the head lamp in accordance with the position of the preceding vehicle or the oncoming vehicle sensed by the vehicle exterior information detection unit 12030, and thereby can perform cooperative control aiming at antiglare such as switching the high beam to low beam.

The audio image output unit 12052 transmits an output signal in the form of at least one of audio or image to an output device capable of visually or audibly notifying the occupant of the vehicle or the outside of the vehicle of information. In the example of FIG. 47, an audio speaker 12061, a display unit 12062, and an instrument panel 12063 are illustrated as exemplary output devices. The display unit 12062 may include, for example, at least one of an onboard display and a head-up display.

Figure 54:
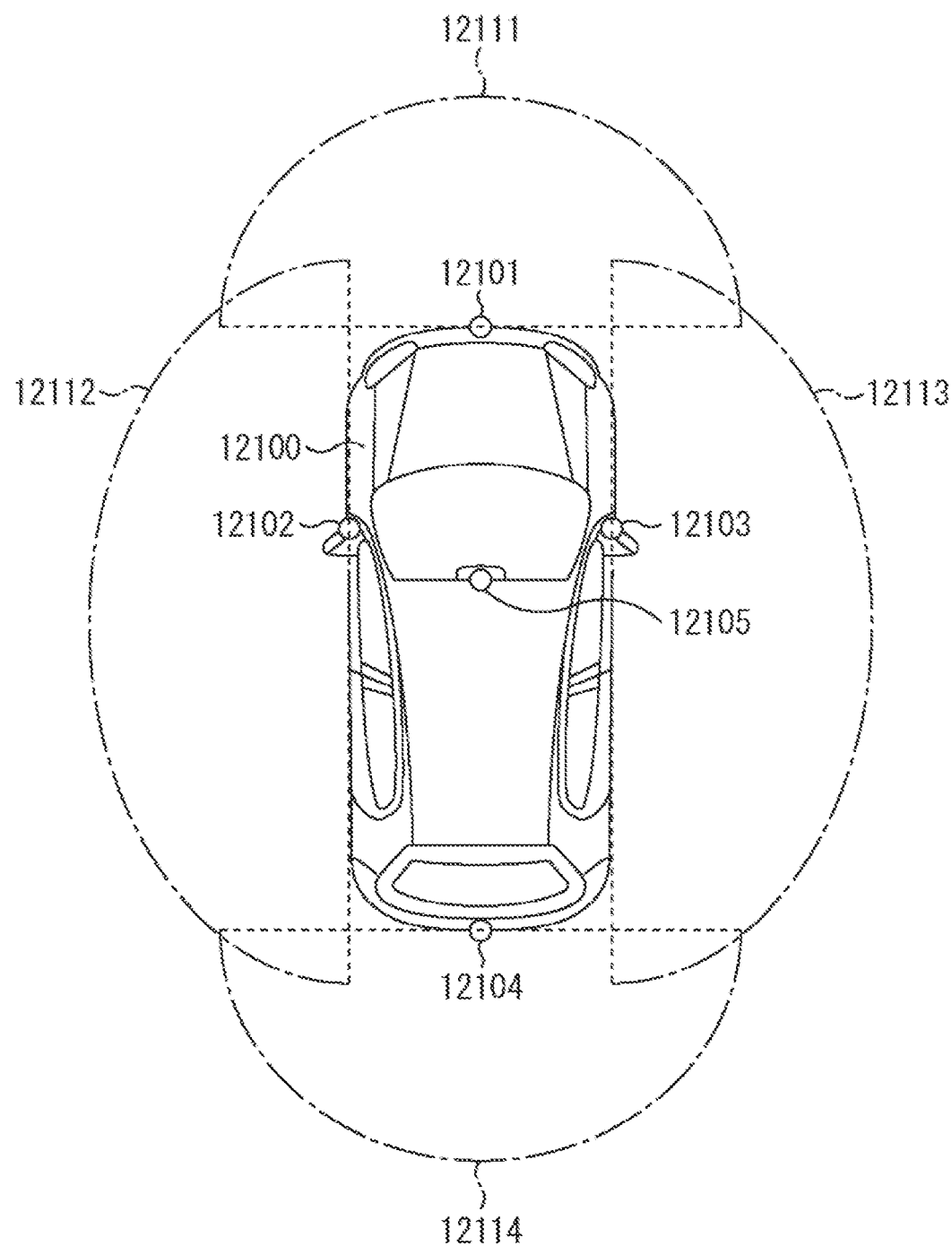
FIG. 54 is a diagram illustrating an example of installation positions of a vehicle exterior information detector and an imaging unit.

FIG. 54 is a diagram illustrating an example of an installation position of the imaging unit 12031.

In FIG. 54, a vehicle 12100 has imaging units 12101, 12102, 12103, 12104, and 12105 as the imaging units 12031.

For example, the imaging units 12101, 12102, 12103, 12104, and 12105 are installed at positions on the vehicle 12100, including a front nose, a side mirror, a rear bumper, a back door, an upper portion of the windshield in a vehicle interior, or the like. The imaging unit 12101 provided on the front nose and the imaging unit 12105 provided on the upper portion of the windshield in the vehicle interior mainly acquire an image in front of the vehicle 12100. The imaging units 12102 and 12103 provided in the side mirrors mainly acquire images of the side of the vehicle 12100. The imaging unit 12104 provided on the rear bumper or the back door mainly acquires an image behind the vehicle 12100. The images in front acquired by the imaging units 12101 and 12105 are mainly used for detecting a preceding vehicle or a pedestrian, an obstacle, a traffic light, a traffic sign, a lane, or the like.

Note that FIG. 54 illustrates an example of the imaging range of the imaging units 12101 to 12104. An imaging range 12111 indicates an imaging range of the imaging unit 12101 provided on the front nose, imaging ranges 12112 and 12113 indicate imaging ranges of the imaging units 12102 and 12103 provided on the side mirrors, respectively, and an imaging range 12114 indicates an imaging range of the imaging unit 12104 provided on the rear bumper or the back door. For example, by superimposing pieces of image data captured by the imaging units 12101 to 12104, it is possible to obtain a bird's-eye view image of the vehicle 12100 as viewed from above.

At least one of the imaging units 12101 to 12104 may have a function of acquiring distance information. For example, at least one of the imaging units 12101 to 12104 may be a stereo camera including a plurality of imaging elements, or an imaging element having pixels for phase difference detection.

For example, the microcomputer 12051 can calculate a distance to each of three-dimensional objects in the imaging ranges 12111 to 12114 and a temporal change (relative speed with respect to the vehicle 12100) of the distance based on the distance information obtained from the imaging units 12101 to 12104, and thereby can extract a three-dimensional object traveling at a predetermined speed (for example, 0 km/h or more) in substantially the same direction as the vehicle 12100 being the closest three-dimensional object on the traveling path of the vehicle 12100, as a preceding vehicle. Furthermore, the microcomputer 12051 can set an inter-vehicle distance to be ensured in front of the preceding vehicle in advance, and can perform automatic brake control (including follow-up stop control), automatic acceleration control (including follow-up start control), or the like. In this manner, it is possible to perform cooperative control for the purpose of autonomous driving or the like, in which the vehicle autonomously travels without depending on the operation of the driver.

For example, based on the distance information obtained from the imaging units 12101 to 12104, the microcomputer 12051 can extract three-dimensional object data regarding the three-dimensional object with classification into three-dimensional objects, such as a two-wheeled vehicle, a regular vehicle, a large vehicle, a pedestrian, and other three-dimensional objects such as a utility pole, and can use the data for automatic avoidance of obstacles. For example, the microcomputer 12051 distinguishes obstacles around the vehicle 12100 into obstacles having high visibility to the driver of the vehicle 12100 and obstacles having low visibility to the driver. Subsequently, the microcomputer 12051 determines a collision risk indicating the risk of collision with each of obstacles. When the collision risk is a set value or more and there is a possibility of collision, the microcomputer 12051 can output an alarm to the driver via the audio speaker 12061 and the display unit 12062, and can perform forced deceleration and avoidance steering via the drive system control unit 12010, thereby achieving driving assistance for collision avoidance.

At least one of the imaging units 12101 to 12104 may be an infrared camera that detects infrared rays. For example, the microcomputer 12051 can recognize a pedestrian by determining whether or not a pedestrian is present in the captured images of the imaging units 12101 to 12104. Such pedestrian recognition is performed, for example, by a procedure of extracting feature points in a captured image of the imaging units 12101 to 12104 as an infrared camera, and by a procedure of performing pattern matching processing on a series of feature points indicating the contour of the object to discriminate whether or not it is a pedestrian. When the microcomputer 12051 determines that a pedestrian is present in the captured images of the imaging units 12101 to 12104 and recognizes a pedestrian, the audio image output unit 12052 controls the display unit 12062 to perform superimposing display of a rectangular contour line for emphasis to the recognized pedestrian. Furthermore, the audio image output unit 12052 may control the display unit 12062 to display an icon indicating a pedestrian or the like at a desired position.

Hereinabove, an example of the moving body control system to which the technology according to the present disclosure is applicable has been described. The technology according to the present disclosure can be suitably applied to the imaging unit 12031 among the configurations described above. Specifically, the imaging device 1 according to the above-described embodiments and their modifications can be applied to the imaging unit 12031. By applying the technology according to the present disclosure to the imaging unit 12031, it is possible to obtain a high-definition photographic image with little noise, leading to achievement of high-accuracy control using the photographic image in the moving body control system.

[Second Example of Application to Products]

Figure 55:
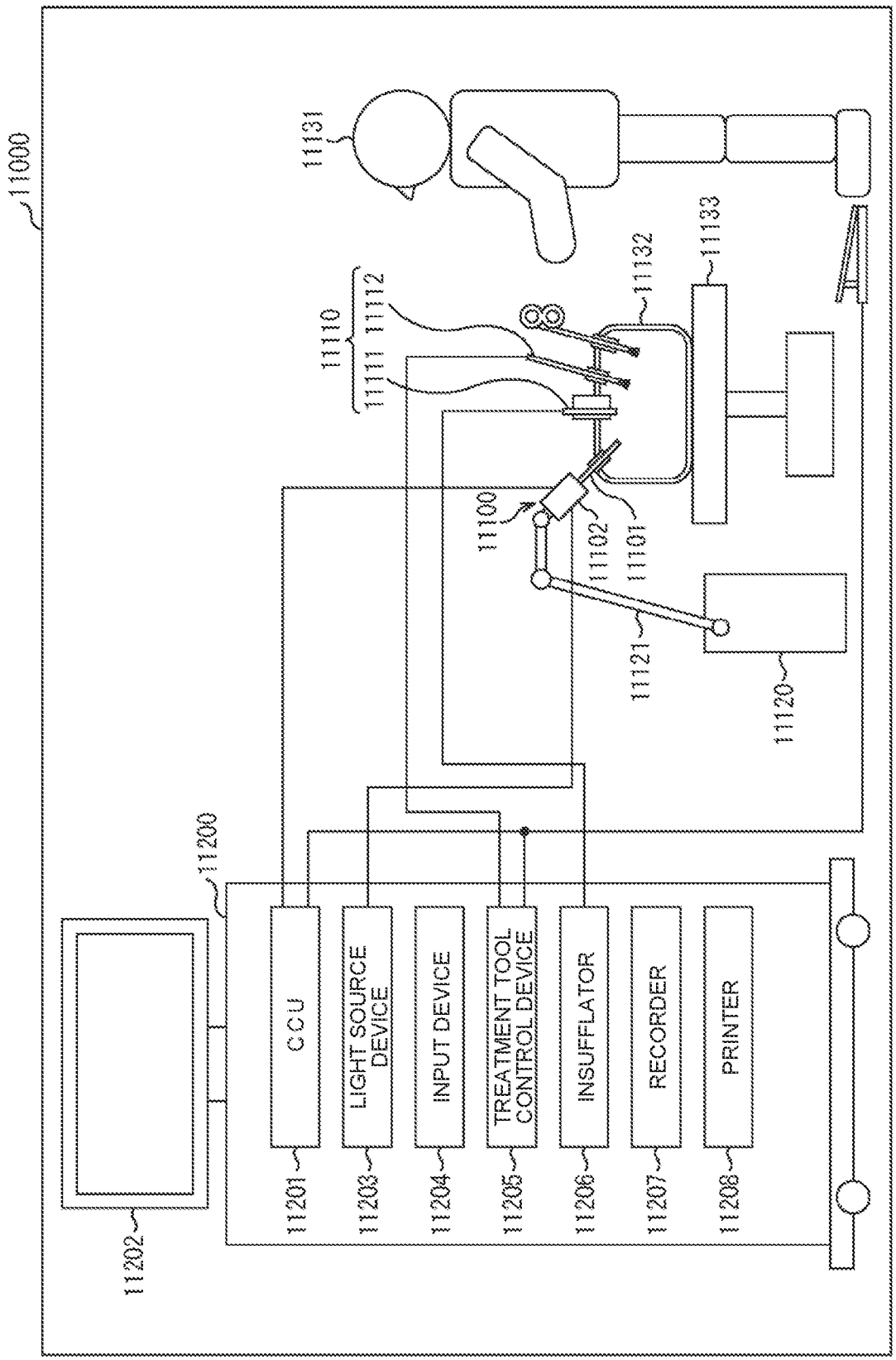
FIG. 55 is a diagram illustrating an example of a schematic configuration of an endoscopic surgery system.

FIG. 55 is a diagram illustrating an example of a schematic configuration of an endoscopic surgery system to which the technology according to the present disclosure (the present technology) is applicable.

FIG. 55 illustrates a scene in which a surgeon (doctor) 11131 is performing surgery on a patient 11132 on a patient bed 11133 using an endoscopic surgery system 11000. As illustrated, the endoscopic surgery system 11000 includes an endoscope 11100, other surgical tools 11110 such as an insufflation tube 11111 and an energy treatment tool 11112, a support arm device 11120 that supports the endoscope 11100, and a cart 11200 equipped with various devices for endoscopic surgery.

The endoscope 11100 includes: a lens barrel 11101 in which a region of a predetermined length from a distal end is to be inserted into the body cavity of the patient 11132; and a camera head 11102 connected to a proximal end of the lens barrel 11101. The example in the figure illustrates the endoscope 11100 as a rigid endoscope having the lens barrel 11101 of a rigid type. However, the endoscope 11100 can be a flexible endoscope having a flexible lens barrel.

The distal end of the lens barrel 11101 has an opening to which an objective lens is fitted. The endoscope 11100 is connected to a light source device 11203. The light generated by the light source device 11203 is guided to the distal end of the lens barrel by a light guide extending inside the lens barrel 11101, and the guided light will be emitted toward an observation target in the body cavity of the patient 11132 through the objective lens. The endoscope 11100 may be a forward viewing endoscope, a forward-oblique viewing endoscope, or a side-viewing endoscope.

An optical system and an imaging element are provided inside the camera head 11102. Reflected light (observation light) from the observation target is focused on the imaging element by the optical system. The observation light is photoelectrically converted by the imaging element so as to generate an electric signal corresponding to the observation light, that is, an image signal corresponding to the observation image. The image signal is transmitted as RAW data to a camera control unit (CCU) 11201.

The CCU 11201 is formed with a central processing unit (CPU), a graphics processing unit (GPU), or the like, and integrally controls operations of the endoscope 11100 and a display device 11202. Furthermore, the CCU 11201 receives an image signal from the camera head 11102, and performs various types of image processing on the image signal for displaying an image based on the image signal, such as developing processing (demosaicing).

Under the control of the CCU 11201, the display device 11202 displays an image based on the image signal that has undergone image processing by the CCU 11201.

The light source device 11203 includes a light source such as a light emitting diode (LED), for example, and supplies the irradiation light for imaging the surgical site or the like to the endoscope 11100.

An input device 11204 is an input interface to the endoscopic surgery system 11000. The user can input various types of information and input instructions to the endoscopic surgery system 11000 via the input device 11204. For example, the user inputs an instruction and the like to change the imaging conditions (type of irradiation light, magnification, focal length, and the like) by the endoscope 11100.

A treatment tool control device 11205 controls the drive of the energy treatment tool 11112 for ablation or dissection of tissue, sealing of blood vessels, or the like. In order to inflate the body cavity of the patient 11132 to ensure a view field for the endoscope 11100 and to ensure a working space of the surgeon, an insufflator 11206 pumps gas into the body cavity through the insufflation tube 11111. A recorder 11207 is a device capable of recording various types of information associated with the surgery. A printer 11208 is a device capable of printing various types of information associated with surgery in various forms such as text, images, and graphs.

The light source device 11203 that supplies the endoscope 11100 with irradiation light when imaging a surgical site can be constituted with, for example, an LED, a laser light source, or a white light source with a combination of these. In a case where the white light source is constituted with the combination of the RGB laser light sources, it is possible to control the output intensity and the output timing of individual colors (individual wavelengths) with high accuracy. Accordingly, it is possible to perform white balance adjustment of the captured image on the light source device 11203. Furthermore, in this case, by emitting the laser light from each of the RGB laser light sources to an observation target on the time-division basis and by controlling the drive of the imaging element of the camera head 11102 in synchronization with the light emission timing, it is also possible to capture the image corresponding to each of RGB colors on the time division basis. According to this method, a color image can be obtained without providing a color filter on the imaging element.

Furthermore, the drive of the light source device 11203 may be controlled so as to change the intensity of the output light at predetermined time intervals. With the control of the drive of the imaging element of the camera head 11102 in synchronization with the timing of the change of the intensity of the light so as to obtain images on the time division basis and combine the images, it is possible to generate an image with high dynamic range without so called blackout shadows or blown out highlights (overexposure).

Furthermore, the light source device 11203 may be configured to be able to supply light in a predetermined wavelength band corresponding to special light observation. The special light observation is used to perform narrowband light observation (narrow band imaging). The narrowband light observation uses the wavelength dependency of the light absorption in the body tissue and emits light in a narrower band compared with the irradiation light (that is, white light) at normal observation, thereby imaging a predetermined tissue such as a blood vessel of the mucosal surface layer with high contrast. Alternatively, the special light observation may include fluorescence observation to obtain an image by fluorescence generated by emission of excitation light. Fluorescence observation can be performed to observe fluorescence emitted from a body tissue to which excitation light is applied (autofluorescence observation), can be performed with topical administration of reagent such as indocyanine green (ICG) to the body tissue, and together with this, excitation light corresponding to the fluorescence wavelength of the reagent is emitted to the body tissue to obtain a fluorescent image, or the like. The light source device 11203 can be configured to be able to supply narrow band light and/or excitation light corresponding to such special light observation.

Figure 56:
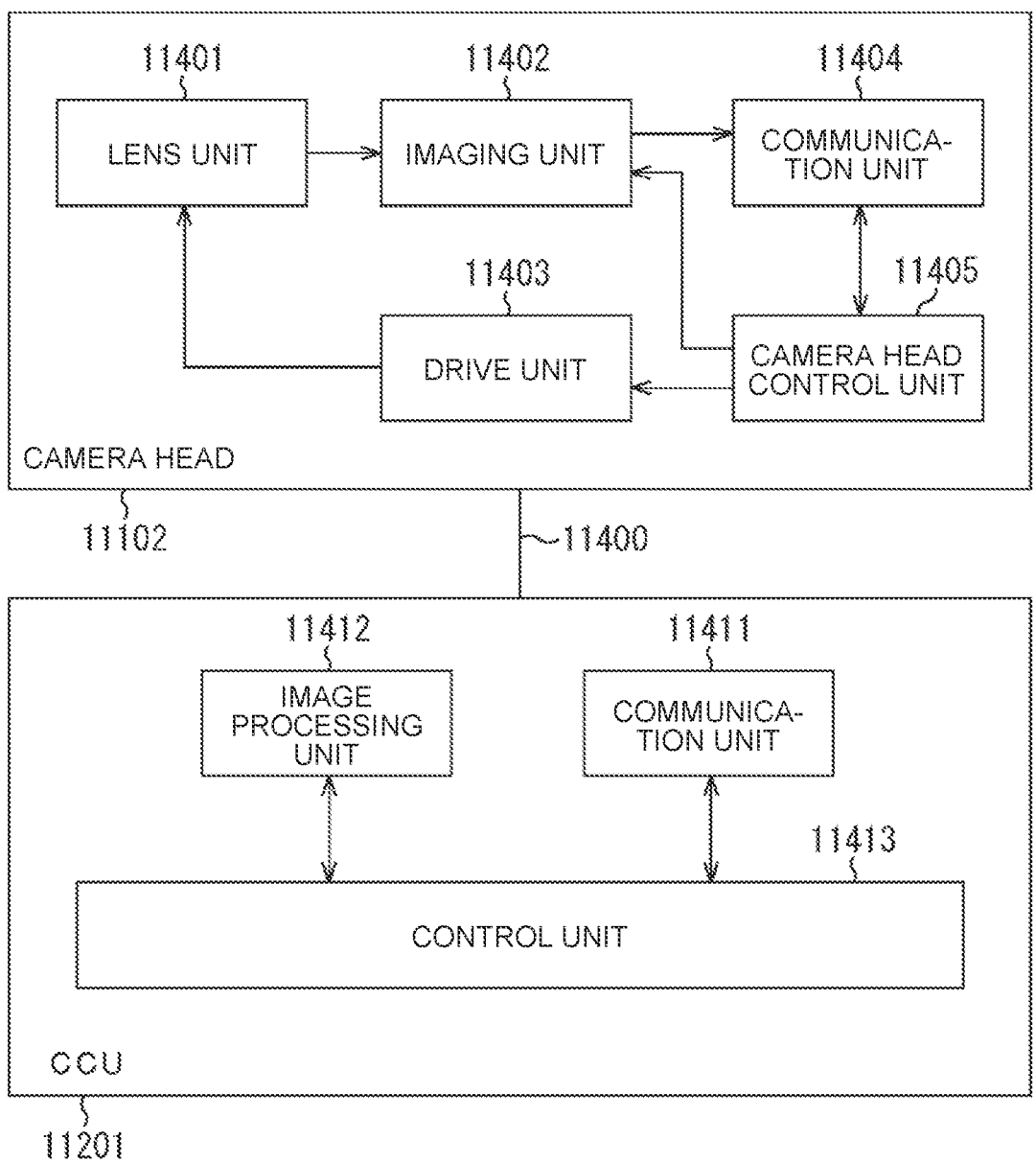
FIG. 56 is a block diagram illustrating an example of a functional configuration of a camera head and a CCU.

FIG. 56 is a block diagram illustrating an example of the functional configuration of the camera head 11102 and the CCU 11201 illustrated in FIG. 55.

The camera head 11102 includes a lens unit 11401, an imaging unit 11402, a drive unit 11403, a communication unit 11404, and a camera head control unit 11405. The CCU 11201 includes a communication unit 11411, an image processing unit 11412, and a control unit 11413. The camera head 11102 and the CCU 11201 are communicatively connected to each other by a transmission cable 11400.

The lens unit 11401 is an optical system provided at a connection portion with the lens barrel 11101. The observation light captured from the distal end of the lens barrel 11101 is guided to the camera head 11102 so as to be incident on the lens unit 11401. The lens unit 11401 is formed by a combination of a plurality of lenses including a zoom lens and a focus lens.

The imaging unit 11402 is constituted with an imaging element. The number of imaging elements forming the imaging unit 11402 may be one (single-plate type) or in plurality (multi-plate type). When the imaging unit 11402 is a multi-plate type, for example, each of imaging elements may generate an image signal corresponding to one color of RGB, and a color image may be obtained by combining these individual color image signals. Alternatively, the imaging unit 11402 may include a pair of imaging elements for acquiring image signals individually for the right eye and the left eye corresponding to three-dimensional (3D) display. The 3D display enables the surgeon 11131 to grasp the depth of the living tissue more accurately in the surgical site. When the imaging unit 11402 is a multi-plate type, a plurality of the lens units 11401 may be provided corresponding to the imaging elements.

Furthermore, the imaging unit 11402 does not necessarily have to be provided on the camera head 11102. For example, the imaging unit 11402 may be provided inside the lens barrel 11101 immediately behind the objective lens.

The drive unit 11403 includes an actuator, and moves the zoom lens and the focus lens of the lens unit 11401 by a predetermined distance along the optical axis under the control of the camera head control unit 11405. With this operation, the magnification and focal point of the image captured by the imaging unit 11402 can be appropriately adjusted.

The communication unit 11404 includes a communication device for transmitting and receiving various types of information to and from the CCU 11201. The communication unit 11404 transmits the image signal obtained from the imaging unit 11402 as RAW data to the CCU 11201 via the transmission cable 11400.

Furthermore, the communication unit 11404 receives a control signal for controlling the drive of the camera head 11102 from the CCU 11201 and supplies the control signal to the camera head control unit 11405. The control signal includes information associated with imaging conditions, such as information designating a frame rate of a captured image, information designating an exposure value at the time of imaging, and/or information designating the magnification and focal point of the captured image.

Note that the imaging conditions such as the frame rate, the exposure value, the magnification, and the focal point may be appropriately designated by the user, or may be automatically set by the control unit 11413 of the CCU 11201 based on the acquired image signal. In the latter case, an auto exposure (AE) function, an auto focus (AF) function, and an auto white balance (AWB) function are to be installed in the endoscope 11100.

The camera head control unit 11405 controls the drive of the camera head 11102 based on the control signal from the CCU 11201 received via the communication unit 11404.

The communication unit 11411 includes a communication device for transmitting and receiving various types of information to and from the camera head 11102. The communication unit 11411 receives an image signal transmitted from the camera head 11102 via the transmission cable 11400.

Furthermore, the communication unit 11411 transmits a control signal for controlling the drive of the camera head 11102 to the camera head 11102. The image signal and the control signal can be transmitted by electric communication, optical communication, or the like.

The image processing unit 11412 performs various types of image processing on the image signal which is the RAW data transmitted from the camera head 11102.

The control unit 11413 performs various controls related to the imaging of the surgical site or the like by the endoscope 11100 and related to the display of the captured image obtained by the imaging of the surgical site or the like. For example, the control unit 11413 generates a control signal for controlling the drive of the camera head 11102.

Furthermore, the control unit 11413 controls the display device 11202 to display the captured image including an image of a surgical site or the like based on the image signal that has undergone image processing by the image processing unit 11412. At this time, the control unit 11413 may recognize various objects in the captured image by using various image recognition techniques. For example, the control unit 11413 detects the shape, color, or the like of an edge of an object included in the captured image, making it possible to recognize a surgical tool such as forceps, a specific living body site, bleeding, a mist at the time of using the energy treatment tool 11112, or the like. When displaying the captured image on the display device 11202, the control unit 11413 may superimpose and display various types of surgical operation support information on the image of the surgical site by using the recognition result. By displaying the surgical operation support information in a superimposed manner so as to be presented to the surgeon 11131, it is possible to reduce the burden on the surgeon 11131 and enable the surgeon 11131 to proceed with the operation with higher reliability.

The transmission cable 11400 that connects the camera head 11102 and the CCU 11201 is an electric signal cable that supports electric signal communication, an optical fiber that supports optical communication, or a composite cable thereof.

Here, while an illustrated example in which wired communication is performed using the transmission cable 11400, the communication between the camera head 11102 and the CCU 11201 may be performed wirelessly.

An example of the endoscopic surgery system to which the technology according to the present disclosure can be applied has been described above. The technology according to the present disclosure can be appropriately applied to the imaging unit 11402 provided in the camera head 11102 of the endoscope 11100 among the configurations described above. Application of the technology according to the present disclosure to the imaging unit 11402, can achieve downsizing and high definition of the imaging unit 11402, making it possible to provide the endoscope 11100 having achieved downsizing or high definition.

Although the present disclosure has been described with reference to the embodiments, their modifications, application examples, and examples of application to products, the present disclosure is not limited to the embodiments and the like, and various modifications can be made. Note that the effects described in the present specification are merely examples. The effects of the present disclosure are not limited to the effects described herein. The present disclosure may have effects other than those described herein.

14. Summary

As described above, according to the embodiments and their modifications of the present disclosure, it is possible to provide the imaging device 1 having a three-layer structure that does not hinder miniaturization of an area per pixel with a chip size equivalent to the current size.

Note that, in the embodiments and the modifications of the present disclosure described above, the conductivity type of each semiconductor region described above may be reversed, and for example, the present embodiments and the modifications can be applied to an imaging device using holes as signal charges.

Furthermore, in the embodiments of the present disclosure described above, the semiconductor substrate does not necessarily have to be a silicon substrate, and may be other types of substrate (for example, a silicon on insulator (SOI) substrate, a SiGe substrate, or the like). The semiconductor substrate may have a semiconductor structure or the like formed on such various substrates.

Furthermore, the imaging device 1 according to the embodiments and the modifications of the present disclosure is not limited to an imaging device that captures an image as an image as a result of detection of distribution of the amount of incident light of visible light. For example, the present embodiment and the modification can be applied to a solid-state imaging element that captures a distribution of incident amounts of infrared rays, X-rays, particles, or the like as an image, or a solid-state imaging element (physical quantity distribution detector) that detects a distribution of other physical quantities such as pressure and capacitance and thereby forms an image, such as a fingerprint detection sensor.

In the embodiments and modifications of the present disclosure, examples of a method of forming individual layers, films, elements, and the like described above include a physical vapor deposition (PVD) method, a CVD method, and the like. Examples of the PVD method include a vacuum vapor deposition method using resistance heating or high frequency heating, an electron beam (EB) vapor deposition method, various sputtering methods (magnetron sputtering method, an RF-DC coupled bias sputtering method, an electron cyclotron resonance (ECR) sputtering method, a facing target sputtering method, a radio frequency sputtering method, and the like), an ion plating method, a laser ablation method, a molecular beam epitaxy (MBE) method, a laser transfer method, and the like. Examples of the CVD method include a plasma CVD method, a thermal CVD method, an MOCVD method, and an optical CVD method. Furthermore, other methods include an electrolytic plating method, an electroless plating method, and a spin coating method; an immersion method; a casting method; micro-contact printing; a drop cast method; various printing methods such as a screen printing method, an inkjet printing method, an offset printing method, a gravure printing method, and a flexographic printing method; a stamping method; a spray method; and various coating methods such as an air doctor coater method, a blade coater method, a rod coater method, a knife coater method, a squeeze coater method, a reverse roll coater method, a transfer roll coater method, a gravure coater method, a kiss coater method, a cast coater method, a spray coater method, a slit orifice coater method, and a calendering coater method. Examples of a patterning method of individual layers include: chemical etching such as shadow mask, laser transfer, and photolithography; and physical etching using ultraviolet rays, laser, and the like. In addition, examples of the planarization technique include a CMP method, a laser planarization method, and a reflow method. That is, the imaging device 1 according to the embodiments and their modifications of the present disclosure can be easily and inexpensively manufactured using an existing semiconductor device manufacturing process.

Furthermore, individual steps in the manufacturing method according to the embodiments and their modifications of the present disclosure described above do not necessarily have to be processed in the described order. For example, the individual steps may be processed in an appropriately changed order. Furthermore, the method used in individual steps does not necessarily have to be performed with the described method, and may be performed by other methods.

15. Supplementary Notes

The preferred embodiments of the present disclosure have been described in detail above with reference to the accompanying drawings. However, the technical scope of the present disclosure is not limited to such examples. It will be apparent to those skilled in the art of the present disclosure that various modifications and alterations can be conceived within the scope of the technical idea described in the claims and naturally fall within the technical scope of the present disclosure.

Furthermore, the effects described in the present specification are merely illustrative or exemplary and are not limited. That is, the technology according to the present disclosure can exhibit other effects that are apparent to those skilled in the art from the description of the present specification in addition to or instead of the above effects.

Note that the present technology can also have the following configurations.

(1) An imaging device comprising:
a first semiconductor substrate provided with pixels including a photoelectric conversion element and floating diffusion that temporarily holds a charge output from the photoelectric conversion element; and
a semiconductor layer provided on the first semiconductor substrate via an insulating film, the semiconductor layer including a readout circuit unit that reads out the charge held in the floating diffusion and outputs a pixel signal,
wherein the semiconductor layer is formed of an organic semiconductor material.

(2) The imaging device according to (1),
wherein the organic semiconductor material is one material selected from a material group consisting of a tetracene material, a naphthalene material, a pentacene material, a rubrene material, a thienoacene material, a polythiophene material, a polyfluorene material, and a polyhexylophene material.

(3) An imaging device comprising:
a first semiconductor substrate provided with pixels including a photoelectric conversion element and floating diffusion that temporarily holds a charge output from the photoelectric conversion element; and
a semiconductor layer provided on the first semiconductor substrate via an insulating film, the semiconductor layer including a readout circuit unit that reads out the charge held in the floating diffusion and outputs a pixel signal,
wherein the semiconductor layer includes an epitaxial growth layer obtained by epitaxial growth on a front surface of the first semiconductor substrate exposed from an opening provided in the insulating film.

(4) The imaging device according to (3),
wherein the epitaxial growth layer includes a homoepitaxial growth layer obtained by homoepitaxial growth.

(5) The imaging device according to (4),
wherein the first semiconductor substrate is formed with a silicon substrate, and
the epitaxial growth layer is formed of a silicon material.

(6) The imaging device according to (3),
wherein the epitaxial growth layer includes a heteroepitaxial growth layer obtained by heteroepitaxial growth.

(7) The imaging device according to any one of (3) to (6),
wherein the epitaxial growth layer is partially provided above a surface of the insulating film opposite to a surface facing the first semiconductor substrate.

(8) The imaging device according to (7),
wherein the opening is provided in plurality in the insulating film.

(9) The imaging device according to (8),
wherein the epitaxial growth layer has a crystal defect above the insulating film.

(10) The imaging device according to any one of (3) to (9),
wherein in a cross section of the imaging device made by cutting along a stacking direction of the imaging device, the opening has a tapered shape in which an opening width narrows from an upper surface side of the insulating film toward a front surface of the semiconductor layer corresponding to a bottom surface of the opening.

(11) The imaging device according to any one of (1) to (10),
wherein the semiconductor layer includes:
a first interlayer insulating film provided on a side of the semiconductor layer opposite to a surface facing the first semiconductor substrate; and
a first metal pad formed of a copper material and provided on a side of the first interlayer insulating film opposite to a surface facing the semiconductor layer.

(12) The imaging device according to (11), further comprising a second semiconductor substrate including a logic circuit that processes the pixel signal, the second semiconductor substrate being located on an opposite side of a surface of the semiconductor layer facing the first semiconductor substrate.

(13) The imaging device according to (12),
wherein the second semiconductor substrate includes:
a second interlayer insulating film provided on a side of a surface of the second semiconductor substrate facing the semiconductor layer; and
a second metal pad formed of a copper material and provided on a side of a surface of the second interlayer insulating film facing the semiconductor layer, and
the semiconductor layer and the second semiconductor substrate are bonded to each other by bonding between the first metal pad and the second metal pad.

(14) The imaging device according to any one of (1) to (13), further comprising a through-substrate electrode penetrating the semiconductor layer, the through-substrate electrode being configured to electrically connect the floating diffusion and the readout circuit unit to each other.

(15) The imaging device according to (14),
wherein the first semiconductor substrate includes a plurality of the pixels, and the through-substrate electrode is provided in common to the plurality of pixels.

(16) The imaging device according to any one of (1) to (15),
wherein the first semiconductor substrate further includes a transfer transistor that transfers the charge output from the photoelectric conversion element to the floating diffusion.

(17) The imaging device according to any one of (1) to (16),
wherein the readout circuit unit includes:
a reset transistor that resets a potential of the floating diffusion to a predetermined potential;
an amplification transistor that outputs the pixel signal in accordance with the amount of the charge held in the floating diffusion; and
a selection transistor that controls a timing of outputting the pixel signal from the amplification transistor.

(18) An electronic device that is equipped with an imaging device,
the imaging device comprising:
a first semiconductor substrate provided with pixels including a photoelectric conversion element and floating diffusion that temporarily holds a charge output from the photoelectric conversion element; and
a semiconductor layer provided on the first semiconductor substrate via an insulating film, the semiconductor layer including a readout circuit unit that reads out the charge held in the floating diffusion and outputs a pixel signal,
wherein the semiconductor layer is formed of an organic semiconductor material.

(19) An electronic device that is equipped with an imaging device,
the imaging device including:
a first semiconductor substrate provided with pixels including a photoelectric conversion element and floating diffusion that temporarily holds a charge output from the photoelectric conversion element; and
a semiconductor layer provided on the first semiconductor substrate via an insulating film, the semiconductor layer including a readout circuit unit that reads out the charge held in the floating diffusion and outputs a pixel signal,
in which the semiconductor layer includes an epitaxial growth layer obtained by epitaxial growth on a front surface of the first semiconductor substrate exposed from an opening provided in the insulating film.

REFERENCE SIGNS LIST 1, 1B IMAGING DEVICE
7 IMAGING SYSTEM
10 FIRST SUBSTRATE PORTION (BOTTOM SUBSTRATE)
10a, 11a, 221a FRONT SURFACE
11, 3010 SEMICONDUCTOR SUBSTRATE
15, 117B, 215, 217, 225, 3040 INSULATING FILM
16, 223, 2130 ELEMENT ISOLATION LAYER
17 IMPURITY DIFFUSION LAYER
20 SECOND SUBSTRATE PORTION
30 THIRD SUBSTRATE PORTION
51, 53, 119, 123, 222 INTERLAYER INSULATING FILM
100, 200, 300 SUBSTRATE
100S, 200S, 300S SEMICONDUCTOR LAYER
100T, 200T, 300T WIRING LAYER
111 INSULATING FILM
112 FIXED CHARGE FILM
113, 116 PINNING REGION
114 n TYPE SEMICONDUCTOR REGION
115 p WELL LAYER
117 PIXEL ISOLATION PORTION
117A LIGHT SHIELDING FILM
118, 218 VSS CONTACT REGION
120, 121 PAD PORTION
120C, 121C CONNECTION VIA
120E, 121E, TGV, TGV1, TGV2, TGV3, TGV4 THROUGH-SUBSTRATE ELECTRODE
122, 221 PASSIVATION FILM
124 BONDING FILM
200E EPITAXIAL GROWTH LAYER
200H CRYSTAL DEFECT
200K OPENING
200Y ORGANIC SEMICONDUCTOR LAYER
201, 202, 203, 204, 301, 302, 303, 304 CONTACT PORTION
210 PIXEL CIRCUIT
211 WELL REGION
212 INSULATING REGION
213 ELEMENT ISOLATION REGION
218V CONNECTION PORTION
211b, 221b BACK SURFACE
227, 305 PAD ELECTRODE
243 DSP CIRCUIT
244 FRAME BUFFER MEMORY
245 DISPLAY UNIT
246 STORAGE UNIT
247 OPERATION UNIT
248 POWER SUPPLY UNIT
249 BUS LINE
401 LIGHT RECEIVING LENS
510A INPUT UNIT
510B OUTPUT UNIT
511 INPUT TERMINAL
512 INPUT CIRCUIT UNIT
513 INPUT AMPLITUDE CHANGING UNIT
514 INPUT DATA CONVERSION CIRCUIT UNIT
515 OUTPUT DATA CONVERSION CIRCUIT UNIT
516 OUTPUT AMPLITUDE CHANGING UNIT
517 OUTPUT CIRCUIT UNIT
518 OUTPUT TERMINAL
520 ROW DRIVE UNIT
530 TIMING CONTROL UNIT
539 PIXEL SHARING UNIT
540 PIXEL ARRAY UNIT
540B PERIPHERAL PORTION
541, 541A, 541B, 541C, 541D PIXEL
542 ROW DRIVE SIGNAL LINE
543 VERTICAL SIGNAL LINE
544 POWER SUPPLY LINE
550 COLUMN SIGNAL PROCESSING UNIT
560 IMAGE SIGNAL PROCESSING UNIT
AG, RG, SG GATE ELECTRODE
AMP AMPLIFICATION TRANSISTOR
1020, 1100 COMMON PAD ELECTRODE
2100 LOWER SUBSTRATE (MIDDLE SUBSTRATE)
2110 FIRST SEMICONDUCTOR SUBSTRATE
2200 UPPER SUBSTRATE (TOP SUBSTRATE)
2210 SECOND SEMICONDUCTOR SUBSTRATE
FD, FD1, FD2, FD3, FD4 FLOATING DIFFUSION
FDG FD CONVERSION GAIN SWITCHING TRANSISTOR
H1, H2 CONNECTION HOLE

L LIGHT
PD, PD1, PD2, PD3, PD4 PHOTODIODE
PU PIXEL UNIT
RST RESET TRANSISTOR
SEL SELECTION TRANSISTOR
TA, TB EXTERNAL TERMINAL
TG, TG1, TG2, TG3, TG4 TRANSFER GATE
TGa VERTICAL PORTION
TGb HORIZONTAL PORTION
TR TRANSFER TRANSISTOR
VDD POWER SUPPLY LINE
FDGL, L1 to L10, L30, RSTL, SELL, TRG1, TRG2, TRG3, TRG4 WIRING, WIRING LINE
W1, W2, W3, W4 WIRING LAYER
WE WELL LAYER
sec1, sec2, sec3 POSITION

The invention claimed is:

1. An imaging device comprising:
a first semiconductor substrate provided with pixels including a photoelectric conversion element and floating diffusion that temporarily holds a charge output from the photoelectric conversion element; and
a semiconductor layer provided on the first semiconductor substrate via an insulating film, the semiconductor layer including a readout circuit unit that reads out the charge held in the floating diffusion and outputs a pixel signal,
wherein the semiconductor layer is formed of an organic semiconductor material.

2. The imaging device according to claim 1, wherein the organic semiconductor material is one material selected from a material group consisting of a tetracene material, a naphthalene material, a pentacene material, a rubrene material, a thienoacene material, a polythiophene material, a polyfluorene material, and a polyhexylophene material.

3. An imaging device comprising:
a first semiconductor substrate provided with pixels including a photoelectric conversion element and floating diffusion that temporarily holds a charge output from the photoelectric conversion element; and
a semiconductor layer provided on the first semiconductor substrate via an insulating film, the semiconductor layer including a readout circuit unit that reads out the charge held in the floating diffusion and outputs a pixel signal,
wherein the semiconductor layer includes an epitaxial growth layer obtained by epitaxial growth on a front surface of the first semiconductor substrate exposed from an opening provided in the insulating film.

4. The imaging device according to claim 3, wherein the epitaxial growth layer includes a homoepitaxial growth layer obtained by homoepitaxial growth.

5. The imaging device according to claim 4, wherein the first semiconductor substrate is formed with a silicon substrate, and
the epitaxial growth layer is formed of a silicon material.

6. The imaging device according to claim 3, wherein the epitaxial growth layer includes a heteroepitaxial growth layer obtained by heteroepitaxial growth.

7. The imaging device according to claim 3,
wherein the epitaxial growth layer is partially provided above a surface of the insulating film opposite to a surface facing the first semiconductor substrate.

8. The imaging device according to claim 7, wherein a plurality of openings is in the insulating film, and the plurality of openings include the opening.

9. The imaging device according to claim 8, wherein the epitaxial growth layer has a crystal defect above the insulating film.

10. The imaging device according to claim 3,
wherein in a cross section of the imaging device made by cutting along a stacking direction of the imaging device, the opening has a tapered shape in which an opening width narrows from an upper surface side of the insulating film toward a front surface of the semiconductor layer corresponding to a bottom surface of the opening.

11. The imaging device according to claim 1, wherein the semiconductor layer includes:
a first interlayer insulating film provided on a side of the semiconductor layer opposite to a surface facing the first semiconductor substrate; and
a first metal pad formed of a copper material and provided on a side of the first interlayer insulating film opposite to a surface facing the semiconductor layer.

12. The imaging device according to claim 11, further comprising a second semiconductor substrate including a logic circuit that processes the pixel signal, the second semiconductor substrate being located on an opposite side of a surface of the semiconductor layer facing the first semiconductor substrate.

13. The imaging device according to claim 12, wherein the second semiconductor substrate includes:
a second interlayer insulating film provided on a side of a surface of the second semiconductor substrate facing the semiconductor layer; and
a second metal pad formed of a copper material and provided on a side of a surface of the second interlayer insulating film facing the semiconductor layer, and
the semiconductor layer and the second semiconductor substrate are bonded to each other by bonding between the first metal pad and the second metal pad.

14. The imaging device according to claim 1, further comprising a through-substrate electrode penetrating the semiconductor layer, the through-substrate electrode being configured to electrically connect the floating diffusion and the readout circuit unit to each other.

15. The imaging device according to claim 14, wherein the first semiconductor substrate includes a plurality of the pixels, and
the through-substrate electrode is provided in common to the plurality of pixels.

16. The imaging device according to claim 1,
wherein the first semiconductor substrate further includes a transfer transistor that transfers the charge output from the photoelectric conversion element to the floating diffusion.

17. The imaging device according to claim 1, wherein the readout circuit unit includes:
a reset transistor that resets a potential of the floating diffusion to a predetermined potential;
an amplification transistor that outputs the pixel signal in accordance with an amount of the charge held in the floating diffusion; and
a selection transistor that controls a timing of outputting the pixel signal from the amplification transistor.

18. An electronic device that is equipped with an imaging device, the imaging device comprising:
a first semiconductor substrate provided with pixels including a photoelectric conversion element and floating diffusion that temporarily holds a charge output from the photoelectric conversion element; and a semiconductor layer provided on the first semiconductor substrate via an insulating film, the semiconductor layer including a readout circuit unit that reads out the charge held in the floating diffusion and outputs a pixel signal, wherein the semiconductor layer is formed of an organic semiconductor material.

* * * * *